(12) United States Patent
Ueda et al.

(10) Patent No.: US 6,402,400 B1
(45) Date of Patent: Jun. 11, 2002

(54) SUBSTRATE PROCESSING APPARATUS

(75) Inventors: Issei Ueda, Kumamoto-Ken (JP); Takashi Takekuma, Austin, TX (US); Kenji Okumura, Kumamoto-Ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/676,478

(22) Filed: Oct. 2, 2000

(30) Foreign Application Priority Data

Oct. 6, 1999 (JP) .......................................... 11-285325
Oct. 19, 1999 (JP) .......................................... 11-296395
Oct. 20, 1999 (JP) .......................................... 11-298503

(51) Int. Cl.$^7$ ................................................. G03D 5/00

(52) U.S. Cl. ..................................... 396/611; 29/25.01

(58) Field of Search ................................. 396/604, 611, 396/626; 29/25.01; 414/225.01, 226, 935–940; 118/52, 56, 319–321, 666–668, 719; 427/240; 355/30, 27–29

(56) References Cited

U.S. PATENT DOCUMENTS

| | | | |
|---|---|---|---|
| 5,826,129 A | 10/1998 | Hasebe et al. | 396/611 |
| 5,928,390 A | 7/1999 | Yaegashi et al. | 29/25.01 |
| 5,942,013 A | 8/1999 | Akimoto | 29/25.01 |
| 6,161,969 A | * 12/2000 | Kimura et al. | 396/611 |
| 6,215,545 B1 | * 4/2001 | Matsuyama | 396/611 |
| 6,290,250 B1 | * 9/2001 | Matsuyama | 396/611 |
| 6,292,405 B1 | * 9/2001 | Ueda | 396/611 |

* cited by examiner

Primary Examiner—D. Rutledge
(74) Attorney, Agent, or Firm—Rader, Fishman and Grauer PLLC

(57) ABSTRACT

A first processing unit group for performing solution processing and a second processing unit group including heat and cooling processing units each having a heat processing unit and a cooling processing unit are arranged adjacent to each other such that the cooling processing unit is located on the first processing unit group side. This makes it possible to conduct temperature control precisely in a solution processing unit for performing solution processing for a substrate at about room temperature.

19 Claims, 37 Drawing Sheets

SUBSTRATE PROCESSING APPARATUS

BACKGROUND OF THE INVENTION

1. Field of the Invention

The present invention is included in a technical field of, for example, semiconductor device fabrication.

Further, the present invention relates to a substrate processing apparatus for performing, for example, coating processing or developing processing of a resist solution to a substrate such as a semiconductor wafer or a glass substrate for a liquid crystal display.

2. Description of the Related Art

In a photoresist step in a process of semiconductor device fabrication, for example, a resist solution is applied to a front face of a semiconductor wafer (hereinafter, referred to as "wafer") or the like to form a resist film, and a developing solution is supplied to the wafer which has been exposed in a pattern to thereby perform developing processing. In order to perform the above-described series of processing, a coating and developing processing apparatus has been conventionally used.

The coating and developing apparatus comprises various kinds of processing units such as a cooling processing unit for cooling a wafer W, a heat processing unit for heating the wafer W, a resist coating unit for coating the wafer W with a resist solution, a developing processing unit for performing developing processing for the wafer W, and the like. In order to make the whole coating and developing processing apparatus compact, a plurality of heat processing units and cooling processing units are multi-tiered to be arranged together with a transfer device on the whole, thereby attaining space saving of the coating and developing processing apparatus.

However, as the wafer W increases in diameter, all the processing units increase in size. Thus, it is necessary to arrange the processing units more compactly in order to save space.

However, when the heat processing unit increases in size, an amount of heat of the heat processing unit also increases. Accordingly, in the case where the heat processing unit is disposed near other processing units as one processing unit in the thermal processing unit group as before, there is a danger that temperature control can not be precisely performed in the other units for performing processing for the wafer at about room temperature, for example, the resist coating unit and the like. The instabilities in temperature control in these processing units result in a problem of a resist film varying in film thickness.

In the above coating and developing processing apparatus, since containers for storing processing solutions are placed outside, pipes for supplying the processing solutions to the coating unit and the developing unit are long. The solution in the pipe is drained at the time of maintenance or the like, but a resist solution and a developing solution suitable for michromachining of patterns are costly, and thus the long distance of the staying solution results in increased total cost. Meanwhile, it is necessary to precisely control an amount of the processing solution discharged from a nozzle, thereby sucking slightly the processing solution to thereby draw up the solution surface from the nozzle tip in order to prevent the solution from running from the nozzle onto the substrate after the discharge, and therefore the pressure loading of the processing solution needs to be finely adjusted. Therefore, supply control devices such as a metering pump and a suck valve are provided in the coating (developing) unit not in an external box in order not to be departed from the nozzle, but there is a problem that the supply control devices placed in each coating (developing) unit obstructs maintenance work.

Further, in the above-described coating and developing processing apparatus, since the wafer W which has been delivered to the processing station is transferred between the coating unit, the developing unit, and the shelf unit by wafer transfer means in the processing station, a great load imposed on the wafer transfer means, resulting in the present situation in which the number of the units in the processing station can not be greatly increased.

From the viewpoint of improvement in throughput, it is desirable to increase the numbers of the coating units and the developing units, and it has been also considered to add a new unit for forming an anti-reflection film prior to the application of the resist on the wafer, and the like. In this case, the number of the wafer transfer means needs to be increased in accordance with the increase in the number of the units. Moreover, in the above-described coating and developing processing apparatus, since the shelf unit is disposed near the coating unit or the developing unit, the coating unit is susceptible to heat influence from the heating section of the shelf unit. Accordingly, the temperature of the wafer W tends to change during the processing in each unit, bringing about a problem that ununiformity often happens in the processing because temperature affects on the processing. For this reason, it is desired to create a layout for improving throughput and performing processing uniformly.

SUMMARY OF THE INVENTION

An object of the present invention is to provide a substrate processing apparatus capable of precisely performing temperature control in a processing unit for performing solution processing for a substrate.

Further, another object of the present invention is to provide a substrate processing apparatus in which a pipe for a processing solution can be shortened.

Furthermore, still another object of the present invention is to provide a substrate processing apparatus which improves in throughput by decreasing a load on substrate transfer means.

In order to solve the above problems, a substrate processing apparatus of the present invention is characterized by comprising: a first processing unit group in which first processing units each for supplying a predetermined solution onto a substrate to thereby perform solution processing are multi-tiered; a second processing unit group in which second processing units each made by allowing a heating section for performing heat processing for the substrate and a cooling section for performing cooling processing for the substrate to adjoin to each other into one body are multi-tiered; and a transfer device for transferring the substrate between the first processing unit and the second processing unit, wherein the first processing unit group and the second processing unit group are arranged adjacent to each other while the cooling section out of the heating section and the cooling section in each second unit is positioned on the first processing unit group side.

In the present invention, the first processing unit group for performing solution processing for the substrate at about room temperature and the second processing unit group including the heating sections and the cooling sections are arranged such that the cooling sections are located on the first processing unit side, thereby reducing heat influence that the first processing unit group receives from the second processing unit group to a minimum. This makes it possible to perform precisely temperature control in the first processing unit group for performing processing for the substrate at about room temperature.

Further the substrate processing apparatus is characterized in that a clean air supply section for supplying clean air to the first processing unit group is provided, the clean air supply section exhausting gas from the bottom of the first processing unit group, circulating the exhausted gas, and blasting temperature regulated gas from the top of the first processing unit group, and further a passage for circulating the gas exhausted from the bottom of the first processing unit group to the top thereof is provided to divide an area in which the first processing unit group is disposed from an area in which the second processing unit group is disposed.

With such a configuration, the passage functions as heat insulation means between the area in which the first processing unit group is disposed and the area in which the second processing unit group is disposed. In addition, since gas circulates in the passage as the heat insulation means, heat never accumulates in the passage, with the results that the passage functions as very good heat insulation means. Consequently, the passage thus configured prevents heat influence from the second processing unit group to the first processing unit group, whereby temperature control in the first processing unit group for performing processing for the substrate at about room temperature can be very precisely performed.

Further, the apparatus is characterized in that a heat insulation wall is provided to divide an area in which the first processing unit group is disposed from an area in which the second processing unit group is disposed.

With the above configuration, the heat insulation wall prevents heat influence from the second processing unit group to the first processing unit group, whereby temperature control in the first processing unit group for performing processing for the substrate at about room temperature can be very precisely performed.

A substrate processing of the present invention is characterized by comprising: a first processing unit group in which first processing units each for supplying a predetermined solution onto a substrate to thereby perform solution processing are multi-tiered; a processing solution supply section, disposed adjacent to the first processing unit group, for supplying the predetermined solution to each first processing unit; a second processing unit group in which second processing units each made by allowing a heating section for performing heat processing for the substrate and a cooling section for performing cooling processing for the substrate to adjoin to each other into one body are multi-tiered; and a transfer device for transferring the substrate between the first processing unit and the second processing unit, wherein the processing solution supply section and the second processing unit group are arranged adjacent to each other while the cooling section out of the heating section and the cooling section in each second unit is positioned on the processing solution supply section side.

In the present invention, the processing solution supply section is disposed between the first processing unit group for performing solution processing for the substrate at about room temperature and the second processing unit group including the heating sections and the cooling sections, and further the cooling sections are disposed to locate on the processing solution supply section side. In other words, the cooling sections and the processing solution supply section stand between the first processing unit group and the heating sections, thereby reducing heat influence that the first processing unit group and the processing solution supply section receive from the second processing unit group to a minimum. This makes it possible to perform precisely temperature control in the first processing unit group for performing processing for the substrate at about room temperature, and further to perform easily temperature management of the processing solution to be supplied to the first processing unit group.

Further, the apparatus is characterized in that a clean air supply section for supplying clean air to the first processing unit group is provided, the clean air supply section exhausting gas from the bottom of the first processing unit group, circulating the exhausted gas, and blasting temperature regulated gas from the top of the first processing unit group, and further a passage for circulating the gas exhausted from the bottom of the first processing unit group to the top thereof is provided to divide an area in which the processing solution supply section is disposed from an area in which the second processing unit group is disposed.

With such a configuration, the passage functions as heat insulation means between the area in which the processing solution supply section is disposed and the area in which the second processing unit group is disposed. In addition, since gas circulates in the passage as the heat insulation means, heat never accumulates in the passage, with the results that the passage functions as very good heat insulation means. Consequently, the passage thus configured prevents heat influence from the second processing unit group to the first processing unit group and the processing solution supply section, whereby temperature control in the first processing unit group for performing processing for the substrate at about room temperature can be very precisely performed, and further temperature management of the processing solution can be easily performed.

Further, the apparatus is characterized in that a heat insulation wall is provided to divide an area in which the processing solution supply section is disposed from an area in which the second processing unit group is disposed.

With such a configuration, the insulation wall prevents heat influence from the second processing unit group to the first processing unit group and the processing solution supply section, whereby temperature control in the first processing unit group for performing processing for the substrate at about room temperature can be very precisely performed, and further temperature management of the processing solution can be easily performed.

A substrate processing apparatus of the present invention is characterized by comprising: a first processing unit group in which first processing units each for supplying a predetermined solution onto a substrate to thereby perform solution processing are multi-tiered; a second processing unit group in which second processing units each made by allowing a heating section for performing heat processing for the substrate and a cooling section for performing cooling processing for the substrate to adjoin to each other into one body are multi-tiered; and an aligner unit for performing exposure processing for the substrate to which the solution processing has been performed, wherein the substrate is caused to wait in the cooling section of the second processing unit before the substrate is carried into the aligner unit.

In the present invention, the cooling section of the second processing unit group can include a function of a waiting place for allowing the substrate before exposure to wait therein other than a function of performing cooling processing, and thus it is unnecessary to provide, for example, an extra cassette for holding the substrate before exposure.

A substrate processing apparatus according to the present invention is characterized by comprising:

a cassette station including a mounting section for mounting a substrate cassette housing a substrate, and delivery means for delivering the substrate to/from the substrate cassette mounted on the mounting section; and a processing station connected to the cassette station for processing the substrate transferred by the delivery means, the processing station including solution processing units, stacked in a plurality of tiers, each for performing processing by a processing solution for the substrate, transfer means for carrying the substrate into/out of these solution processing units, and a container housing section, in which containers each for storing the processing solution are housed, provided adjacent to the solution processing units or below the lowermost solution processing unit.

Such an invention needs a short pipe of the processing solution, and thus the amount of stay of costly processing solution is small, resulting in a reduction in cost.

The container housing section may house a processing solution supply control device provided on a pipe for supplying the processing solution from the container to the solution processing unit, thereby providing an advantage of good workability of maintenance. Further, it is suitable that a plurality of the multi-tiered solution processing units are arranged in a line in a lateral direction, and the container housing section is provided next to or below the solution processing units for every the multitiered solution processing units. Furthermore, a power device may be provided below the lowermost tier of the multi-tiered solution processing units and used for each solution processing unit.

The processing station includes, for example, a shelf unit in which units for performing heating processing and/or cooling processing are multi-tiered to perform pre-processing and/or post-processing for the processing in the solution processing units. Further, it is suitable that in the case in which the container housing section is provided next to the solution processing units, a fine adjustment cooling section for precisely cooling the substrate to a predetermined temperature after the substrate is cooled in the shelf unit is divided from a transfer area of the transfer means and disposed above or below the container housing section in an environment in which an atmospheric gas used in the solution processing unit flows.

The apparatus in which the shelf unit is provided may be configured as follows, and this case has an advantage that the dimension of the depth as viewed from the cassette station can be reduced.

a. A plurality of the substrate cassettes are arranged in an X-direction.

b. The processing station is configured such that blocks each including the transfer means, the multi-tiered solution processing units, and the shelf unit are connected in a Y-direction.

c. On the whole, a plurality of the multi-tiered solution processing units are arranged in a line in the Y-direction, a plurality of the shelf units are lined in the Y-direction, and the transfer means are disposed between the line of the shelf units and the line of the solution processing units.

d. In a block close to the cassette station, at least one tier in the shelf unit is configured as a delivery section for delivering the substrate between the delivery means and the transfer means, and the shelf unit is disposed diagonally with respect to the X-direction toward the cassette station as viewed from the transfer means.

e. In a block connected to the block close to the cassette station, the shelf unit is disposed in the X-direction as viewed from the transfer means.

A substrate processing apparatus of the present invention for the above is characterized by comprising: a cassette station including a mounting section for mounting a substrate cassette housing a substrate, and delivery means for delivering the substrate to/from the substrate cassette mounted on the mounting section; and a processing station connected to the cassette station for processing the substrate transferred by the delivery means, the processing station including:

a coating processing section for applying a processing solution for the substrate; and transfer means for delivering the substrate to/from the coating processing section, wherein the delivery means of the cassette station delivers the substrate to/from the coating processing section of the processing station.

In such a configuration, the substrate can be delivered to/from the coating processing section of the processing station not only by the substrate transfer means but also the delivery means of the cassette station. This can reduce the load on the substrate transfer means, and correspondingly the coating processing section or the like can be added, resulting in improved throughput.

Further, the present invention is characterized by comprising: a cassette station including a mounting section for mounting a substrate cassette housing a substrate, and delivery means for delivering the substrate to/from the substrate cassette mounted on the mounting section; and a processing station connected to the cassette station for processing the substrate transferred by the delivery means, the processing station including:

a first coating processing section, provided on the cassette station side, for applying a first processing solution for the substrate;

a second coating processing section, provided on the opposite side to the cassette station, for applying a second processing solution for the substrate;

a heating section, provided between the first and second coating sections, for heating the substrate;

first substrate transfer means, provided between the first coating processing section and the heating section, for transferring the substrate thereto; and second substrate transfer means, provided between the second coating processing section and the heating section, for transferring the substrate thereto.

In such a configuration, the first coating processing section and the second coating processing section are provided on both sides of the heating sections with the heating sections and the substrate transfer means interposed in-between, and thus the first and second coating processing sections are separated from the heating sections, whereby the first and second coating processing sections become resistant to heat influence from the heating sections. As a result, substrate temperature change during the coating processing is suppressed, thereby preventing occurrence of processing ununiformity caused by temperature change, resulting in improved uniformity in coating processing.

Here, the delivery means of the cassette station may deliver the substrate to/from the first coating processing section of the processing station, in which the load on the substrate transfer means is reduced.

Further, it is suitable that the processing station includes a cooling section for cooling the substrate, and the delivery means of the cassette station delivers the substrate to/from the cooling section of the processing station, in which, for example, even in the case where the substrate temperature is adjusted by the substrate being cooled before coating processing, the load on the substrate transfer means is reduced and waste of transfer of the substrate can be eliminated.

The present invention has a configuration comprising: an interface station, connected to the opposite side of the processing station to the cassette station, for delivering the substrate between the processing station and an aligner provided on the opposite side of the processing station to the cassette station, wherein the first coating processing section includes a processing section for forming an anti-reflection film for the substrate, and the second coating processing section includes a processing section for performing developing processing for the substrate which has been exposed in the aligner.

These objects and still other objects and advantages of the present invention will become apparent upon reading the following specification when taken in conjunction with the accompanying drawings.

DETAILED DESCRIPTION OF THE PREFERRED EMBODIMENT

Figure 1:
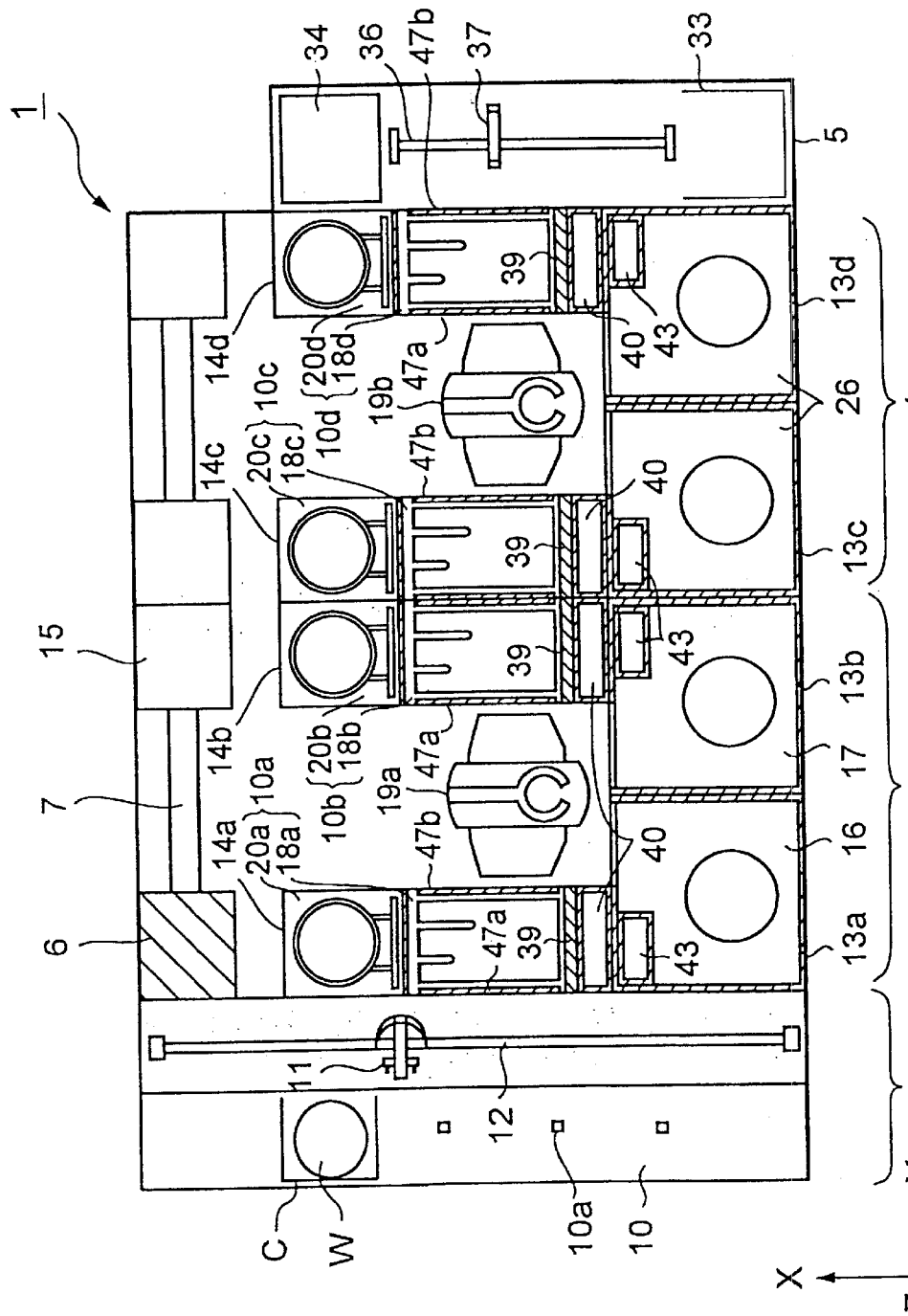
FIG. 1 is a plan view showing a coating and developing processing system according to an embodiment of the present invention.
Figure 2:
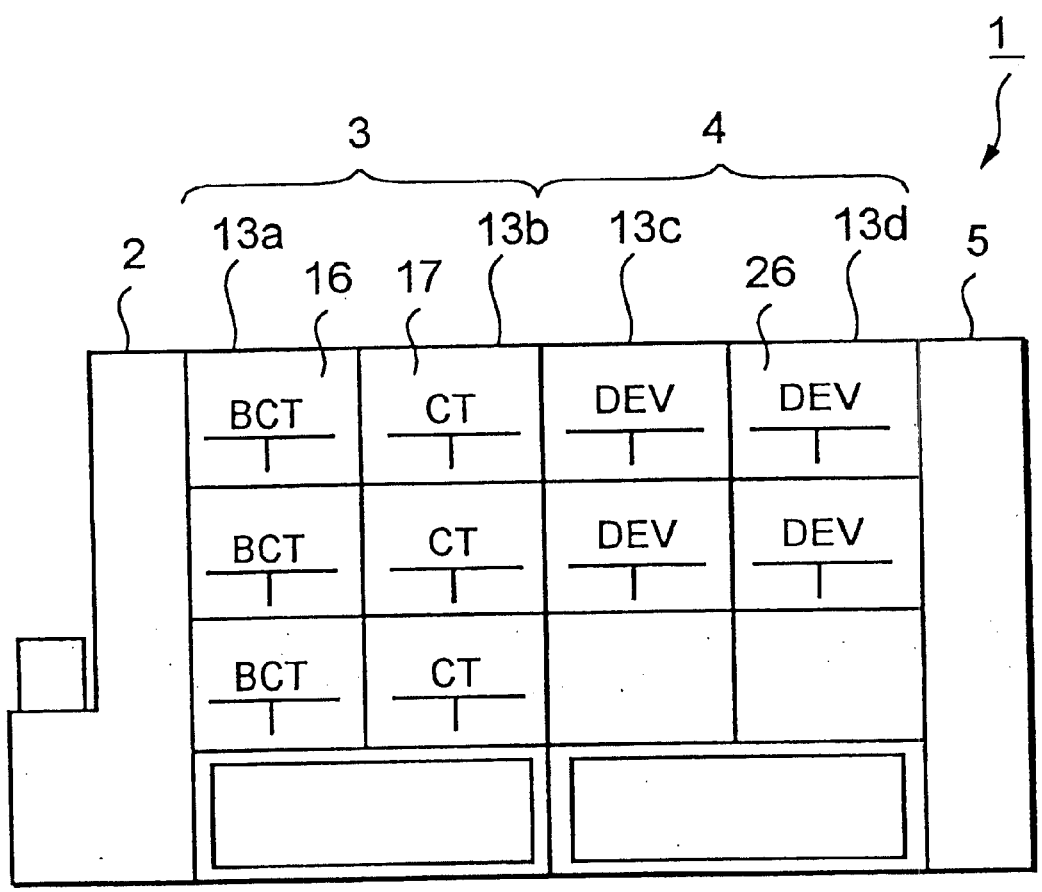
FIG. 2 is a front view of the coating and developing processing system shown in FIG. 1.
Figure 3:
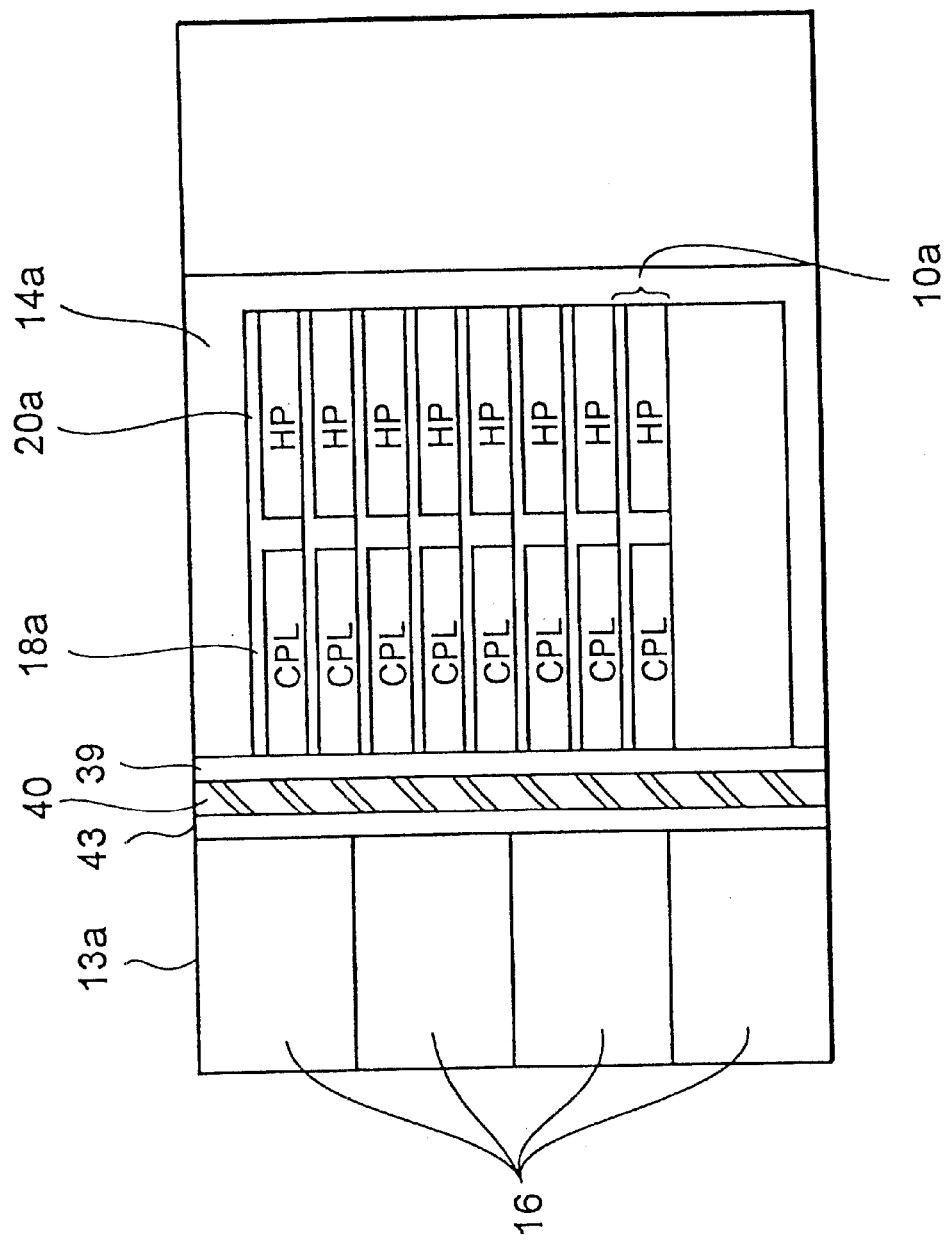
FIG. 3 is a sectional view when an area including a cooling and heating processing unit group in FIG. 1 is sectioned along an X-direction.
Figure 4:
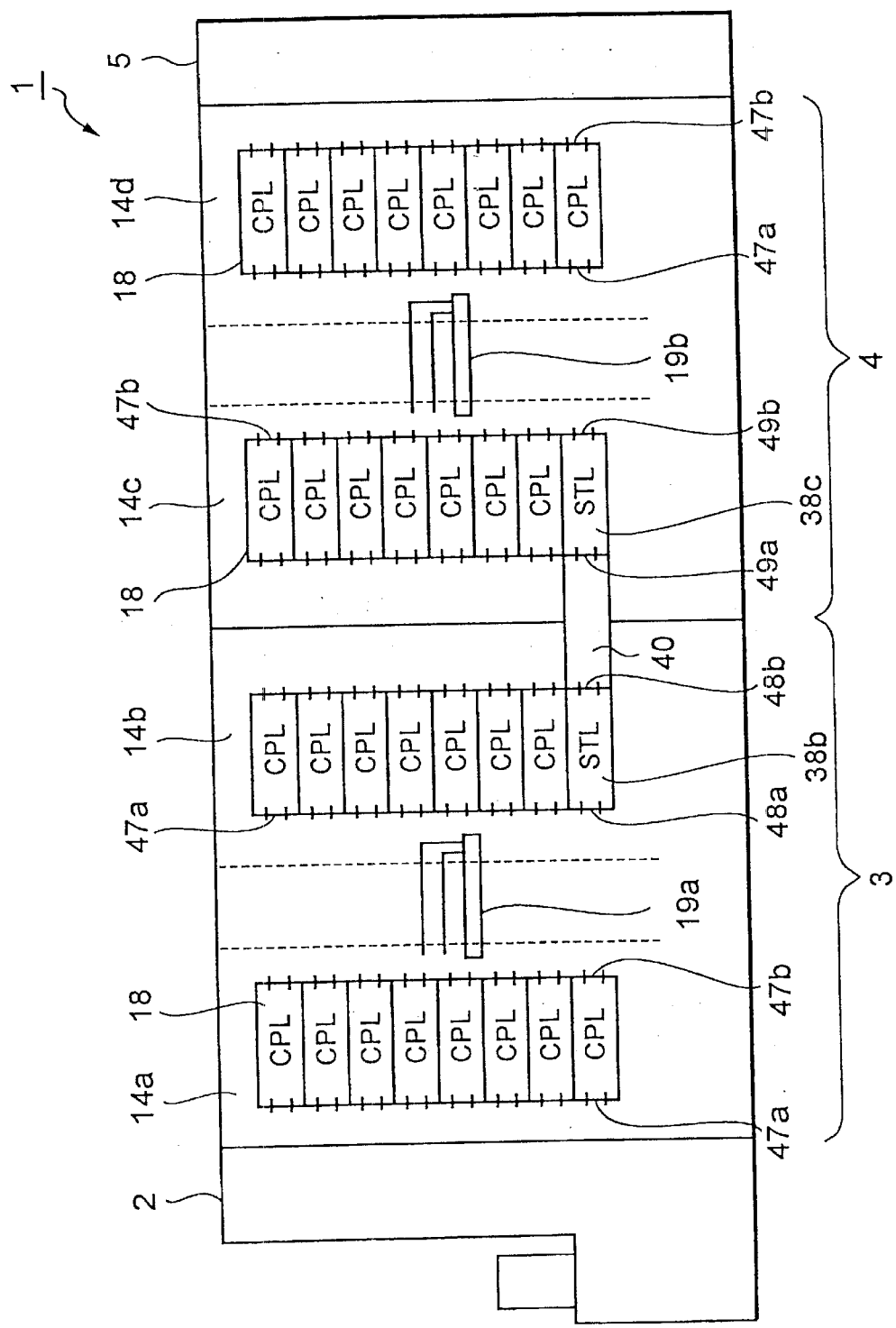
FIG. 4 is a sectional view when an area including cooling processing units in FIG. 1 is sectioned along a Y-direction.

Hereinafter, a first embodiment of the present invention will be described with reference to the accompanying drawings FIG. 1 to FIG. 8. FIG. 1 to FIG. 4 are views showing a coating and developing processing system according to the first embodiment of the present invention, FIG. 1 is a plan view, and FIG. 2 is a front view. FIG. 3 is a sectional view when the system is sectioned along an X-direction in FIG. 1, and FIG. 4 is a sectional view when an area, in which cooling processing units 18 are arranged, is sectioned along a Y-direction in FIG. 1.

As shown in FIG. 1, the coating and developing processing system 1 has a structure in which a cassette station 2 for transferring, for example, 25 wafers W per cassette, from/to the outside into/from the coating and developing processing system 1 and carrying the wafer W into/out of a cassette C, a first processing station 3 in which various kinds of processing units each for performing predetermined processing for the wafers W one by one in coating and developing processing steps are multi-tiered, a second processing station 4 disposed adjacent to the first processing station and having almost the same structure as that of the first processing station, and an interface section 5 for delivering the wafer W to/from an aligner (illustration thereof is omitted) disposed adjacent to the second processing station 4 are integrally connected. In the cassette station 3, coating processing of an anti-reflection film and a resist film onto the wafer W is mainly performed, and in the second processing station 4, developing processing of an exposed resist film is performed.

In the cassette station 2, a plurality of cassettes C can be mounted with respective wafer W transfer ports facing the processing station 3 side at positions of positioning projections 10e on a cassette mounting table 10 in a line along an X-direction (a vertical direction in FIG. 1). A wafer transfer body 11 movable in the direction of arrangement of cassettes C (the X-direction) and in the direction of arrangement of wafers W housed in the cassette C (a Z-direction: a vertical direction) can freely move along a transfer path 12 and selectively get access to each of the cassettes C.

The wafer transfer body 11 is structured to be rotatable also in a θ-direction so as to be accessible to a cooling processing unit (CPL) 18a of each first heat and cooling processing unit 10a of a first heat and cooling processing unit group 14a as a second processing unit group unit in the first processing station 3 described later.

As shown in FIG. 1 and FIG. 2, in the first processing station 3, an anti-reflection film coating unit (BCT) group 13a and a resist film coating unit (CT) group 13b are provided on the front side as a first processing unit group in which solution processing is performed. The anti-reflection film coating unit (BCT) group 13a is made up by anti-reflection film coating units (BCT) 16 for performing coating processing for the wafer W at about room temperature being three-tiered in a Z-direction. The resist film coating unit (CT) group 13b is made up by resist film coating units (CT) 17 for performing coating processing for the wafer W at about room temperature being three-tiered in the Z-direction.

At the central portion of the first processing station 3, the first heat and cooling processing unit group 14a and a second heat and cooling processing unit group 14b are arranged with a transfer device 19a therebetween. The first heat and cooling processing unit group 14a is made up by the first heat and cooling processing units 10a being eight-tiered in the Z-direction, and the second heat and cooling processing unit group 14b is made up by second heat and cooling processing units 10b being seven-tiered in the Z-direction and further a transfer unit (STL) described later being disposed below those units. The first and second heat and cooling processing units 10a and 10b are made up respectively by cooling processing units (CPL) 18a and 18b for performing cooling processing for the wafer W and heat processing units (HP) 20a and 20b for performing heat processing being adjacent to each other to be integrated.

As shown in FIG. 1 and FIG. 3, the first heat and cooling processing unit group 14a is made up by the first heat and cooling processing units 10a being, for example, eight-tiered, and the first heat and cooling processing unit group 14a and the anti-reflection film coating unit (BCT) group 13a are arranged such that the cooling processing units (CPL) 18a in all the first heat and cooling processing units 10a are disposed on the anti-reflection film coating unit (BCT) group 13a side. It should be noted that FIG. 3 is a sectional view when the system is sectioned along the X-direction in FIG. 1, a view showing the positional relation between the first processing unit group 13a and the second processing unit group 14a. Also the second heat and cooling processing unit group 14b is similarly made up by the second heat and cooling processing units 10b being multi-tiered, and the cooling processing units 18b in all the second heat and cooling processing units 10b are disposed on the resist film coating unit (CT) group 13b side.

The anti-reflection film coating unit (BCT) group 13a, the resist film coating unit (CT) group 13b, and the first and second heat and cooling processing unit groups 14a and 14b are arranged around the vertical transfer-type wafer transfer device 19a. The transfer of the wafer W between the first heat and cooling processing unit group 14a and the anti-reflection film coating unit (BCT) group 13a and the transfer of the wafer W between the second heat and cooling processing unit group 14b and the resist film coating unit (CT) group 13b are conducted by the transfer device 19a. Further, shutter members 47a and 47b capable being opened and closed are arranged on both side faces of the cooling processing unit (CPL) 18a of the first heat and cooling processing unit 10a. The delivery of the wafer W between the first heat and cooling processing unit 10a and the wafer transfer body 11 and the delivery of the wafer W between the first heat and cooling processing unit 10a and the transfer device 19a are conducted via the shutters 47a and 47b respectively. A shutter member 47a capable of being opened and closed is provided on a side face of the cooling processing unit (CPL) 18b of the second heat and cooling processing unit 10b, and the delivery of the wafer W between the transfer device 19a and the cooling processing unit (CPL) 18b is conducted via the shutter 47a.

On the other hand, in the second processing station 4, as shown in FIG. 1 and FIG. 2, a first developing processing unit group 13c and a second developing processing unit group 13d are arranged on the front side as a first processing unit group for performing solution processing for the wafer W at about room temperature as in the first processing station 3. The developing processing unit group 13c is made up by developing processing units (DEV) 26 being two-tiered in the Z-direction, and the second developing processing unit group 13d is similarly made up by developing processing units (DEV) 26 being two-tiered in the Z-direction.

At the central portion of the second processing station 4, a third heat and cooling processing unit group 14c and a fourth heat and cooling processing unit group 14d are disposed as a second processing unit group with a transfer device 19b therebetween. The third heat and cooling processing unit group 14c is made up by third heat and cooling processing units 10c being seven-tiered in the Z-direction and further a transfer unit (STL) described later being disposed below those units. The fourth heat and cooling processing units 14d is made up by heat and cooling processing units 10d being eight-tiered in the Z-direction.

The third and fourth heat and cooling processing units 10c and 10d are made up respectively by cooling processing units (CPL) 18c and 18d for performing cooling processing for the wafer W and heat processing units (HP) 20c and 20d for performing heat processing being adjacent to each other to be integrated. As shown in FIG. 1, the third heat and cooling processing unit group 14c and the first developing processing unit (DEV) group 13c are arranged such that the cooling processing units (CPL) 18c out of all the tiered cooling processing units (CPL) 18c and heat processing units (HP) 20c of the third heat and cooling processing units 10c are disposed on the first developing unit (DEV) group 13c side. Moreover, the fourth heat and cooling processing unit group 14d and the second developing processing unit (DEV) group 13d are arranged such that the cooling processing units (CPL) 18d out of all the tiered cooling processing units (CPL) 18c and heat processing units (HP) 20d of the fourth heat and cooling processing units 10d are disposed on the second developing processing unit (DEV) group 13d side.

The first developing processing unit group 13c, the second developing processing unit group 13d, and the third and fourth heat and cooling processing unit groups 14c and 14d are arranged around the vertical transfer-type wafer transfer device 19b. The transfer of the wafer W between the third heat and cooling processing unit group 14c and the first developing processing unit group (DEV) 13c and the transfer of the wafer W between the fourth heat and cooling processing unit group 14d and the second developing processing unit (DEV) group 13d are conducted by the transfer device 19b. Further, shutter members 47a and 47b capable being opened and closed are arranged on both side faces of the cooling processing unit (CPL) 18d of the fourth heat and cooling processing unit 10d. The delivery of the wafer W between the fourth heat and cooling processing units 10d and the wafer transfer device 19b and the delivery of the wafer W between the fourth heat and cooling processing units 10d and a wafer transfer body 37 are conducted via the shutter members 47a and 47b respectively. A shutter member 47b capable of being opened and closed is provided on a side face of the cooling processing unit (CPL) 18c of the third heat and cooling processing unit 10c, and the wafer W is delivered between the transfer device 19b and the cooling processing unit 18c via the shutter member 47b.

Furthermore, as shown in FIG. 1, provided are container shelves for housing an inspection machine 6 and a chemical tower 15 for storing a processing solution used in the first processing unit group 13a. The container shelves are movable along the Y-direction in the drawing by a rail 7. The container shelf has a structure like a door that can be opened and closed, for example, to the front side, and the containers can be housed in the door. This facilitates replacement of containers and maintenance and checks. The inspection machine 6 inspects the thickness of the coating film on the wafer W which has undergone exposure and developing processing and provided as required. The processing solutions are an anti-reflection film resist material to be supplied to the anti-reflection film coating unit (BCT) 16, a resist film material to be supplied to the resist film coating unit (CT) 17, and a developing solution to be supplied to the developing processing unit 26 by way of example. The processing solution stored in the chemical tower 15 disposed at the rear side may be used here as a main source of a processing solution, and it is also possible to design the chemical tower 15 disposed at the rear side as an auxiliary and to dispose another chemical tower in another area as a main source of a processing solution.

In the interface section 5, a buffer cassette 33, having the same structure, for example, as that of the wafer W cassette C, for temporarily holding the wafer W before exposure is disposed on the front side thereof, and an edge aligner 34 is disposed on the rear side. The wafer transfer body 37 which is ascendable and descendable in the vertical direction and further rotatable in the θ-direction can move along a transfer path 36 between the buffer cassette 33 and the edge aligner 34. The wafer transfer body 37 is configured to get access to the cooling processing units (CPL) 18d of the fourth heat and cooling processing units 10d, the buffer cassette 33, the edge aligner 34, and a pre-exposure cooling unit (not shown).

Moreover, as shown in FIG. 1 and FIG. 3, in the coating and developing processing system 1, heat insulation walls 39 and passages 40 for circulating gas exhausted from the bottom portions of the first processing unit groups 13 described later to the upper portions thereof are arranged between the first processing unit groups 13 (the anti-reflection film coating unit (BCT) group 13a and the resist film coating unit (CT) group 13b) and the second processing unit groups 14 (the first and second heat and cooling processing unit groups 14a and 14b) in the first processing station 3, and between the first processing unit groups 13 (the first and the second developing processing unit groups 13c and 13d) and the second processing unit groups 14 (the third and fourth heat and cooling processing unit groups 14c and 14d) in the second processing station 4 respectively. In other words, the heat insulation walls 39 and the passages 40 are arranged to divide the first processing unit groups 13 from the second processing unit groups 14.

As shown in FIG. 2, in the aforesaid antireflection film coating unit group 13a, the antireflection film coating units (BCT) 16 for applying an anti-reflection film to the wafer W while the wafer W is mounted on a spin chuck in a cup to thereby perform anti-reflection film coating processing for the wafer W are three-tiered.

In the resist coating unit group 13b, the resist coating units (CT) for applying a resist solution onto the wafer W while the wafer W is mounted on a spin chuck in a cup to thereby perform resist coating processing for the wafer W are three-tiered.

In the first developing processing unit group 13c, the developing processing units (DEV) 26 for supplying a developing solution onto the wafer W while the wafer W is mounted on a spin chuck in a cup to thereby perform developing processing for the wafer W are two-tiered from the top.

Similarly, in the second developing processing unit group 13d, the developing processing units (DEV) 26 for supplying a developing solution onto the wafer W while the wafer W is mounted on a spin chuck in a cup to thereby perform developing processing for the wafer W are two-tiered from the top.

In the second and third heat and cooling processing unit groups 14b and 14c, heat and cooling processing units 10 are seven-tiered, and further transfer units (STL) 38b and 38c are disposed at tiers under those units respectively as shown in FIG. 4. The delivery of the wafer W between the first and second processing stations 3 and 4 is conducted via the communicating path 40a which communicates the two transfer units (STL) 38b a and 38c. As shown in FIG. 4, the transfer units (STL) 38b and 38c are provided with opening portions respectively, and shutter members 48a, 48b, 49a, and 49b capable of being opened and closed are provided in correspondence with the opening portions respectively. By opening and closing the shutter members 48a and 49a, the wafer W is delivered between the transfer units (STL) 38b and 38c and the corresponding transfer devices 19a and 19b. Further, the shutter members 48b and 49a are opened and closed, whereby the wafer W is delivered between the transfer units (STL) 38b and 38c, the delivery between the first and second stations is conducted via the communicating path 40a.

Next, the above-described transfer devices 19a and 19b will be explained with reference to FIG. 5 that is a perspective view. The transfer devices 19a and 19b have the same structure and thus will be described, referred to as numeral 19.

Figure 5:
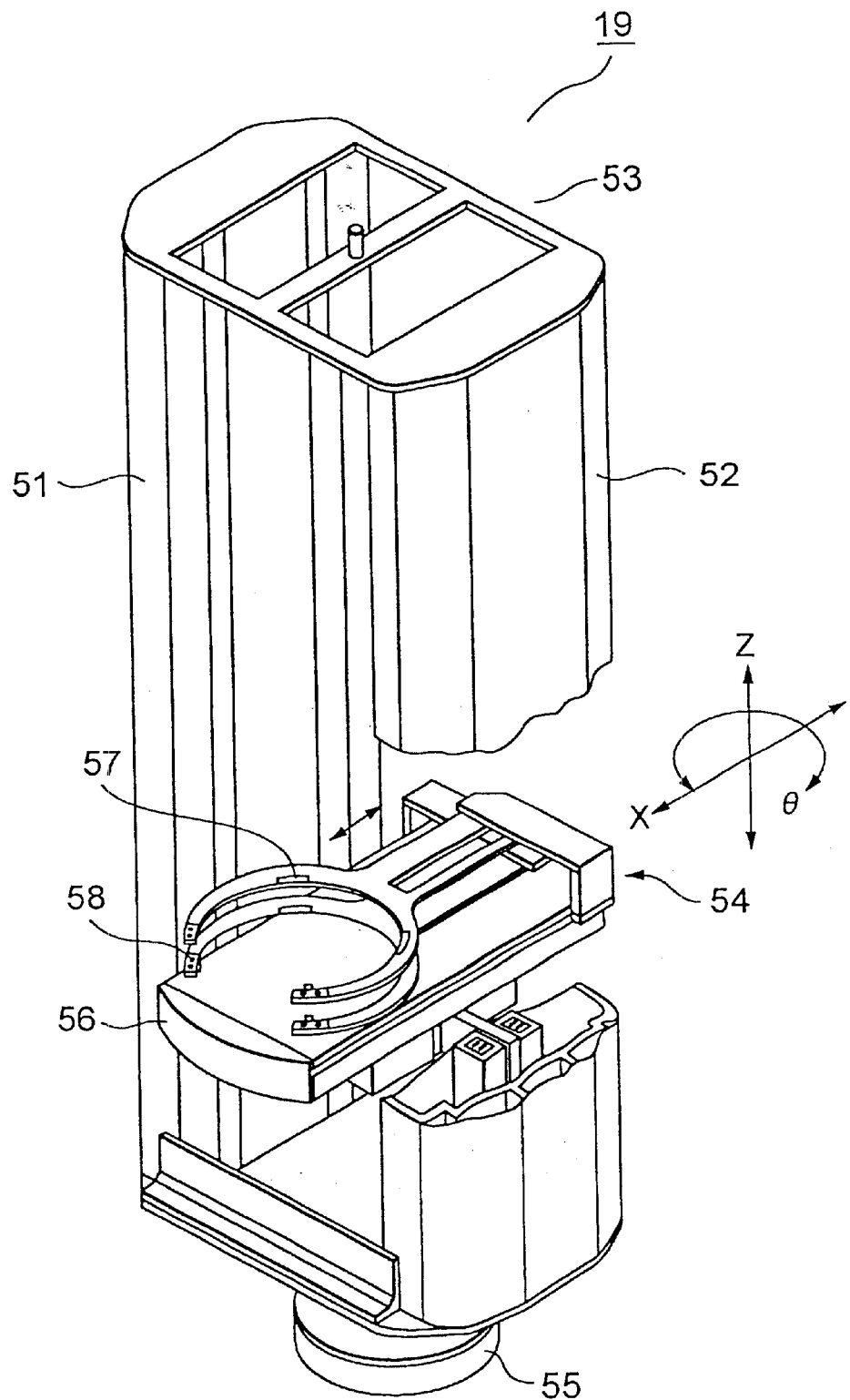
FIG. 5 is perspective view showing the structure of a transfer device.

As shown in FIG. 5, the transfer device 19 includes wafer W transfer means 54 which is ascendable and descendable in the vertical direction (the Z-direction) inside a cylindrical supporter 53 composed of a pair of wall portions 51 and 52 which are connected with each other at respective upper ends and lower ends and face each other. The cylindrical supporter 53 is connected to a rotating shaft of a motor 55 and rotates integrally with the wafer W transfer means 54 around the aforesaid rotating shaft by rotational driving force of the motor 55. Accordingly, the wafer W transfer means 54 is rotatable in the θ-direction.

On a transfer base 56 of the wafer W transfer means 54, a plurality of, for example, two tweezers 57 and 58 for holding the wafer W are vertically provided. These tweezers 57 and 58 basically have the same structure and each have a shape and a size capable of freely passing through a side opening portion between both the wall portions 51 and 52 of the cylindrical supporter 53. Further, each of the tweezers 57 and 58 is movable back and forth by means of a motor (not shown) embedded in the transfer base 56.

Figure 6:
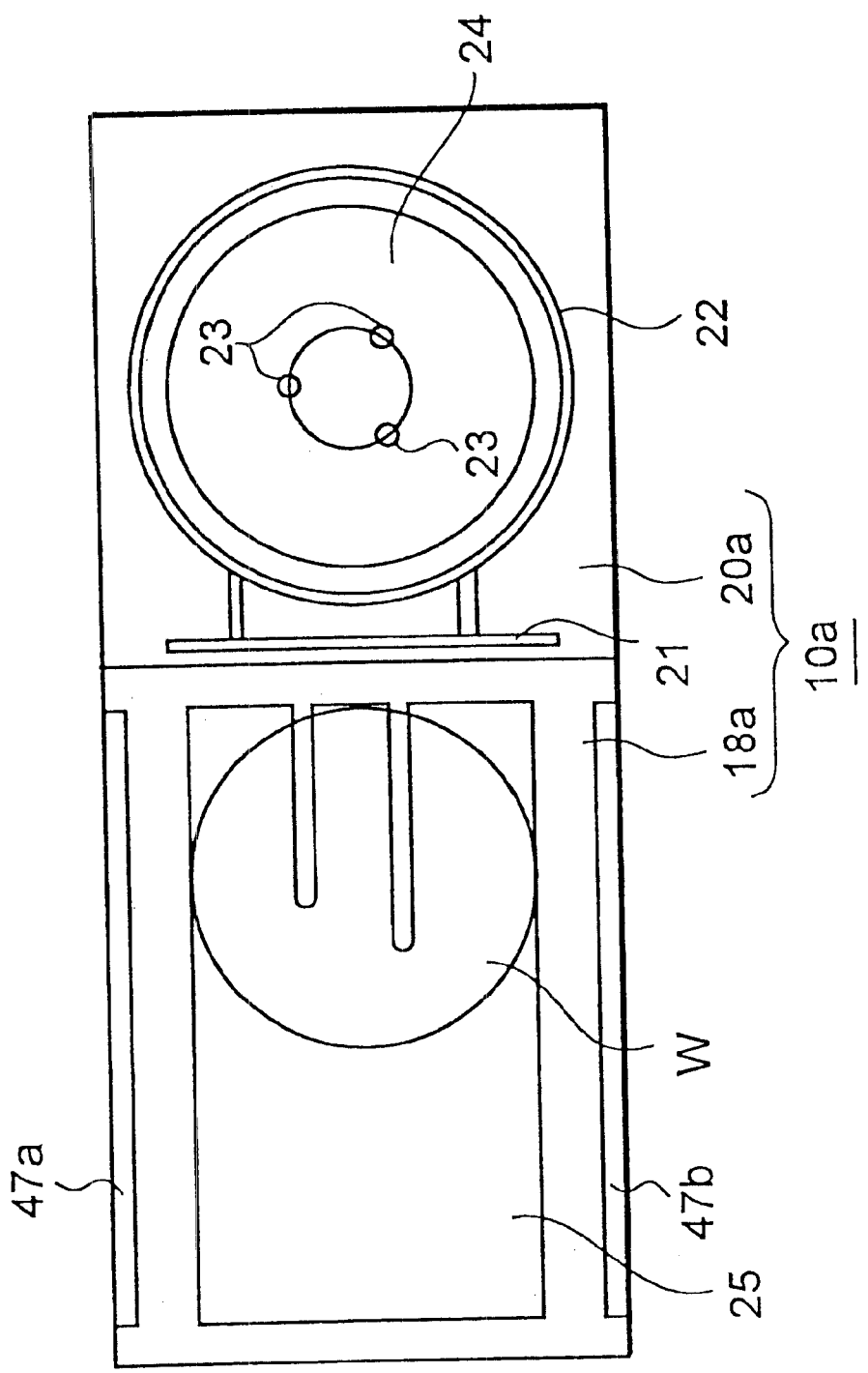
FIG. 6 is a plan view showing the structure of the heat and cooling processing unit.

Next, referring to FIG. 4, FIG. 6, and FIG. 7, a structure of the above-described first heat and cooling processing unit 10a will be explained. FIG. 6 is a plan view of the heat and cooling processing unit, and FIG. 7 is a sectional view of the heat and cooling processing unit.

Figure 7:
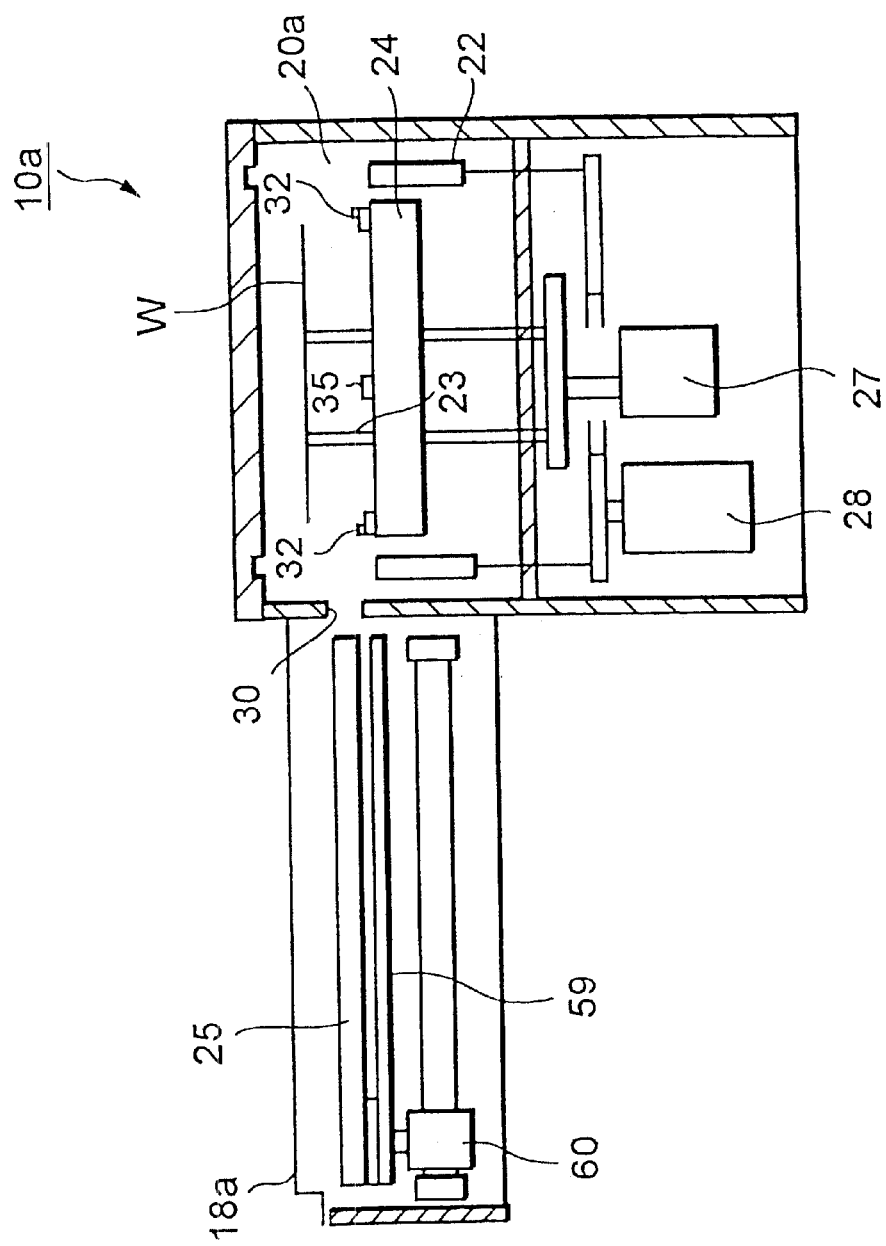
FIG. 7 is a sectional view showing the structure of the heat and cooling processing unit shown in FIG. 6.

As shown in FIG. 6 and FIG. 7, the first heat and cooling processing unit 10a has a structure in which the heat processing unit (HP) 20a for performing heat processing for the wafer W and the cooling processing unit (CPL) 18a for performing cooling processing for the wafer W are adjacent to each other to be integrated.

The heat processing unit (HP) 20a has a hot plate 24 which can be brought to a set temperature of about 200° C. Further, the heat processing unit (HP) 20a has a gate shutter 21 for opening and closing a portion between the heat processing unit (HP) 20a and the cooling processing unit (CPL) 18a and a ring shutter 22 which is raised and lowered together with the gate shutter 21 while surrounding the wafer W around the hot plate 24. Three lifting pins 23 for raising and lowering the wafer W while the wafer W is mounted thereon are provided through the hot plate 24 to be ascendable and descendable. It should be noted that a shielding screen may be provided between the hot plate 24 and the ring shutter 22. Below the heat processing unit (HP) 20a, provided are a raising and lowering mechanism 27 for raising and lowering the aforesaid three lifting pins 23 and a raising and lowering mechanism 28 for raising and lowering the ring shutter 22 with the gate shutter 21. A proximity pins 35 with a height of 0.2 mm and further a guide 32 are provided on the hot plate 24.

The cooling processing unit (CPL) 18a has a chill plate 25 for cooling the wafer W to room temperature at about 23° C. As shown in FIG. 4 and FIG. 6, an opening portion for the delivery of the wafer W to/from the cassette station 2 is provided on the side portion of the cooling processing unit (CPL) 18a on the cassette station side, and a shutter member 47a capable of being opened and closed is disposed in correspondence with the opening portion. Further, an opening portion for the delivery of the wafer W to/from the transfer device 19 is provided on the side face of the cooling processing unit (CPL) 18a on the transfer device 19 side, and a shutter member 47b capable of being opened and closed is disposed in correspondence with the opening portion.

As shown in FIG. 7, the heat processing unit (HP) 20a communicates with the cooling processing unit (CPL) 18a through a communicating port 30, and the chill plate 25 for cooling the wafer W while the wafer W is mounted thereon is movable in a horizontal direction along a guide plate 59 by means of a moving mechanism 60. This causes the chill plate 25 to get into the heat processing unit (HP) 20a through the communicating port 30, receive the wafer W which has been heated by the hot plate 24 in the heat processing unit (HP) 20a from the lifting pins 23, and carry the wafer W into the cooling processing unit (CPL) 18a to perform cooling processing for the wafer W.

The first heat and cooling processing unit 10a has been described in the above, and the fourth heat and cooling processing unit 10d of the fourth heat and cooling processing unit group 14d has the same structure. Moreover, the second heat and cooling processing unit 10b and the third heat and cooling processing unit 10c have nearly the same structure as that of the first heat and cooling processing unit 10a. However, as shown in FIG. 1 and FIG. 4, the difference between them is in that the shutter members 47a and 47b are provided on both sides of the first heat and cooling processing unit 10a, but in contrast to that the second and third heat and cooling processing units 10b and 10c are each provided with the shutter member 47a or 47b only on the side face thereof on the transfer device 19 side. In this embodiment, open/close drive of the shutter members 47a and 47b is performed in the cooling processing units (CPL) 18a and 18d so as not to bring about a state in which both the shutter members 47a and 47b are opened. More specifically, the opening portion is closed by the shutter member 47b with the cooling processing units (CPL) 18a or 18d being opened by the shutter member 47a, and conversely, the opening portion is close by the shutter member 47a with the cooling processing units (CPL) 18a or 18d opened by the shutter member 47b. The open/close drive of the shutter members 47a and 47b is controlled as above, whereby the cooling processing unit (CPL) serves a function such as a load-lock chamber, with the result that temperature regulation in the processing solution supply unit (BCT, CT, DEV) for performing processing for the wafer W at about room temperature can be performed more precisely.

Figure 8:
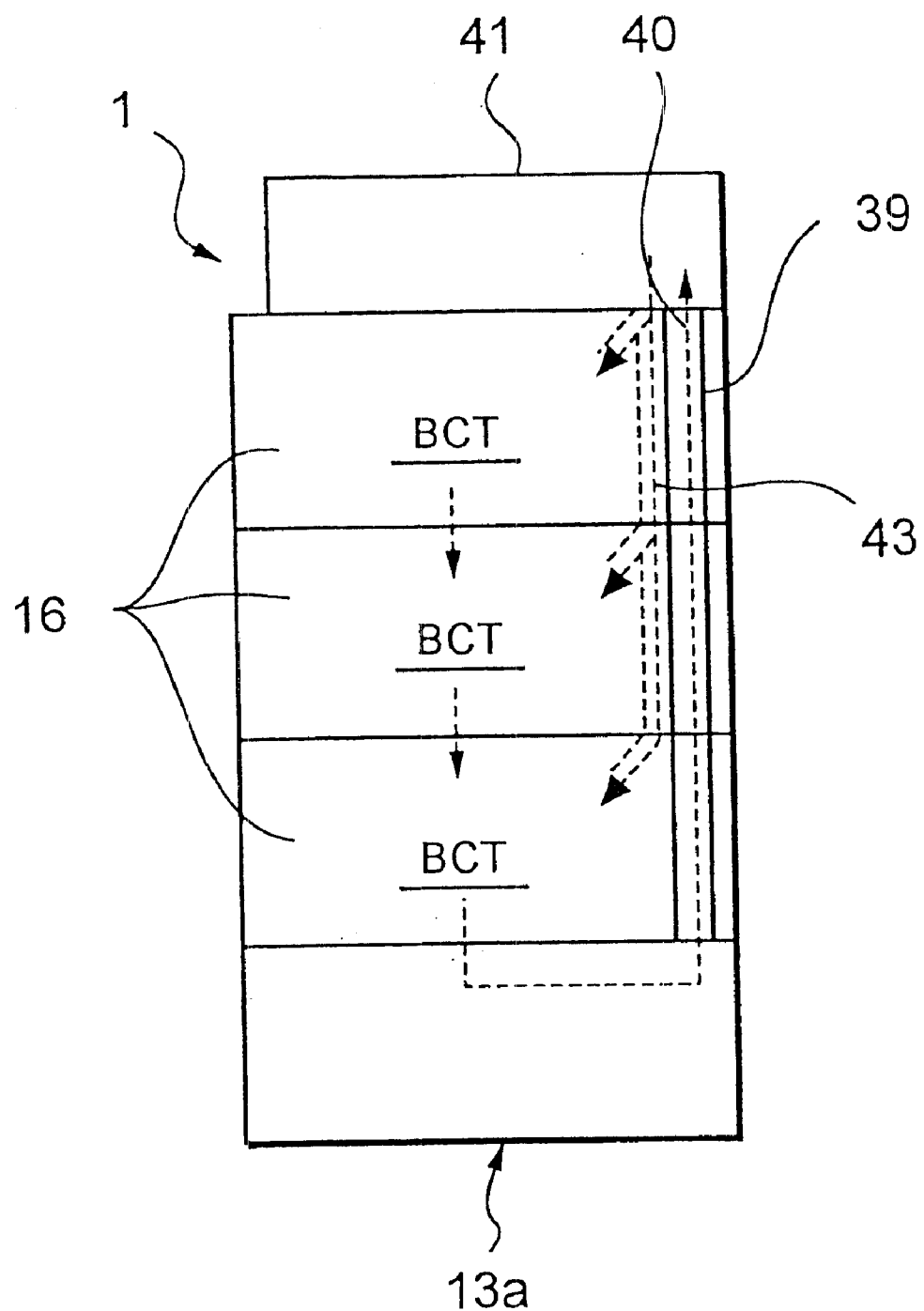
FIG. 8 is a schematic sectional view showing the structure of a temperature regulation mechanism.

As described above, the heat insulation walls 39 and temperature regulating mechanisms, in which passages 40 for circulating gas exhausted from the bottom portions of the first processing unit groups 13 to the upper portions thereof are arranged respectively between the first processing unit groups 13a, 13b, 13c, and 13d and the second processing unit groups 14a, 14b, 14c, and 14d, are provided in this embodiment. The temperature regulating mechanism will be explained below with FIG. 8. Incidentally, FIG. 8 is a schematic sectional view of the first processing unit group 13a in which the anti-reflection film coating units (BCT) 16 are multi-tiered.

A clean air supply section 41 for supplying temperature-regulated clean air from the top to the anti-reflection film coating unit (BCT) group 13a as the first processing unit group in the first processing station 3 is disposed at the top of the coating and developing processing system 1. The clean air supply section 41 includes an FFU (a fan and filter unit), a temperature regulator for regulating temperature and humidity, and the like, and supplies clean air, gas which flows thereinto through the passage 40 for circulating gas exhausted from the bottom portion of anti-reflection film coating unit (BCT) group 13*a* to the top portion thereof and is regulated in temperature and humidity, and particles and the like are eliminated therefrom, to each of the anti-reflection film coating units (BCT) 16 through a passage 43. Furthermore, as shown in FIG. 1, the heat insulation wall 39 is provided between the passage 40 and the heat and cooling processing units 10*a* as the second processing unit group. In this embodiment, the provision of the insulation wall and the temperature regulating mechanism makes it possible to perform more precisely temperature regulation in the processing solution supply unit (BCT, CT, DEV) for performing processing for the wafer W at about room temperature. Similarly, clean air supply sections 41 and heat insulation walls 39 are separately provided between the first processing unit groups 13*b*, 13*c*, and 13*d* and the corresponding heat and cooling processing unit groups 14*b*, 14*c*, and 14*d* as shown in FIG. 1.

Next, processing steps in the coating and developing processing system 1 thus structured will be explained.

In the coating and developing processing system 1, the unprocessed wafer W housed in the cassette C is taken out by the wafer transfer body 11 of the cassette station 2, and then transferred into the cooling processing unit (CPL) 18*a* in the heat and cooling processing unit 10*a* of the first processing station 3 and mounted on the chill plate 25 to be subjected to cooling processing.

The wafer W which has undergone the cooling processing in the cooling processing unit (CPL) 18*a* is transferred into the anti-reflection film coating unit (BCT) 16 in the anti-reflection film coating unit (BCT) group 13*a* by the transfer device 19*a* and coated with a processing solution for anti-reflection film.

The wafer W which has been coated with the processing solution for anti-reflection film in the anti-reflection film coating unit (BCT) 16 is transferred into the cooling processing unit (CPL) 18*a* of the first heat and cooling processing unit 10*a* by the transfer device 19*a* and mounted on the chill plate 25. The wafer W mounted on the chill plate 25 is transferred into the heat processing unit (HP) 20*a* through the communicating port 30 by means of the chill plate 25 which is horizontally moved by the moving mechanism 60 as shown in FIG. 7. The transferred wafer W is supported by the lifting pins 23 which have ascended. Thereafter, the lifting pins 23 descend to mount the wafer W on the hot plate 24, and heat processing is performed in a heat processing space formed by the ring shutter 22 and the gate shutter 21 being raised simultaneously. After the heat processing, the lifting pins 23 are raised and the ring shutter 22 and the gate shutter 21 are lowered, whereby the wafer W is separated from the hot plate 24 and supported by the lifting pins 23.

Then, the chill plate 25 is inserted again into the heat processing unit (HP) 20*a* and receives the wafer W which has undergone heat processing. The wafer W is transferred into the cooling processing unit (CPL) 18*a* by the chill plate 25 to be subjected to cooling processing.

The wafer W which has undergone cooling processing in the cooling processing unit (CPL) 18*a* is transferred into the resist coating unit (CT) 17 in the resist coating unit group 13*b* by the transfer device 19*a* to be coated with a resist solution.

The wafer W which has been coated with the resist solution in the resist coating unit (CT) 17 is transferred into the cooling processing unit (CPL) 18*b* of the second heat and cooling processing unit group 10*b* by the transfer device 19*a* and mounted on the chill plate 25. The wafer W mounted on the chill plate 25 is transferred into the heat processing unit (HP) 20*b* through the communicating port 30 by means of the chill plate 25 which is horizontally moved by the moving mechanism 60. The transferred wafer W is supported by the lifting pins 23 which have ascended. Thereafter, the lifting pins 23 descend to mount the wafer W on the hot plate 24, and heat processing is performed in a heat processing space formed by the ring shutter 22 and the gate shutter 21 being raised simultaneously. After the heat processing, the lifting pins 23 are raised and the ring shutter 22 and the gate shutter 21 are lowered, whereby the wafer W is separated from the hot plate 24 and supported by the lifting pins 23.

Then, the chill plate 25 is inserted again into the heat processing unit (HP) 20*b* and receives the wafer W which has undergone heat processing. The wafer W is transferred into the cooling processing unit (CPL) 18*b* by the chill plate 25 to be subjected to cooling processing.

The wafer W which has undergone the cooling processing in the cooling processing unit (CPL) 18*b* is transferred to the transfer unit (STL) 38*b* disposed at the lowermost tier in the second heat and cooling processing unit group 14*b* by the transfer device 19*a* and transferred to the transfer unit (STL) 38*c* in the third heat and cooling processing unit group 14*c* through the communicating path 40*a*.

The wafer which has been transferred to the transfer unit (STL) in the third heat and cooling processing unit group 14*c* is transferred to the cooling processing unit of the heat and cooling processing unit 10*d* in the fourth heat and cooling processing unit group 14*d* by the transfer device 19*b*.

The wafer W transferred to the cooling processing unit is further transferred into the edge aligner 34 by the wafer transfer body 37 in the interface section 5 to be subjected to edge exposure.

The wafer W which has undergone the edge exposure in the edge aligner 34 is transferred to the buffer cassette 33 by the wafer transfer body 37 and then temporarily held or transferred to the aligner (not shown) via the wafer transfer body 37, the pre-exposure cooling unit (not shown), and the wafer transfer body. It is possible to provide, for example, two buffer cassettes 33 here and use one of them for a cassette for holding the wafer W after edge exposure and the other for a cassette for holding the wafer W before edge exposure. In this case, it is preferable to provide a mechanism for cooling the wafer W to room temperature at about 23° C. in the cassette for holding the wafer W before edge exposure. Alternatively, it is possible that the buffer cassette 33 holds only the wafer W after edge exposure, and the unoccupied cooling processing unit 18*c* or 18*d* of the heat and cooling processing unit 10*c* or 10*d* in the second processing unit group 14*c* or 14*d* is used as a place for allowing the wafer W before edge exposure to wait therein. In this case, it is unnecessary to provide the buffer cassette for holding the wafer W before edge exposure.

Then, the wafer W which has undergone the exposure processing by means of the aligner is transferred from the interface section 5 to the cooling processing unit (CPL) 18*d* of the fourth heat and cooling processing unit 10*d* in the second heat and cooling processing unit group 14*d* in the second processing station 4 via the wafer transfer body, the buffer cassette 33, and the wafer transfer body 37 and subjected to cooling processing.

The wafer W which has undergone the cooling processing in the cooling processing unit (CPL) 18d is transferred to the developing processing unit (DEV) 26 in the first developing processing unit group 13c or the second developing processing unit group 13d by the transfer device 19b and subjected to developing processing.

The wafer W which has undergone the developing processing in the developing processing unit (DEV) 26 is transferred into the heat processing unit (HP) 20c adjacent to the cooling processing unit (CPL) 18c via the cooling processing unit (CPL) 18c of the heat and cooling processing unit 10c in the third heat and cooling processing unit group 14c by the transfer device 19b and subjected to heat processing.

The wafer W which has undergone the heat processing in the heat processing unit (HP) 20c is transferred to the cooling processing unit 18c, transferred to the transfer unit (STL) 38c in the second processing station 4 by the transfer device 19b, and transferred to the transfer unit (STL) 38b in the first processing station 3 through the communicating path 40a.

The wafer W which has been transferred to the transfer unit (STL) is transferred to the cooling processing unit 18a of the first heat and cooling processing unit 10a in the first heat and cooling processing unit group 14a by the transfer device 19a. Then, the wafer W in the cooling processing unit 18a is housed in the cassette C by the wafer transfer body 11 in the cassette station 2. In the case where the inspection machine 6 is provided, the wafer W in the cooling processing unit 18a is here transferred to the inspection machine 6 by the wafer transfer body 11 of the cassette station 2. The inspection machine 6 determines whether the width of a pattern obtained by exposure and developing processing is proper or not by measuring a film thickness of a resist film. The wafer W which has been inspected is housed in the cassette C by the wafer transfer body 11 of the cassette station 2.

In the coating and developing processing system according to this embodiment structured as above, the cooling processing units (CPL) of the heat and cooling processing unit is disposed on the solution processing unit side, thereby bringing about a structure in which the cooling processing unit (CPL) is interposed between the solution processing unit and the heat processing unit (HP). This minimizes heat influence from the heat processing unit to the part of the solution processing unit. Consequently, temperature regulation in the solution processing unit (BCT, CT, DEV) for performing solution processing for the wafer W can be precisely performed in the coating and developing processing system.

Further, in the coating and developing processing system according to this embodiment, the heat insulation walls 39 and the passages 40 for circulating the gas exhausted from the respective bottom portions of the solution processing unit groups 13a, 13b, 13c, and 13d to the top portions thereof are arranged between the solution processing unit groups (the anti-reflection film coating unit (BCT) group 13a, the resist film coating unit (CT) group 13b, the first developing processing unit group 13c, and the second developing processing unit group 13d) and the heat and cooling processing unit groups (the first to the fourth heat and cooling processing unit groups 14a, 14b, 14c, and 14d) in the first and second processing stations 3 and 4 respectively. The passage 40 also has a function of heat insulation means, bringing about the arrangement of double heat insulation means between the first processing unit group 13 and the second processing unit group 14, thereby further suppressing heat influence of the heat processing unit of the heat and cooling processing unit to the solution unit group. Consequently, temperature regulation in the solution processing unit group for performing solution processing for the wafer W at about room temperature can be precisely performed.

Figure 9:
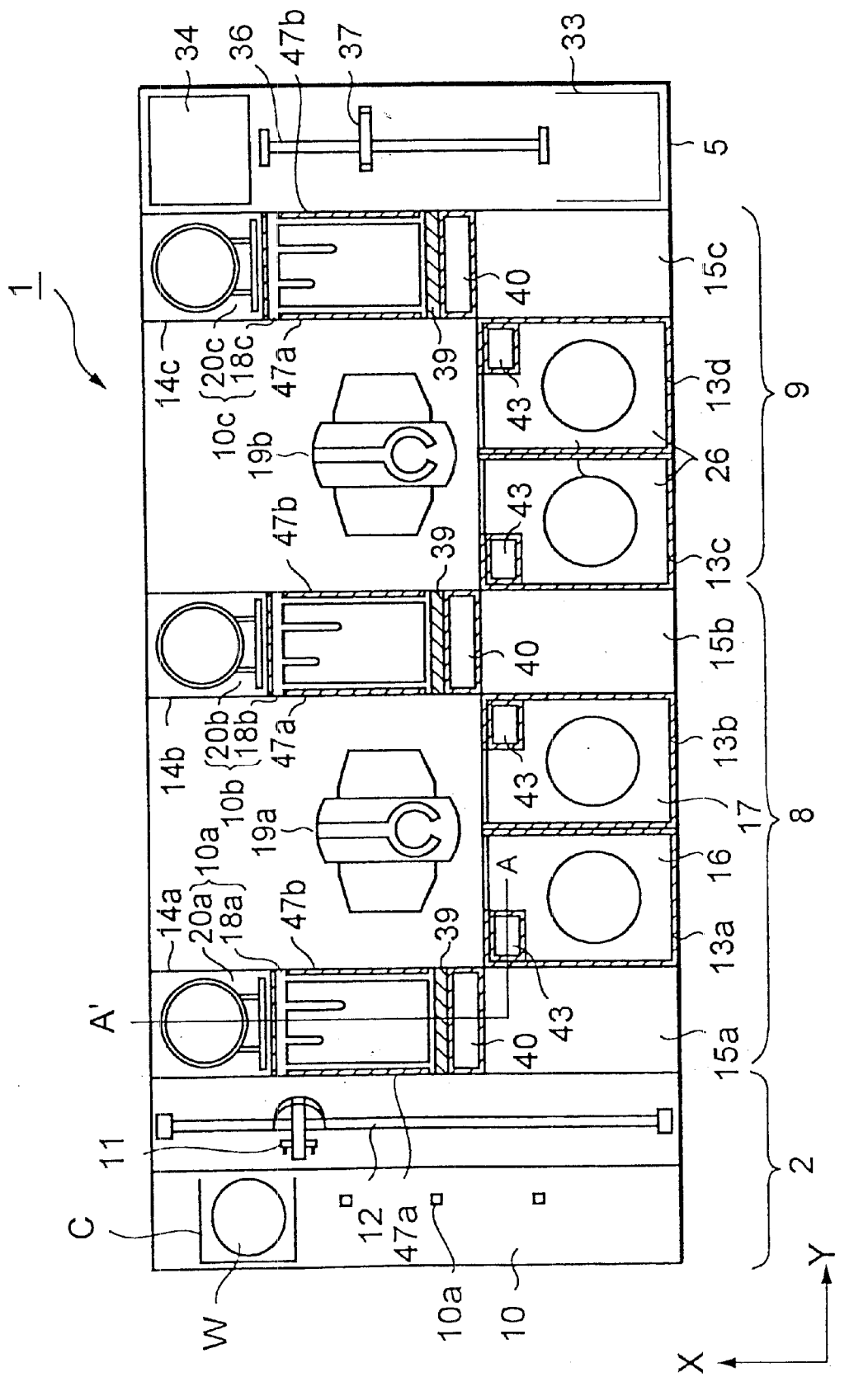
FIG. 9 is a plan view showing a coating and developing processing system according to a second embodiment of the present invention.
Figure 10:
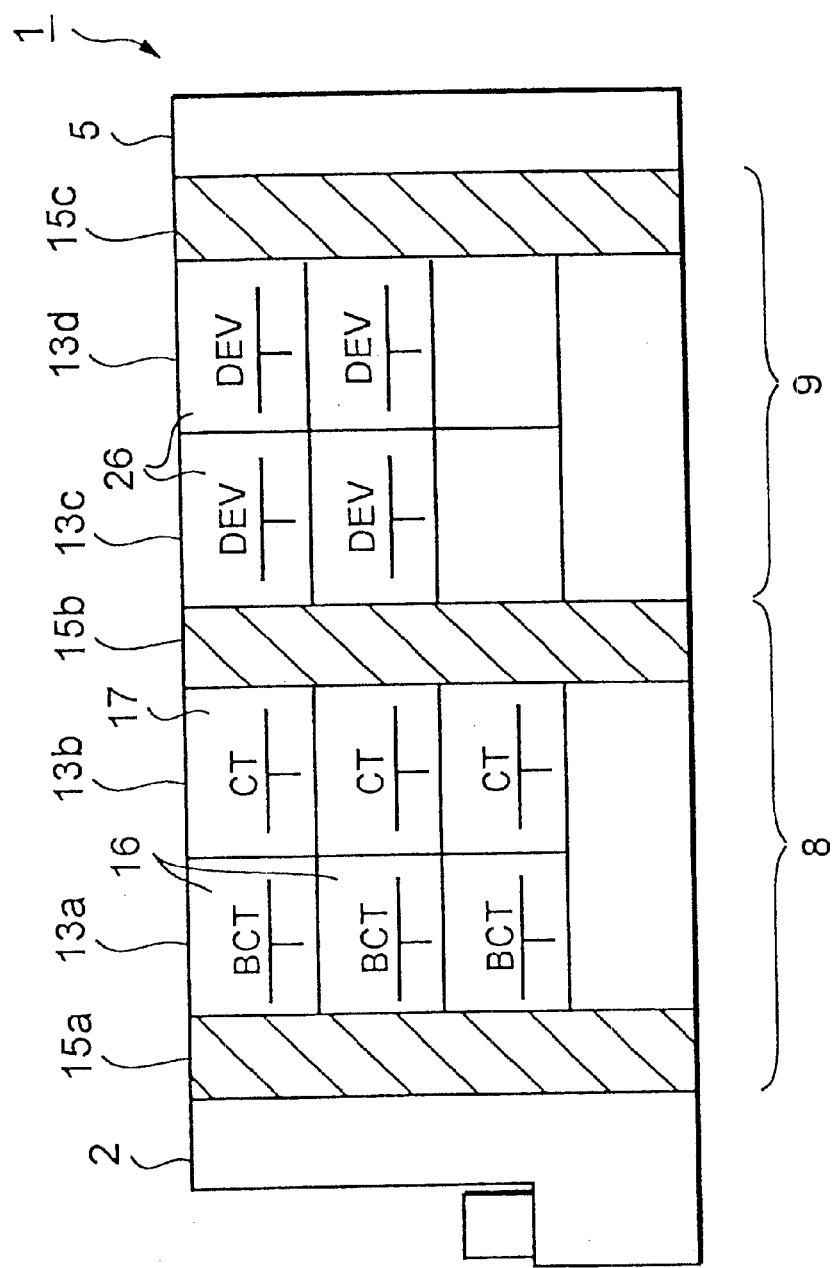
FIG. 10 is a front view of the coating and developing processing system shown in FIG. 9.
Figure 11:
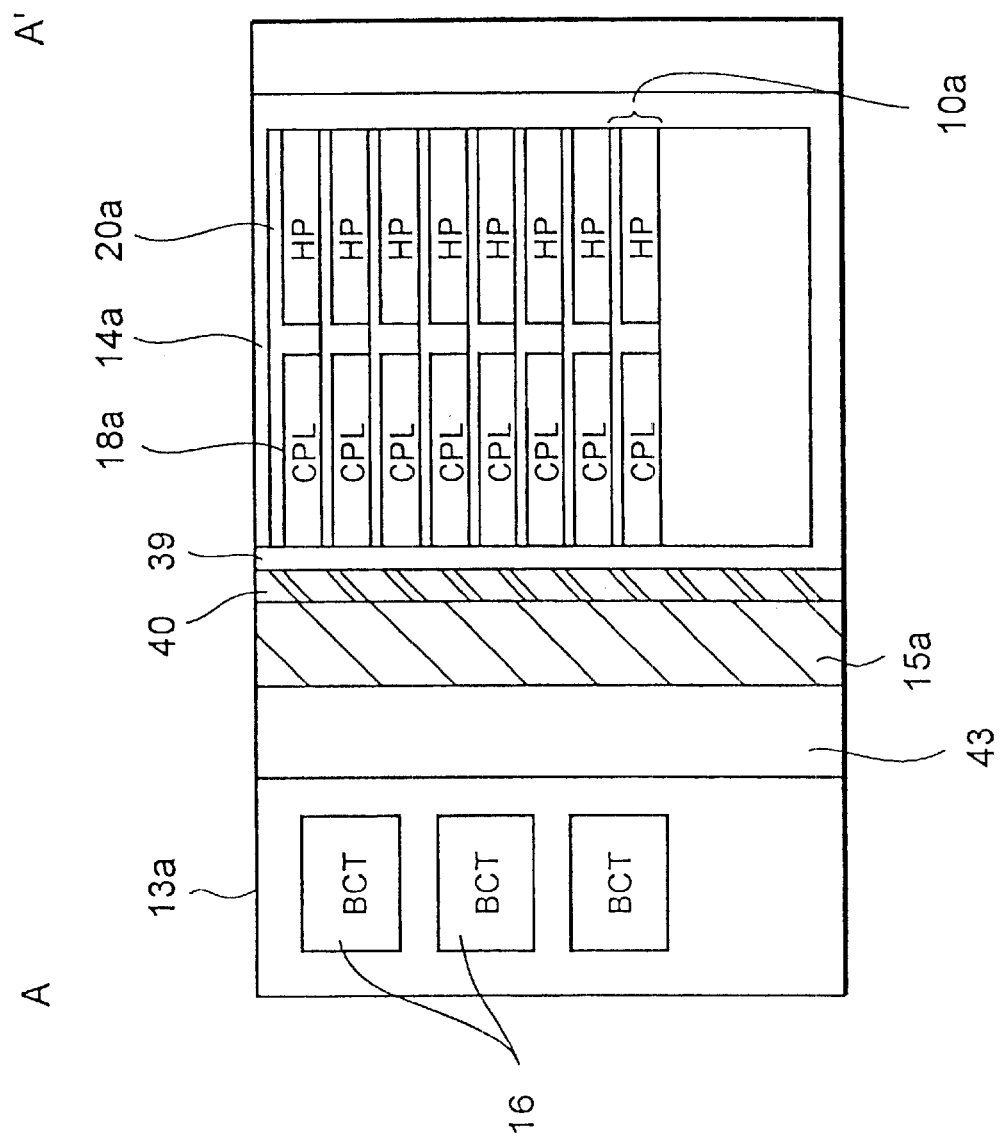
FIG. 11 a sectional view when the system is sectioned along the A–A' line in FIG. 9.

Hereinafter, a second embodiment of the present invention will be explained with reference to FIG. 9 to FIG. 11. FIG. 9 to FIG. 11 are views showing a coating and developing system according to an embodiment of the present invention, FIG. 9 is a plan view, and FIG. 10 is a front view. FIG. 11 is a sectional view when the system is sectioned along the A–A' line in FIG. 9, a view showing the positional relations between a first processing unit group 13a, a second processing unit group 14a, and a chemical tower 15a in an X-direction.

This embodiment is different in structure from the aforesaid first embodiment in the arrangement of the chemical tower for housing a processing solution therein and in that the number of heat and cooling processing units disposed between two transfer devices 19a and 19b is one. Hereinafter, the description is made on the second embodiment, but part of the description about the same structure as that of the first embodiment is omitted. Incidentally, the same components as those in the first embodiment will be explained with the same numerals.

As shown in FIG. 9, the coating and developing processing system 1 has a structure in which a cassette station 2 which is the same as that in the first embodiment, a first processing station 8 in which various kinds of processing units each for performing predetermined processing for the wafers W one by one in coating and developing processing steps are multi-tiered, a second processing station 9 disposed adjacent to the first processing station, and an interface section 5 for delivering the wafer W to/from an aligner (illustration thereof is omitted) disposed adjacent to the second processing station 9 are integrally connected. In the first processing station 8, coating processing of anti-reflection film and resist film onto the wafer W is mainly performed, and developing processing of the resist film which has been exposed is performed in the second processing station 9.

The cassette station 2 has the same structure as that of the first embodiment and thus the description thereof is omitted.

As shown in FIG. 9 and FIG. 10, in the first processing station 8, an anti-reflection film coating unit (BCT) group 13a and a resist film coating unit (CT) group 13b are provided on the front side as a first processing unit group in which solution processing is performed. The anti-reflection film coating unit (BCT) group 13a is made up by anti-reflection film coating units (BCT) 16 for performing coating processing for the wafer W at about room temperature being three-tiered in a Z-direction. The resist film coating unit (CT) group 13b is made up by resist film coating units (CT) 17 for performing coating processing for the wafer W at about room temperature being three-tiered in the Z-direction. Further, chemical towers 15a and 15b are disposed respectively adjacent to the anti-reflection film coating unit (BCT) group 13a and the resist film coating unit (CT) group 13b. An anti-reflection film material to be supplied as a processing solution to the anti-reflection film coating unit (BCT) 16 is stored in the chemical tower 15a, and a resist material to be supplied as a processing solution to the resist film coating unit (CT) 17 is stored in the chemical tower 15b.

At the rear side of the first processing station 8, a first heat and cooling processing unit group 14a and a second heat and cooling processing unit group 14b as a second processing unit group are disposed with a transfer device 19a therebetween. The first heat and cooling processing unit group 14a and the second heat and cooling processing unit group 14b are disposed adjacent to the chemical towers 15a and 15b respectively. The first heat and cooling processing unit group 14a is made up by first heat and cooling processing units 10a being eight-tiered in the Z-direction. The second heat and cooling processing unit group 14b is made up by second heat and cooling processing units 10b being eight-tiered in the Z-direction. The first and second heat and cooling processing units 10a and 10b are made up respectively by cooling processing units (CPL) 18a and 18b for performing cooling processing for the wafer W and heat processing units (HP) 20a and 20b for performing heat processing being adjacent to each other to be integrated.

As shown in FIG. 11, the first heat and cooling processing unit group 14a is made up by the first heat and cooling processing units 10a being multi-tiered. Incidentally, FIG. 11 is a sectional view when the system is sectioned along the A–A' line in FIG. 9, a view showing the positional relations between the first processing unit group 13a, the chemical tower 15a, and the second processing unit group 14a in the X-direction. As shown in FIG. 9 and FIG. 11, the first heat and cooling processing unit group 14a as the second processing unit group is made up by the first heat and cooling processing units 10a being eight-tiered, and the cooling processing units (CPL) 18a out of the heat processing units (HP) 20a and the cooling processing units (CPL) 18a in all the first heat and cooling processing units 10a are disposed on the side of the chemical tower 15a as a processing solution supply section. The anti-reflection film coating unit group 13a as the first processing unit group is disposed adjacent to the chemical tower 15a. Similarly, the second heat and cooling processing unit group 14b is made up by the second heat and cooling processing units 10b being eight-tiered, and the cooling processing units (CPL) 18b out of the heat processing units (HP) 20b and the cooling processing units (CPL) 18b in all the first heat and cooling processing units 10b are disposed on the side of the chemical tower 15b as a processing solution supply section. The resist film coating unit group 13b as the first processing unit group and a first developing processing unit group 13c described later are disposed adjacent to the chemical tower 15b.

The anti-reflection film coating unit group (BCT) 13a, the resist film coating unit group (CT) 13b, and the first and second heat and cooling processing unit groups 14a and 14b are arranged around the vertical transfer-type wafer transfer device 19a. The structures of the transfer device 19a, the anti-reflection film coating unit (BCT) group 13a, the resist film coating unit (CT) group 13b, and the first heat and cooling processing unit group 14a in the first processing station 8 are the same as those of the first processing station 3 in the first embodiment, and thus detailed description thereof is omitted here. The second heat and cooling processing unit group 14b in this embodiment is different in structure, in comparison with the second heat and cooling processing unit group 14b in the aforesaid first embodiment, in that shutter members 47a and 47b are provided on both sides thereof and no transfer unit (STL) is provided. In this embodiment, the transfer of the wafer W between the first processing station 8 and the second processing station 9 described later can be conducted via the cooling processing unit 18b of each second heat and cooling processing unit 10b of the second heat and cooling processing unit group 14b. Therefore, each cooling processing unit 18b is provided with the shutter members 47a and 47b on both sides respectively.

On the other hand, in the second processing station 9, as shown in FIG. 9 and FIG. 10, the first developing processing unit group 13c and a second developing processing unit group 13d are arranged on the front side as a first processing unit group for performing solution processing for the wafer W at about room temperature as in the first processing station 8. The developing processing unit group 13c is made up by developing processing units (DEV) 26 being two-tiered in the Z-direction, and the second developing processing unit group 13d is made up by developing processing units (DEV) 26 similarly being two-tiered in the Z-direction. Further, a chemical tower 15c is disposed adjacent to the second developing processing unit group 13d. A developing solution to be supplied as a processing solution to the developing processing unit (DEV) 26 is stored in the chemical tower 15c.

At the rear side of the second processing station 9, a third heat and cooling processing unit group 14c as a second processing unit group is disposed at a position facing the second heat and cooling processing unit group 10b with a transfer device 19b therebetween. The third heat and cooling processing unit group 14c is disposed adjacent to the chemical tower 15c. The third heat and cooling processing unit group 14c is made up by third heat and cooling processing units 10c being eight-tiered in the Z-direction.

The third heat and cooling processing unit 10c is made up by a cooling processing unit (CPL) 18c for performing cooling processing for the wafer W and a heat processing units (HP) 20c for performing heat processing being adjacent to each other to be integrated. As shown in FIG. 9, the cooling processing units (CPL) 18c out of the cooling processing units (CPL) 18c and the heat processing units (HP) 20c in all the tiered third heat and cooling processing unit 10c are disposed on the side of the chemical tower 15c as a processing solution supply section. The developing processing unit (DEV) group 13d as the first processing unit group is disposed adjacent to the chemical tower 15c.

The first developing processing unit group 13c, the second developing processing unit group 13d, and the second and third heat and cooling processing unit groups 14b and 14c are arranged around the vertical transfer-type wafer transfer device 19b. The second heat and cooling unit group 14b here can cope with any of heat processing and cooling processing before and after forming a coating film onto the wafer W, and heat processing and cooling processing before and after developing processing. The transfer of the wafer W between the second heat and cooling processing unit group 14b and the third heat and cooling processing unit group 14c, the transfer of the wafer W between the second heat and cooling processing unit group 14b and the first or second developing processing unit (DEV) group 13c or 13d, and the transfer of the wafer W between the third heat and cooling processing unit group 14c and the first or second developing processing unit (DEV) group 13c or 13d are conducted by the transfer device 19b. The delivery of the wafer W between the second or third heat and cooling processing unit group 14b or 14c and the transfer device 19b is conducted via the shutter members 47b and 47a provided at the cooling processing units 18b and 18c respectively. Further, the delivery of the wafer W between the cooling processing unit 18c of the third heat and cooling processing unit 10c and the wafer transfer body 37 is conducted via the shutter members 47b of the cooling processing unit 18c.

The interface section 5 is the same in structure as that in the aforesaid first embodiment, and thus the description of individual components is omitted.

Moreover, as shown in FIG. 9 and FIG. 11, in the coating and developing processing system 1, the chemical towers 15

(15a, 15b, and 15c) are disposed between the first processing unit groups 13 (the anti-reflection film coating unit group (BCT) 13a, the resist film coating unit (CT) group 13b, the first developing processing unit (DEV) group 13c, and the second developing processing unit (DEV) group 13d) and the second processing unit groups 14 (the first heat and cooling processing unit group 14a, the second heat and cooling processing unit group 14b, and the third heat and cooling processing unit group 14c) in the first processing station 8 and the second processing station 9, and further heat insulation walls 39 and passages 40 for circulating gas exhausted from the bottom portions of the first processing unit groups 13 to the upper portions thereof are arranged between the chemical towers 15 and the second processing unit groups 14. The passage 40 and the heat insulation wall 39 provided adjacent to the chemical tower 15b function as a temperature regulating mechanism and heat insulation means for the two first processing unit groups 13b and 13c corresponding to one first processing unit group 14b. Also in this embodiment, a clean air supply section for supplying temperature-regulated clean air from the top to each first processing unit group is disposed at the top of the coating and developing processing system as in the aforesaid first embodiment. The clean air supply section includes an FFU (a fan and filter unit), a temperature regulator for regulating temperature and humidity, and the like, and supplies clean air, gas which flows thereinto through the passage 40 for circulating the gas exhausted from the bottom portion of the first processing unit group to the top portion thereof and is regulated in temperature and humidity, and particles and the like are eliminated therefrom, to the first processing unit group through a passage 43. Also in this embodiment, the provision of the insulation wall 39 and the temperature regulating mechanism, in which the passage 40 for circulating the gas exhausted from the bottom portion of the first processing unit group 13 to the top portion thereof is disposed, makes it possible to perform more precisely temperature regulation in the processing solution supply unit (BCT, CT, DEV) for performing processing for the wafer W at about room temperature. Further, since the passage 40 also has a function of heat insulating means, the heat insulation wall 39 and the passage 40 are provided between the second processing unit group 14 and the chemical tower 15, bringing about the arrangement of double heat insulating means. Consequently, temperature regulation in the solution processing unit group for performing solution processing for the wafer W at about room temperature can be very precisely performed, and the processing solution housed in the chemical tower is not susceptible to heat influence by the heat and cooling processing unit 20, facilitating temperature regulation of the processing solution.

As shown in FIG. 10, in the anti-reflection film coating unit (BCT) group 13a, the anti-reflection film coating units (BCT) 16 each for applying an anti-reflection film to the wafer W while the wafer W is mounted on a spin chuck in a cup to thereby perform anti-reflection film coating processing for the wafer W are three-tiered. In the resist coating unit (CT) group 13b, the resist film coating units (CT) each for applying a resist solution to the wafer W while the wafer W is mounted on a spin chuck in a cup to thereby perform resist coating processing for the wafer W are three-tiered. In the first developing processing unit group 13c, the developing processing units (DEV) 26 each for supplying a developing solution onto the wafer W while the wafer W is mounted on a spin chuck in a cup to thereby perform developing processing for the wafer W are two-tiered from the top. Similarly, in the second developing processing unit group 13d, the developing processing units (DEV) 26 each for supplying a developing solution onto the wafer W while the wafer W is mounted on a spin chuck in a cup to thereby perform developing processing for the wafer W are two-tiered from the top.

In the first, second, third heat and cooling processing unit groups 14a, 14b, and 14c, the heat and cooling processing units (STL) 10, in each of which the heat processing unit (HP) 20 for performing heat processing for the wafer W and the cooling processing unit (CPL) 18 for performing cooling processing for the wafer W are adjacent to each other to be integrated, are eight-tiered, and the shutter members 47a and 47b are provided on the sides of all the cooling processing units as described above. Incidentally, the structure of the heat and cooling processing unit 10 in this embodiment is the same as that of the first embodiment and thus the description thereof is omitted here.

The structures of the aforesaid transfer devices 19a and 19b are the same as those of the first embodiment and thus the description thereof is omitted.

Next, processing steps in the coating and developing processing system 1 thus structured will be explained. Incidentally, operations in the heat and cooling processing unit are the same as those in the aforesaid first embodiment, and thus the description thereof is omitted.

In the coating and developing processing system 1, the unprocessed wafer W housed in the cassette C is taken out by the wafer transfer body 11 of the cassette station 2, and then transferred into the cooling processing unit (CPL) 18a in the first heat and cooling processing unit 10a of the first processing station 3 and mounted on a chill plate 25 to be subjected to cooling processing.

The wafer W which has undergone the cooling processing in the cooling processing unit (CPL) 18a is transferred into the anti-reflection film coating unit (BCT) 16 in the anti-reflection film coating unit (BCT) group 13a by the transfer device 19a and coated with a processing solution for anti-reflection film.

The wafer W which has been coated with the processing solution for anti-reflection film in the anti-reflection film coating unit (BCT) 16 is transferred into the cooling processing unit (CPL) 18a of the first heat and cooling processing 10a by the transfer device 19a and mounted on the chill plate 25. The wafer W mounted on the chill plate 25 is transferred into the heat processing unit (HP) 20a and subjected to heat processing.

Thereafter, the wafer W is transferred into the cooling processing unit (CPL) 18a to be subjected to cooling processing.

The wafer W which has undergone the cooling processing in the cooling processing unit (CPL) 18a is transferred into the resist coating unit (CT) 17 in the resist coating unit group 13b by the transfer device 19a to be coated with a resist solution. The wafer W which has been coated with the resist solution in the resist coating unit (CT) 17 is transferred into the cooling processing unit (CPL) 18b of the second heat and cooling processing unit 10b by the transfer device 19a. The wafer W is further transferred into the heat processing unit (HP) 20b and subjected to heat processing.

Then, the wafer W is transferred into the cooling processing unit (CPL) 18b to be subjected to cooling processing. The wafer W which has undergone the cooling processing in the cooling processing unit (CPL) 18b is transferred to the cooling processing unit 18c of the third heat and cooling processing unit 10c of the third heat and cooling processing unit group 14c by the transfer device 19b.

The wafer W transferred to the cooling processing unit is further transferred into an edge aligner 34 by a wafer transfer body 37 in the interface section 5 to be subjected to edge exposure.

The wafer W which has undergone the edge exposure in the edge aligner 34 is transferred to a buffer cassette 33 by the wafer transfer body 37 and then temporarily held or transferred to the aligner (not shown) by the wafer transfer body 37, a pre-exposure cooling unit (not shown), and a wafer transfer body.

Then, the wafer W which has undergone the exposure processing by means of the aligner is transferred from the interface section 5 into the cooling processing unit (CPL) 18c of the third heat and cooling processing unit group 10c in the third heat and cooling processing unit group 14c in the second processing station 9 via the wafer transfer body, the buffer cassette 33, and the wafer transfer body 37 and subjected to cooling processing.

The wafer W which has undergone the cooling processing in the cooling processing unit (CPL) 18c is transferred to the developing processing unit (DEV) 26 in the first developing processing unit group 13c or the second developing processing unit group 13d by the transfer device 19b and subjected to developing processing.

The wafer W which has undergone the developing processing in the developing processing unit (DEV) 26 is transferred into the heat processing unit (HP) 20b adjacent to the cooling processing unit (CPL) 18b, for example, via the cooling processing unit (CPL) 18b of the heat and cooling processing unit 10b in the second heat and cooling processing unit group 14b by the transfer device 19b and subjected to heat processing.

The wafer W which has undergone the heat processing in the heat processing unit (HP) 20b is transferred to the cooling processing unit 18b and transferred to the cooling processing unit 18a of the first heat and cooling processing unit 10a in the first heat and cooling processing unit group 14a by the transfer device 19a. Then, the wafer W in the cooling processing unit 18a is housed in the cassette C by the wafer transfer body 11 in the cassette station 2.

In the coating and developing processing system according to this embodiment structured as above, the chemical towers as the processing solution supply section are disposed adjacent to the solution processing units (BCT, CT, DEV), the heat and cooling processing units are disposed adjacent to the chemical towers, and the cooling processing units (CPL) of the heat and cooling processing units are disposed on the chemical tower side, thereby bringing about a structure in which the cooling processing units and the chemical towers are interposed between the heat processing units of the heat and cooling processing units and the solution processing units. This substantially suppresses heat influence from the heat processing units to the solution unit side. Consequently, temperature regulation in the solution processing unit (BCT, CT, DEV) for performing solution processing for the wafer W can be precisely performed in the coating and developing processing system.

Further, in the coating and developing processing system according to this embodiment, the heat insulation walls 39 and the passages 40 for circulating the gas exhausted from the respective bottom portions of the solution processing unit groups 13a, 13b, 13c, and 13d to the top portions thereof are arranged between the solution processing unit groups (the anti-reflection film coating unit (BCT) group 13a, the resist film coating unit (CT) group 13b, the first developing processing unit (DEV) group 13c, the second developing processing unit (DEV) group 13d) and the heat and cooling processing unit groups (the first to the third heat and cooling processing unit groups 14a, 14b, and 14c). This further prevents heat influence of the heat and cooling processing unit to the solution processing unit group, so that temperature regulation in the solution processing unit group for performing solution processing for the wafer W at about room temperature can be very precisely performed.

Figure 12:
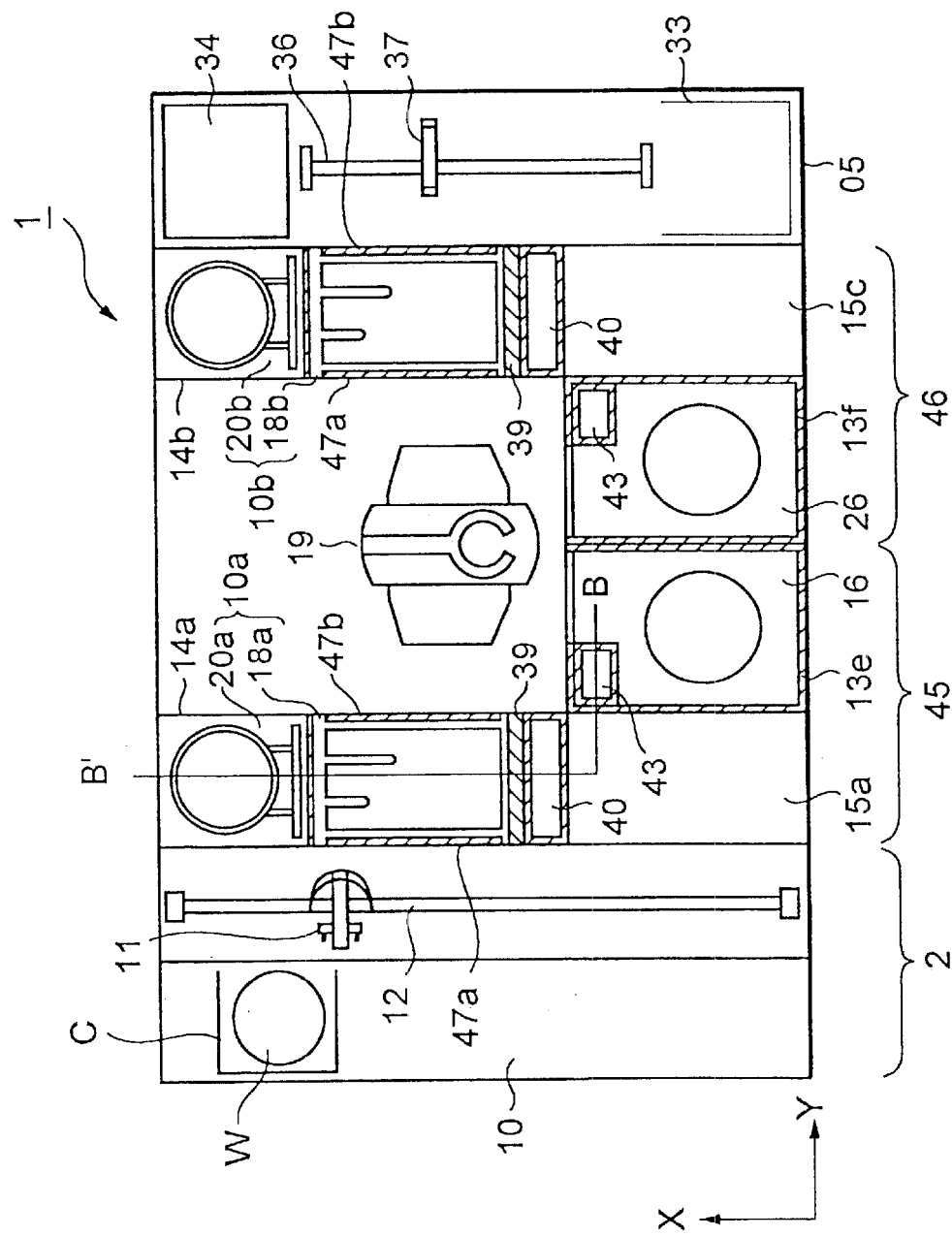
FIG. 12 is a plan view showing a coating and developing processing system according to a third embodiment of the present invention.
Figure 13:
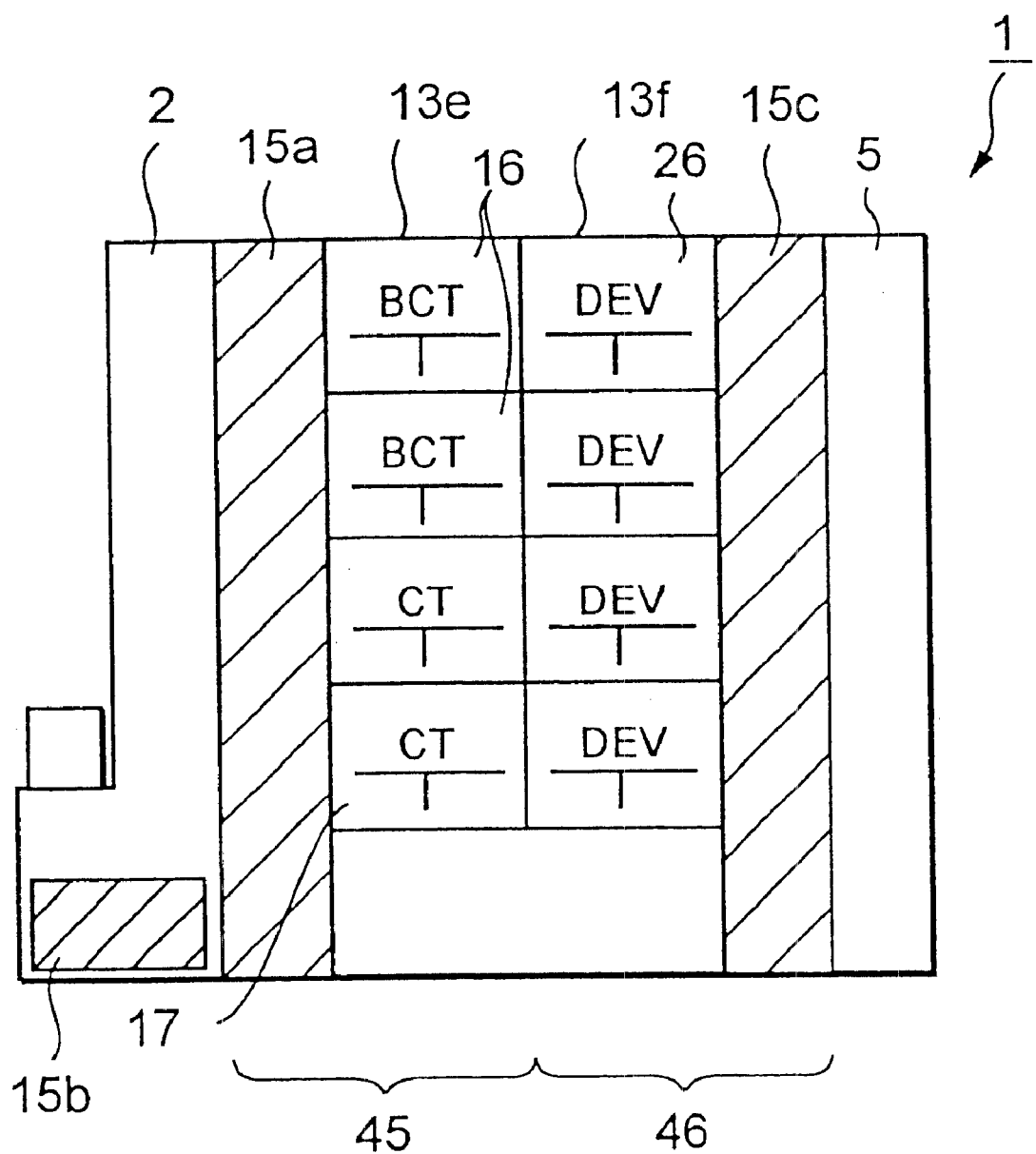
FIG. 13 is a front view of the coating and developing processing system shown in FIG. 12.
Figure 14:
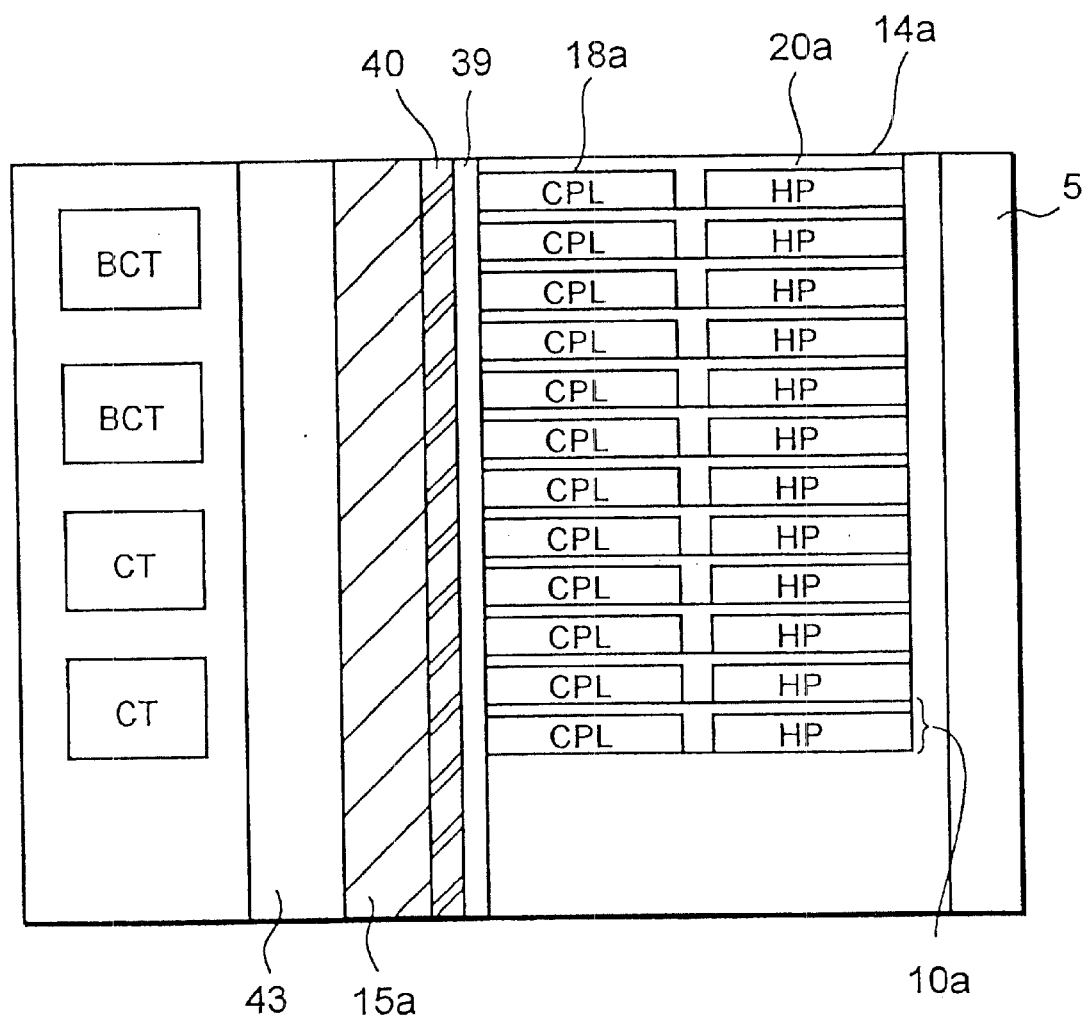
FIG. 14 is a sectional view when the system is sectioned along the B–B' line in FIG. 12.

Hereinafter, a third embodiment of the present invention will be explained with reference to FIG. 12 to FIG. 14. FIG. 12 to FIG. 14 are views showing a coating and developing processing system according to an embodiment of the present invention, FIG. 12 is a plan view, and FIG. 13 is a front view. FIG. 14 is a sectional view when the system is sectioned along the B–B' line in FIG. 12, a view showing the positional relation between a first processing unit group 13a and a second processing unit group 14a in an X-direction.

This embodiment is different in structure from the aforesaid first embodiment in the location of chemical towers each for housing a processing solution, in that the numbers of transfer devices and heat and cooling processing units are smaller, and in that anti-reflection film coating units (BCT) and resist film coating units (CT) are tiered, and the entire system is downsized, compared with those of the first and second embodiments.

Hereinafter, the description is made on the third embodiment, but part of the description about the same structure as that of the first embodiment is omitted. Incidentally, the same components as those in the first embodiment will be explained with the same numerals.

As shown in FIG. 12, the coating and developing processing system 1 has a structure in which a cassette station 2 which is the same as that in the first embodiment, a first processing station 45 in which various kinds of processing units each for performing predetermined processing for the wafers W one by one in coating and developing processing steps are multi-tiered, a second processing station 46 disposed adjacent to the first processing station, and an interface section 5 for delivering the wafer W to/from an aligner (illustration thereof is omitted) disposed adjacent to the second processing station 46 are integrally connected. In the first processing station 45, coating processing of anti-reflection film and resist film onto the wafer W is mainly performed, and developing processing of the resist film which has been exposed is performed in the second processing station 46. A transfer device 19 is disposed nearly at the central portion of the coating and developing processing system 1, and the transfer device 19 is used for the transfer of the wafer W under processing in the first processing station 45 and the second processing station 46.

The cassette station 2 has the same structure as that of the first embodiment and thus only different part will be explained. As shown in FIG. 13, a chemical tower 15b, in which a resist film material to be supplied as a processing solution to a resist film coating unit (CT) 17 described later is stored, is disposed at the bottom portion of the cassette station 2.

As shown in FIG. 12 and FIG. 13, in the first processing station 45, an anti-reflection film and resist film coating unit (CT) group 13e is provided on the front side as a first processing unit group in which solution processing is performed. The anti-reflection film and resist film coating unit (CT) group 13e is made up by anti-reflection film coating units (BCT) 16 and resist film coating units (CT) 17 each for performing coating processing for the wafer W at about room temperature being tiered two each in a Z-direction.

Further, a chemical tower 15a is disposed adjacent to the anti-reflection film and resist film coating unit (CT) group 13e. An anti-reflection film material to be supplied as a processing solution to the anti-reflection film coating unit (BCT) 16 is stored in the chemical tower 15a.

At the rear side of the first processing station 45, a first heat and cooling processing unit group 14a as a second processing unit group is disposed adjacent to the chemical tower 15a. The first heat and cooling processing unit group 14a is made up by first heat and cooling processing units 10a being multi-tiered in the Z-direction. Each first heat and cooling processing unit 10a is composed of a cooling processing unit (CPL) 18a for performing cooling processing for the wafer W and a heat processing unit (HP) 20a for performing heat processing being adjacent to each other to be integrated.

As shown in FIG. 14, the first heat and cooling processing unit group 14a is made up by the first heat and cooling processing units 10a being twelve-tiered. Incidentally, FIG. 14 is a sectional view when the system is sectioned along the B–B' line in FIG. 12, a view showing the positional relations between the first processing unit group 13a, the second processing unit group 14a, and the chemical tower 15a along the X-direction. As shown in FIG. 12 and FIG. 14, the first heat and cooling processing unit group 14a is made up by the first heat and cooling processing units 10a being twelve-tiered and is disposed adjacent to the chemical tower 15a. Further, the cooling processing units (CPL) 18a out of the heat processing units (HP) 20a and the cooling processing units (CP) 18a in all the first heat and cooling processing units 10a of the first heat and cooling processing unit group 14a are arranged to stand on the chemical tower 15a side. The anti-reflection film and resist film coating unit (CP) group 13e is disposed adjacent to the chemical tower 15a.

On the other hand, in the second processing station 46, as shown in FIG. 12 and FIG. 13, a developing processing unit group 13f is disposed on the front side as a first processing unit group for performing solution processing for the wafer W at about room temperature. The developing processing unit group 13f is made up by developing processing units (DEV) 26 being four-tiered in the Z-direction. Further, a chemical tower 15c is disposed adjacent to the developing processing unit group 13f. A developing solution to be supplied as a processing solution to the developing processing unit (DEV) 26 is stored in the chemical tower 15c.

At the rear side of the second processing station 46, a second heat and cooling processing unit group 14b is disposed adjacent to the chemical tower 15c. The second heat and cooling processing unit group 14b is made up by second heat and cooling processing units 10b being twelve-tiered in the Z-direction. Further, the cooling processing units (CPL) 18b out of the heat processing units (HP) 20b and the cooling processing units (CP) 18b in all the first heat and cooling processing units 10b of the second heat and cooling processing unit group 14b are arranged to stand on the chemical tower 15c side. The developing processing unit (DEV) group 13f is disposed adjacent to the chemical tower 15c.

The anti-reflection film and resist film coating unit (CT) group 13e, the developing processing unit group 13f, and the first and second heat and cooling processing unit groups 14a and 14b are arranged around the vertical transfer-type wafer transfer device 19. The transfer of the wafer W between the unit is conducted by the transfer device 19. The delivery of the wafer W between the first heat and cooling processing unit group 14a and the wafer transfer body 11, the delivery of the wafer W between the second heat and cooling processing unit 14b and the wafer transfer body 37, and the delivery of the wafer W between the first or second heat and cooling processing unit group 14a or 14b and the transfer device 19 are conducted via shutter members 47a and 47b provided on the both sides of the cooling unit 18a or 18b of the heat and cooling processing unit 10a or 10b of the first or second heat and cooling processing unit 14a or 14b.

The interface section 5 is the same in structure as that in the aforesaid first embodiment, and thus the description of individual components is omitted.

As shown in FIG. 12 and FIG. 13, in the coating and developing processing system 1, the chemical towers 15 (15a and 15c) are disposed between the first processing unit groups 13 (the anti-reflection film and resist film coating unit (CT) group 13e and the developing processing unit group 13f) and the second processing unit groups 14 (the first heat and cooling processing unit group 14a and the second heat and cooling processing unit group 14b), and further heat insulation walls 39 and passages 40 for circulating gas exhausted from the bottom portions of the first processing unit groups 13 to the upper portions thereof are arranged between the chemical towers 15 and the second processing unit groups 14. Also in this embodiment, a clean air supply section for supplying temperature-regulated clean air from the top to each first processing unit group is disposed at the top of the coating and developing processing system as in the aforesaid first embodiment. The clean air supply section includes an FFU (a fan and filter unit), a temperature regulator for regulating temperature and humidity, and the like, and supplies clean air, gas which flows thereinto through the passage 40 for circulating the gas exhausted from the bottom portion of the first processing unit group to the top portion thereof and is regulated in temperature and humidity, and particles and the like are eliminated therefrom, to the first processing unit group through a passage 43. Also in this embodiment, the provision of the insulation wall and the temperature regulating mechanism, in which the passage 40 for circulating the gas exhausted from the bottom portion of the first processing unit group 13 to the top portion thereof is disposed, makes it possible to perform more precisely temperature regulation in the processing solution supply unit (BCT, CT, DEV) for performing processing for the wafer W at about room temperature.

As shown in FIG. 13, in the aforesaid anti-reflection film and resist film coating unit (CT) group 13e, the anti-reflection film coating units (BCT) 16 each for applying an anti-reflection film to the wafer W while the wafer W is mounted on a spin chuck in a cup to thereby perform anti-reflection film coating processing for the wafer W are two-tiered, and the resist film coating units (CT) 17 each for applying a resist solution to the wafer W while the wafer W is mounted on a spin chuck in a cup to thereby perform resist coating processing for the wafer W are two-tiered. In the developing processing unit group 13f, the developing processing units (DEV) 26 each for supplying a developing solution onto the wafer W while the wafer W is mounted on a spin chuck in a cup to thereby perform developing processing for the wafer W are 42-tiered.

In each of the first and second heat and cooling processing unit groups 14a and 14b, the heat and cooling processing units (STL) 10, in each of which the heat processing unit (HP) 20 for performing heat processing for the wafer W and the cooling processing unit (CPL) 18 for performing cooling processing for the wafer W are adjacent to each other to be integrated, are twelve-tiered. Further, the shutter members 47a and 47b are provided on the sides of the cooling processing units of all the heat and cooling processing units 10. Incidentally, the structure of the heat and cooling processing unit 10 of this embodiment is the same as that of the first embodiment and thus the description thereof is omitted here.

The structure of the aforesaid transfer device 19 is the same as those of the aforesaid transfer devices 19*a* and 19*b* and thus the description thereof is omitted.

Next, processing steps in the coating and developing processing system 1 thus structured will be explained. Incidentally, operations in the heat and cooling processing unit are the same as those in the aforesaid first embodiment, and thus the description thereof is omitted.

In the coating and developing processing system 1, the unprocessed wafer W housed in the cassette C is taken out by the wafer transfer body 11 of the cassette station 2, and then transferred into the cooling processing unit (CPL) 18*a* of the first heat and cooling processing unit 10*a* of the first processing station 3 and mounted on a chill plate 25 to be subjected to cooling processing.

The wafer W which has undergone the cooling processing in the cooling processing unit (CPL) 18*a* is transferred into the anti-reflection film coating unit (BCT) 16 in the anti-reflection film and resist film coating unit (CT) group 13*e* by the transfer device 19 and coated with a processing solution for anti-reflection film.

The wafer W which has been coated with the processing solution for anti-reflection film in the anti-reflection film coating unit (BCT) 16 is transferred into the cooling processing unit (CPL) 18*a* in the first heat and cooling processing 10*a* by the transfer device 19 and mounted on the chill plate 25. The wafer W mounted on the chill plate 25 is transferred into the heat processing unit (HP) 20*a* and subjected to heat processing.

Thereafter, the wafer W is transferred into the cooling processing unit (CPL) 18*a* to be subjected to cooling processing.

The wafer W which has undergone the cooling processing in the cooling processing unit (CPL) 18*a* is transferred into the resist coating unit (CT) 17 in the anti-reflection film and resist film coating unit group 13*e* by the transfer device 19 to be coated with a resist solution.

The wafer W which has been coated with the resist solution in the resist coating unit (CT) 17 is transferred into the cooling processing unit (CPL) 18*b* of the second heat and cooling processing unit group 10*b* by the transfer device 19. The wafer W is further transferred into the heat processing unit (HP) 20*b* and subjected to heat processing.

Then, the wafer W is transferred into the cooling processing unit (CPL) 18*b* to be subjected to cooling processing. The wafer W which has undergone the cooling processing in the cooling processing unit (CPL) 18*b* is transferred to an edge aligner 34 by a wafer transfer body 37 in the interface section 5 to be subjected to edge exposure.

The wafer W which has undergone the edge exposure in the edge aligner 34 is transferred to a buffer cassette 33 by the wafer transfer body 37 and then temporarily held or transferred to the aligner (not shown) via the wafer transfer body 37, a pre-exposure cooling unit (not shown), and a wafer transfer body.

Then, the wafer W which has undergone the exposure processing by means of the aligner is transferred from the interface section 5 to the cooling processing unit (CPL) 18*b* of the second heat and cooling processing unit group 10*b* in the second heat and cooling processing unit group 14*b* in the second processing station 46 via the wafer transfer body, the buffer cassette 33, and the wafer transfer body 37 and subjected to cooling processing.

The wafer W which has undergone the cooling processing in the cooling processing unit (CPL) 18*b* is transferred to the developing processing unit (DEV) 26 in the developing processing unit group 13*f* by the transfer device 19 and subjected to developing processing.

The wafer W which has undergone the developing processing in the developing processing unit (DEV) 26 is transferred into the heat processing unit (HP) 20*a* adjacent to the cooling processing unit (CPL) 18*a* via the cooling processing unit (CPL) 18*a* of the heat and cooling processing unit 10*a* in the first heat and cooling processing unit group 14*a* by the transfer device 19 and subjected to heat processing.

The wafer W which has undergone the heat processing in the heat processing unit (HP) 20*a* is transferred to the cooling processing unit 18*a* and further housed in the cassette C by the wafer transfer body 11 in the cassette station 2.

In the coating and developing processing system according to this embodiment structured as above, the chemical towers as the processing solution supply sections are disposed adjacent to the solution processing units (BCT, CT, DEV), the heat and cooling processing units are disposed adjacent to the chemical towers, and the cooling processing units (CPL) of the heat and cooling processing units are disposed on the chemical tower side, thereby bringing about a structure in which the cooling processing units and the chemical towers are interposed between the heat and cooling processing units and the solution processing units. This substantially suppresses heat influence from the heat processing unit to the solution unit side. Consequently, temperature regulation in the solution processing unit (BCT, CT, DEV) for performing solution processing for the wafer W can be precisely performed in the coating and developing processing system.

Further, in the coating and developing processing system according to this embodiment, the heat insulation walls 39 and the passages 40 for circulating the gas exhausted from the respective bottom portions of the solution processing unit groups 13*e* and 13*f* to the top portions thereof are arranged between the solution processing unit groups (the anti-reflection film and resist film coating unit (CT) group 13*e* and the developing processing unit group 13*f*) and the heat and cooling processing unit groups (the first and the second heat and cooling processing unit groups 14*a*, 14*b*). This prevents heat influence of the heat processing unit of the heat and cooling processing unit to the solution processing unit group, so that temperature regulation in the solution processing unit group for performing solution processing for the wafer W at about room temperature can be very precisely performed. Furthermore, the passage 40 includes a kind heat insulating means, resulting in the structure including double heat insulating means by the heat insulation wall 39 and the passage 40 being provided between the second processing unit group 14 and the chemical tower 15. Therefore, the processing solution stored in the chemical tower is not susceptible to heat influence by the heat and cooling processing unit 20, facilitating temperature regulation of the processing solution.

It should be noted that the description is presented taking a wafer W as an example of a substrate in the aforesaid embodiments, but the present invention is applicable to another substrate such as an LCD substrate or the like.

The system configuration of the present invention is not limited to the aforesaid embodiments, and various configurations are conceivable within the technical meaning of the present invention.

The present invention can be applied not only to a resist coating and developing processing system but also to another system, for example, an SOD (Spin on Dielectric) processing system for forming a layer insulating film on a substrate, or the like. The SOD processing system includes a coating unit for applying a layer insulating film material onto a substrate and a heat and cooling processing unit for heating and cooling the wafer W coated with the insulating film material. This heat and cooling processing unit includes a heat processing unit and a cooling processing unit provided adjacent to the heat processing unit as in the heat and cooling processing unit of this embodiment, and the heat processing unit in the SOD processing system has a hot plate of which the set temperature can be brought to 200° C. to 470° C. It is very effective to arrange a coating unit and the heat and cooling processing unit such that the cooling processing unit is disposed on the coating unit side as in the present invention in such a system including a unit in which such high-temperature processing is performed and the coating unit as a solution processing unit. Alternatively, it is very effective to dispose the processing solution housing section for housing a solution to be supplied to the coating unit disposed adjacent to the solution processing unit at a position adjacent to the heat and cooling processing unit and further dispose the cooling processing unit at a position on the processing solution housing section side. This makes it possible to perform temperature regulation very precisely in the solution processing unit group.

Figure 15:
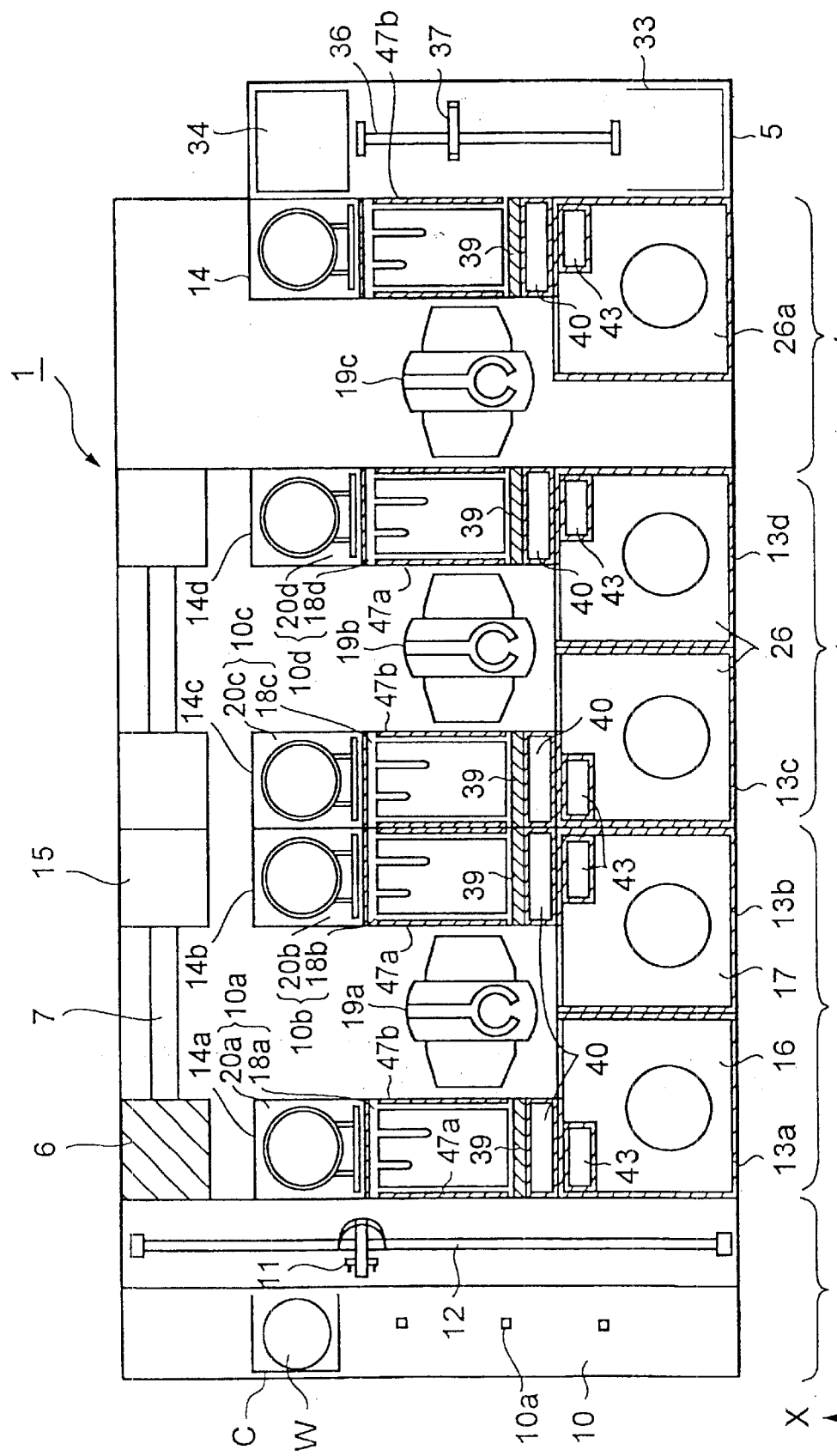
FIG. 15 is a plan view showing a coating and developing processing system according to a still another embodiment of the present invention.

Furthermore, the system configuration is not limited to the system shown in FIG. 1 to FIG. 4, but it is suitable to add a half block 4a composed of one transfer device 19c, one developing processing unit as a solution processing unit 26a, and one heat and cooling processing unit group 14 to the system in FIG. 1 as shown in FIG. 15 by way of example. The addition of the half block as above makes it possible to adjust a footprint more finely, resulting in an optimized footprint.

Next, another embodiment of the present invention will be explained.

Figure 16:
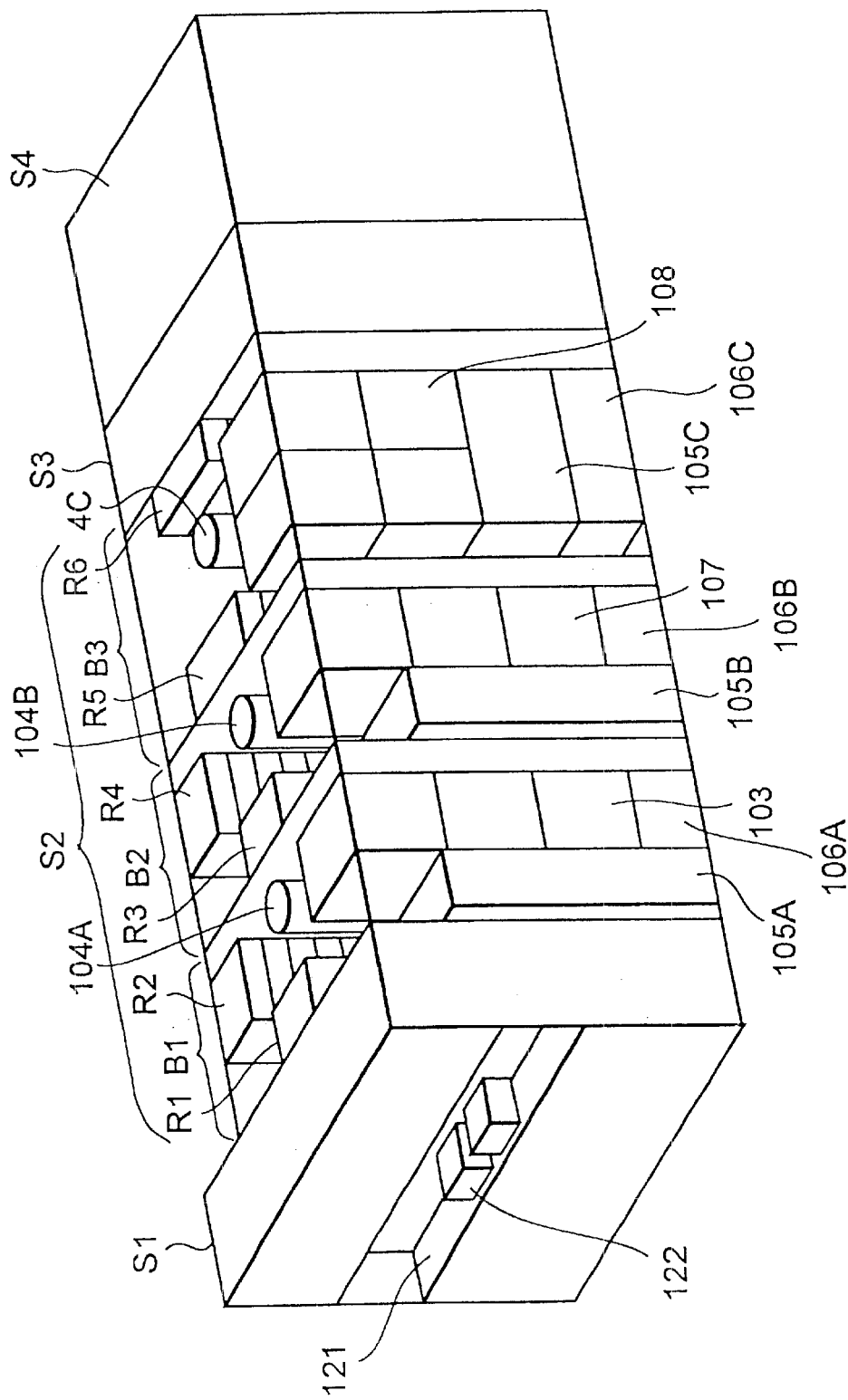
FIG. 16 is a perspective view showing an appearance of the coating and developing apparatus that is an embodiment of the present invention.
Figure 17:
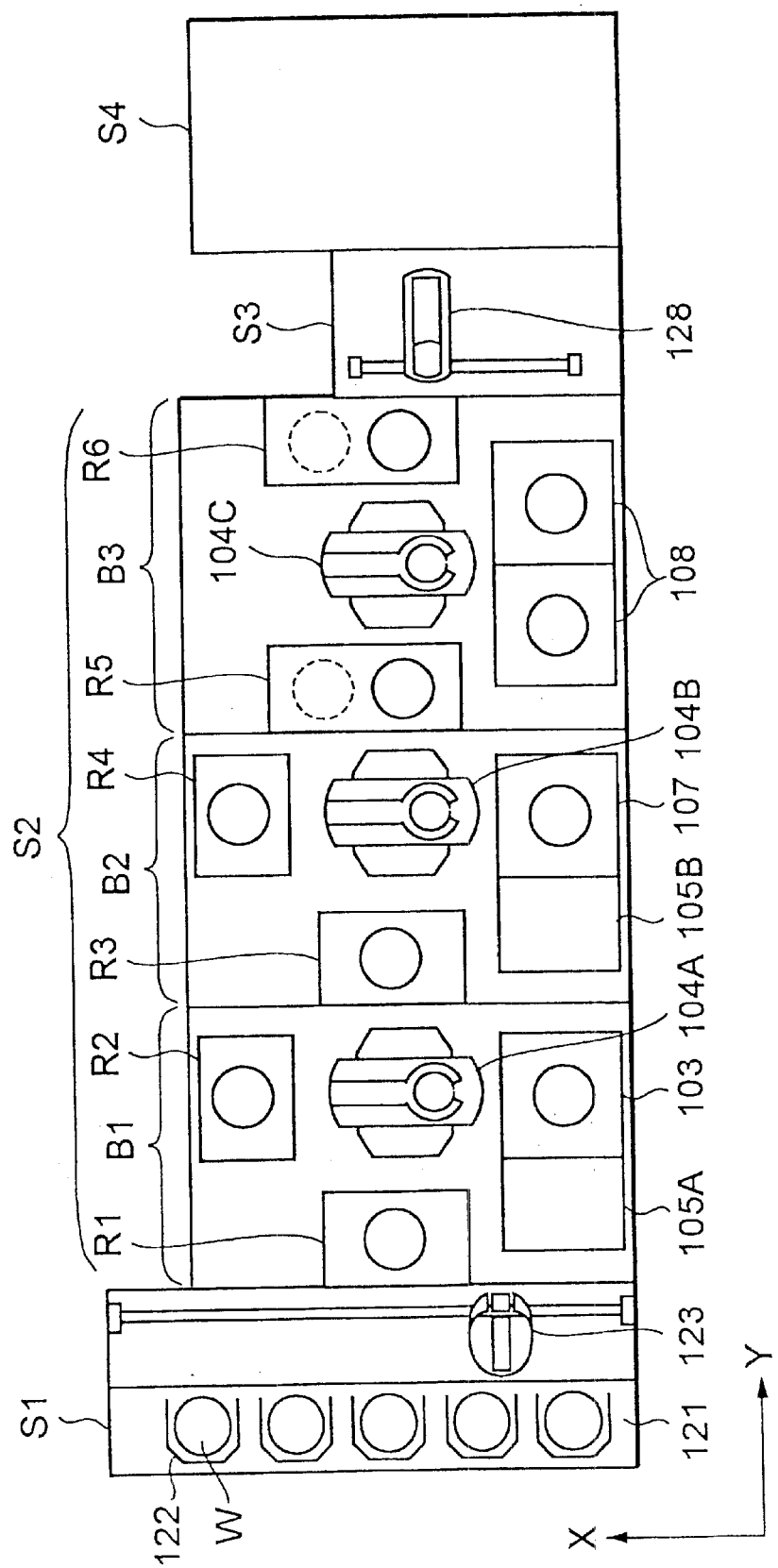
FIG. 17 is a schematic plan view showing the coating and developing apparatus in FIG. 16.

This embodiment employs the substrate processing apparatus of the present invention to a coating and developing apparatus for a substrate. FIG. 16 is an external view showing the inside of this embodiment by through-viewing it, and FIG. 17 is a schematic plan view thereof. In the drawings, S1 denotes a cassette station, S2 denotes a processing station for performing resist coating processing and developing processing for the wafer W, S3 denotes an interface station, and S4 denotes an exposure station.

The cassette station S1 includes a cassette stage 121 forming a mounting section for mounting, for example, five wafer cassettes (hereinafter, referred to as "cassette") 122 forming substrate cassettes for housing a plurality of substrates, for example, 25 wafers W arranged in an X-direction, and a delivery arm 123 forming delivery means for delivering the wafer W between the cassette 122 on the cassette stage 121 and a delivery section described later of the processing station S2. The delivery arm 123 is configured to be ascendable and descendable, movable in the X- and Y-direction, and rotatable around a vertical axis.

The processing station S2 is formed by three blocks B1, B2, and B3 being arranged toward the back side as viewed from the cassette station S1 to the exposure station S4. The blocks B1, B2, and B3, and the interface station S3 each are enclosed in casings. Partition is made between the blocks B1, B2, and B3, between the block B1 and the cassette station S1, and between the block B3 and the interface station S3, whereby respective atmospheres are separated. It should be noted that downflows of clean air are formed in the cassette station S1 and the blocks B1, B2, and B3.

The block B1 includes a shelf unit R1 provided along the rear face of the cassette station S1, a shelf unit R2 and anti-reflection film forming units 103 as solution processing units which are provided on the left side and the right side respectively as viewed from the cassette station S1 to the back side, a main arm 104A which is substrate transfer means for transferring the wafer W between the shelf units R1 and R2, the anti-reflection film forming units 103, and a delivery section of the adjacent block B2, and a chemical unit 105A which is a container housing section described later.

Figure 18:
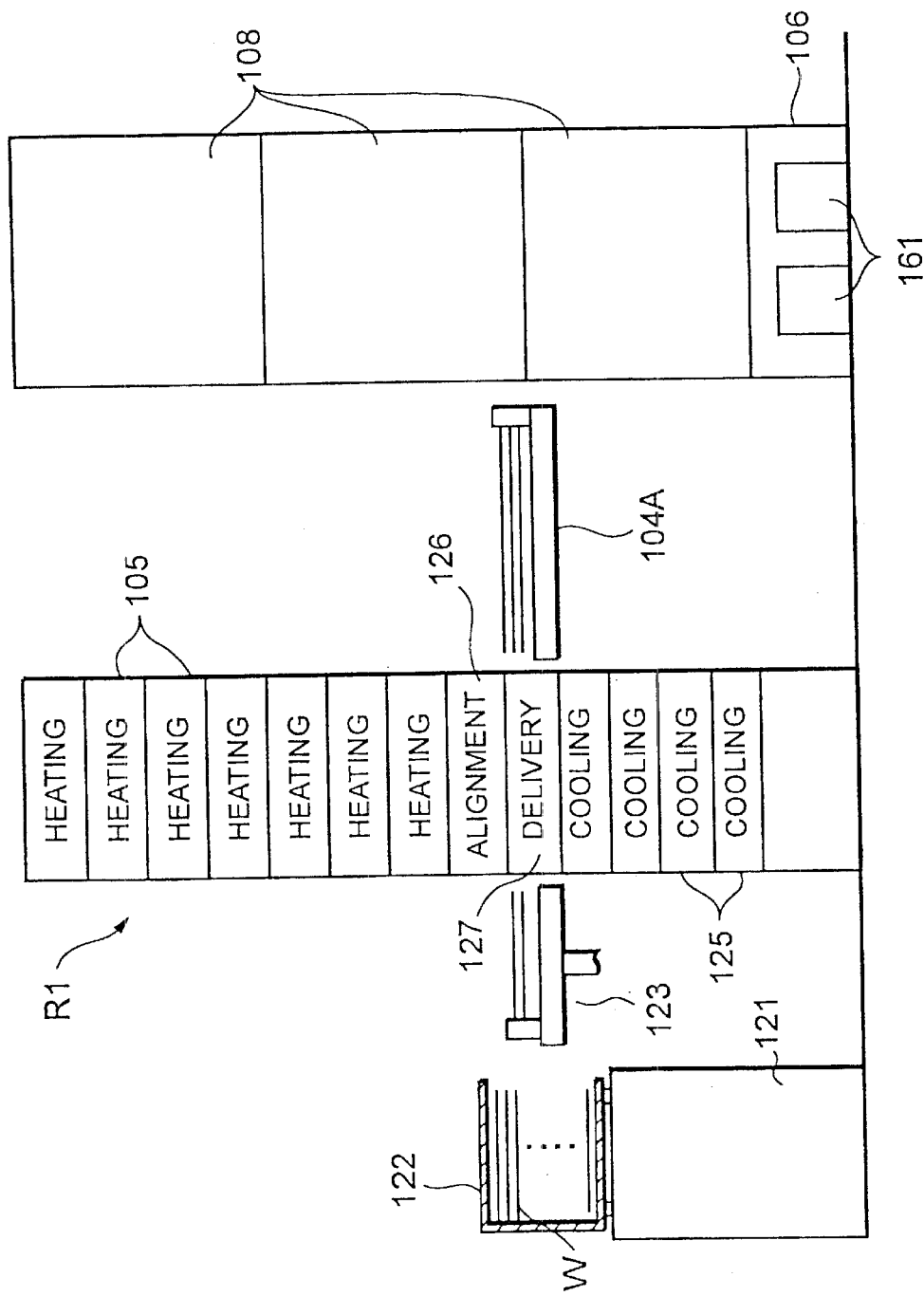
FIG. 18 is an explanatory view of part of the coating and developing apparatus in FIG. 16 by laterally expanding.

FIG. 18 is an explanatory view of part of the cassette station S1 and the block B1 by laterally expanding as viewed from a side face thereof. In the shelf unit R1, heating sections 124 for heating the wafer W and cooling sections 125 for cooling the wafer W are stacked on top of the other, and further an alignment section 126 for aligning the wafer W, and a delivery section 127 including a stage, for delivering the wafer W between the delivery arm 123 and the main arm 104A are allocated at part of the shelf unit as shown in FIG. 18. It should be noted that the heating sections 124 and the cooling sections 125 may be allocated at different shelf units from each other.

Figure 19:
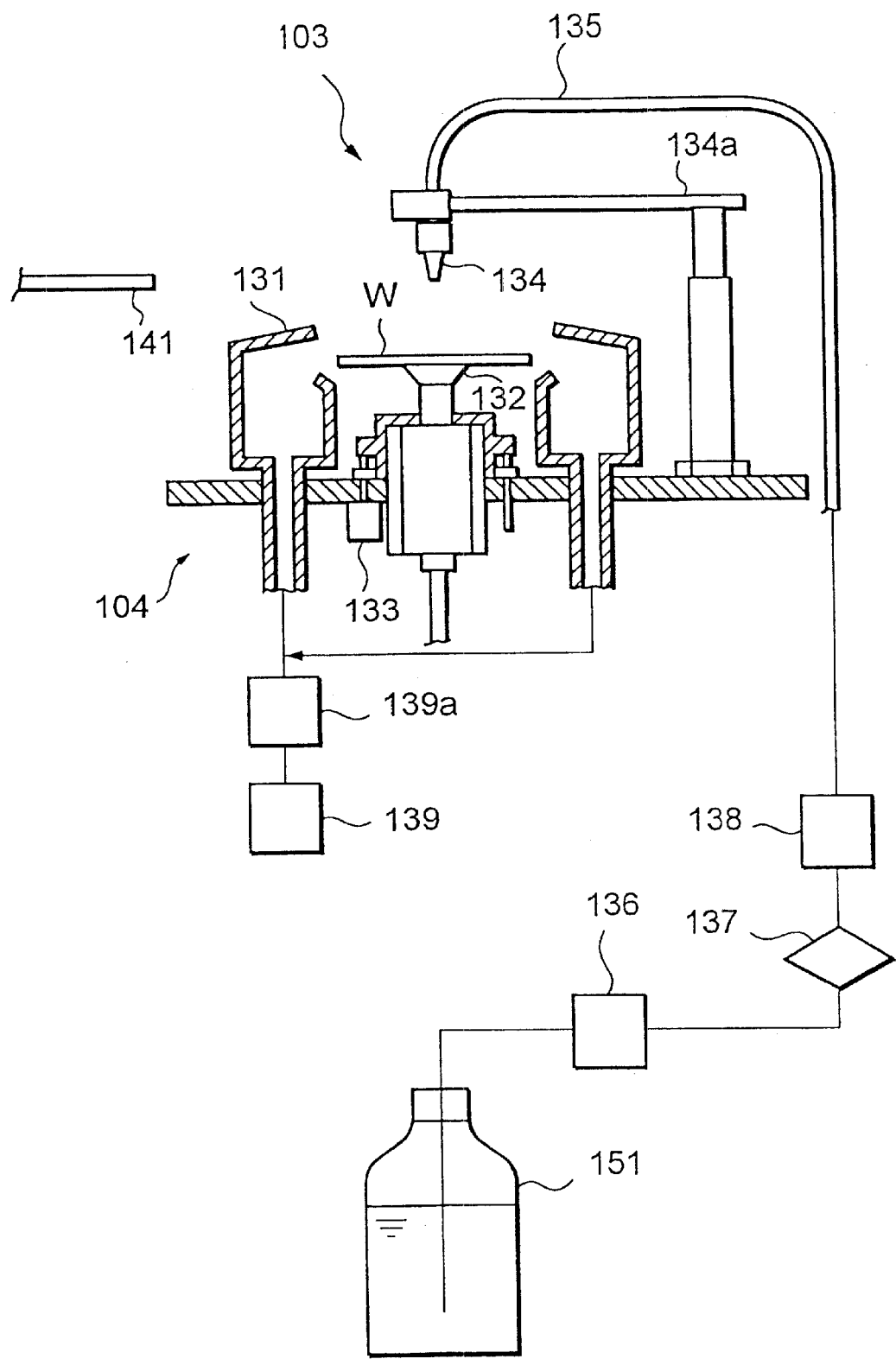
FIG. 19 is an explanatory view showing a solution processing unit and a supply system of a processing solution used for the coating and developing apparatus in FIG. 16.

Explaining the anti-reflection film forming unit 103 with reference to FIG. 19 by way of example, numeral 131 denotes a cup, in which a rotatable spin chuck 132 with a vacuum-suction function is provided. The spin chuck 132 is ascendable and descendable by means of a raising and lowering mechanism 133, and when the spin chuck 132 is positioned above the cup 131, the wafer W is delivered to/from an arm 141 described later of the transfer means 104A. Numeral 134 denotes a discharge nozzle, numeral 135 denotes a processing solution supply pipe, and numeral 134a denotes a support arm for horizontally moving the nozzle. The processing solution supply pipe 135, with the upstream end thereof being inserted into a container 151 storing a processing solution, sucks the processing solution stored in the container 151 by a pump 136 and allows it to be filtered at a filter 137, and discharges the processing solution from which particles and the like are eliminated through a suck valve 138 and the nozzle 134. The processing solution discharged from the nozzle 134 is dripped onto the wafer W rotated by the spin chuck 132 and extended to form an anti-reflection film. Further, the inside of the cup 131 is sucked by an exhaust pump 139 via a gas-liquid separator 139a.

Figure 20:
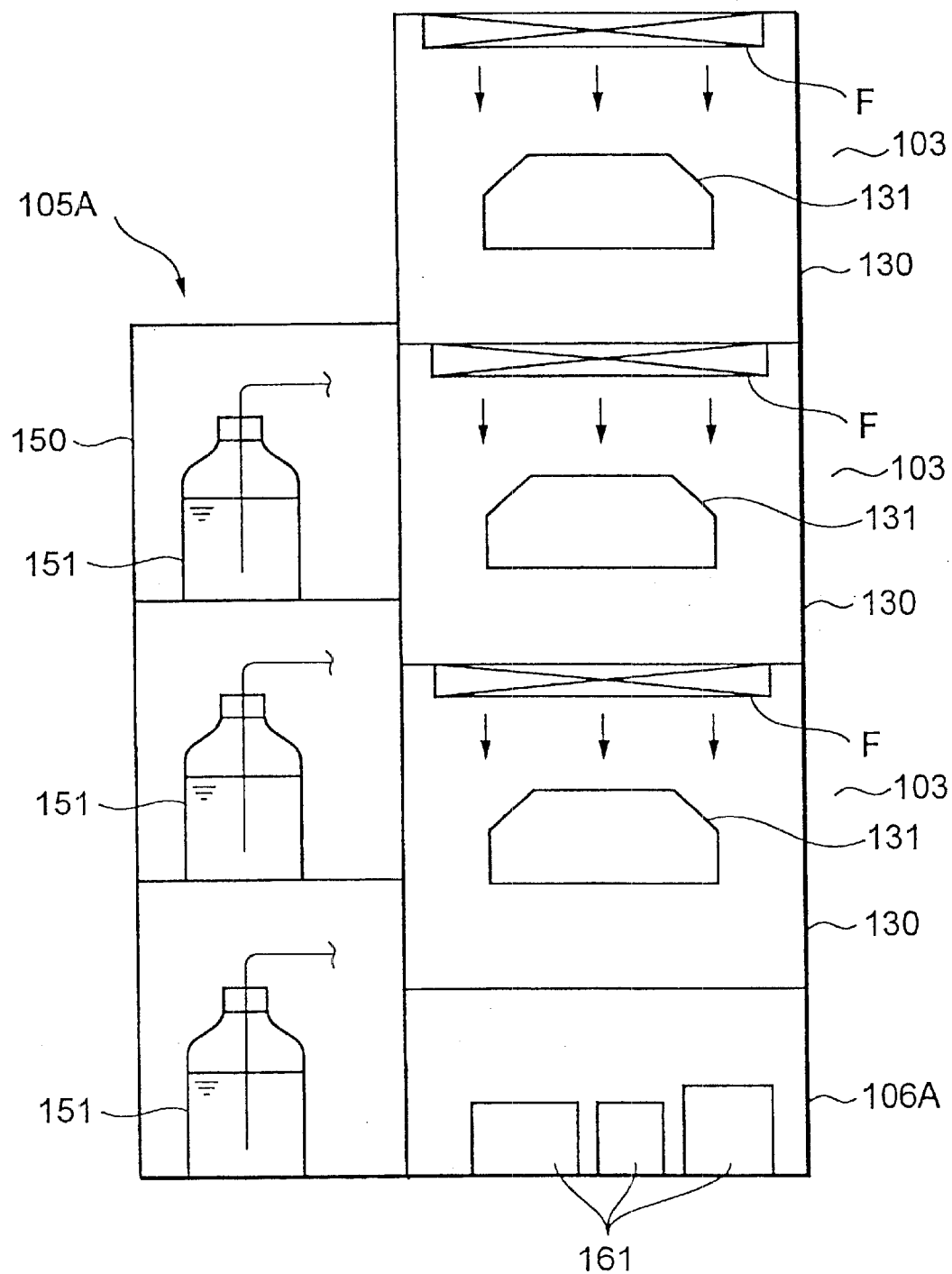
FIG. 20 is a side view schematically showing a solution processing unit and its related region of the coating and developing apparatus in FIG. 16.

FIG. 20 is a view of a layout of the anti-reflection film forming units 103 and chemical units 105A as viewed from a side, and the anti-reflection film forming units 103 are three-tiered by way of example. In each unit 103, the already described cup 131 and nozzle 134a are covered by a casing 130, and a filter unit F is provided on the top of the casing 130, so that downflows from the filter unit F of clean air which is regulated in temperature and humidity are formed and separated by the casing 130 from an outside atmosphere.

The chemical unit 105A is provided on the cassette station S1 side adjacent to the anti-reflection film forming units 103 in three tiers, and the entire chemical unit 105A is enclosed in a casing 150 and houses containers 151 arranged in three tiers which store processing solutions used for three-tiered anti-reflection film forming units 103 respectively. Further, processing solution supply control devices such as the pumps 136, the filters 137, the suck valves 138, and the like are housed in the chemical unit 105A. Incidentally, the drawing is illustrated with the container 151 as a representative.

Below the lowermost anti-reflection film forming unit 103, power devices 161 used for the anti-reflection film forming units 103 respectively are arranged together in a casing 160, forming a power unit 106A. The power device 161 represents, for example, the exhaust pump 139 for exhausting air in the cup 31, a vacuum pump as a vacuum source for the spin chuck 132, an air source used for an air cylinder forming the raising and lowering section 133, a power source of the motor for rotating the spin chuck 132, and the like. If the processing solution is discharged by a pressurized gas being supplied into the container, a supply source of the pressurized gas, for example, a nitrogen cylinder is also included in the power device 161. The aforesaid main arm 104A is the same as that shown in FIG. 5.

The block B1 is configured as above, the block B2 adjoining to the block B1 is configured in the same manner. In contrast to the block B1 which forms an anti-reflection film on the surface of the wafer W, the block B2 forms a resist film on the anti-reflection film of the wafer W, and thus coating units 107 as solution processing units each for applying a resist solution are arranged therein in place of the anti-reflection film forming units 103. Both the units 103 and 107 are the same in structure, and a resist solution is used as a processing solution. Numerals R3 and R4 represent shelf units, numeral 104B denotes a main arm, numeral 105B denotes a chemical unit, and numeral 106B denotes a power system unit.

The block B3 adjoining to the block B2 develops the wafer which has been exposed in the exposure station S4. Developing units 108 as solution processing units are provided two each at upper and lower tiers on a line of the extension of the aforesaid anti-reflection film forming units 103 and coating units 107, four in total. The configuration of the developing unit 108 is nearly the same as that of anti-reflection film forming unit 103 but has a difference in a point of using a nozzle in which many supply ports are arranged in a diameter direction of the wafer W. A chemical unit 105C is disposed below the developing unit 108, and a power system unit 106C is disposed below the chemical unit 105C.

Shelf units R5 and R6 are provided close to the block B2 and the interface section S3 respectively, and each has nearly the same structure as those of the shelf units R1 and R2 but includes a heat-cooling section in which a hot plate and a chill plate are placed on a plane and a transfer arm for transferring the wafer W only therebetween. The reason why the heat-cooling section is provided is based on the necessity of highly precise management for a period of time of heating which is performed after exposure when a chemically amplified resist is used.

The interface section S4 connected to the back of the blocks B include a delivery arm 128 which is movable in X-, Y-, and X-directions and rotatable around a vertical axis, and the delivery arm 128 delivers the wafer W between the block B3 and the exposure station S4.

Next, operations of the above-described embodiment will be explained. When the cassette 122 housing, for example, 25 wafers W is carried into the cassette stage 121 from the outside, the wafer W is taken out of the cassette 121 by the delivery arm 213 and mounted on the delivery section 127 in the shelf unit of the block B1 to be delivered to the main arm 104A. The wafer W is first provided with an anti-reflection film in the block B1, then a resist film, for example, of a chemically amplified type being formed on the anti-reflection film in the block B2, and thereafter exposed in the exposure station S4. In the block B1, the wafer W on which the anti-reflection film has been formed is heated in the heating section 124 of the shelf unit R1 (R2) and then cooled in the cooling section 125. In the block B2, the wafer W on which the resist film has been formed is also heated and cooled in the shelf unit R3 (R4). The transfer of the wafer W between the blocks B1, B2, and B3, and the interface station S3 is conducted via the delivery sections in the shelf units R3, R5, and R6.

The exposed wafer W is heated and cooled in the heat-cooling section in the shelf unit R5 (R6) and developed in the developing unit 108. The wafer W after the developing is heated and cooled in the shelf unit R5 (R6) to thereby complete a series of resist pattern forming steps and returned to the original cassette 121 via the blocks B2 and B1.

In the above-described embodiment, the chemical unit 105A (105B) is provided adjacent to the anti-reflection film forming unit 103 (the coating unit 107), thereby reducing the length of the pipe for the processing solution. Accordingly, the amount of stay of costly processing solution is small, and the staying processing solution is drained at the time of maintenance or the like, resulting in a reduction in cost. Since the chemical unit 105A (105B) and the anti-reflection film forming unit 103 (the coating unit 107) are close to each other, there is a small loss of the processing solution by pressure even if the supply control devices such as a pump 136 for quantitatively sending the processing solution and a suck valve 138 for sucking slightly the processing solution to thereby draw up the solution surface in the nozzle 134 in order to prevent the solution from running from the nozzle 134 after the discharge of the processing solution are provided in the chemical unit 105A (105B), so that the control for supply of the processing solution can be precisely conducted. More than that, the supply control devices are provided in the chemical unit 105A (105B), thereby facilitating maintenance. In the case in which the aforesaid units 103 and 107 are stacked on top of each other in a plurality of tiers, for instance, the containers 151 and supply control devices are arranged at the height suitable for the units 103 and 107, thereby further reducing the length of the pipes of the processing solutions, which is advantageous.

Also in the developing unit 108, the container for the developing solution and the supply control devices are arranged below the lowermost developing unit 108, resulting in a short pipe for the developing solution and facilitating maintenance. Moreover, the already described power devices 161 are arranged below the solution units 103, 107, and 108 such as the anti-reflection film forming unit and the like, which only needs short routed power lines such as an exhaust pipe, a vacuum sucking tube, an air supply pipe, a pressurized gas supply pipe, and the like. The power devices 161 and the power lines are installed in each block B1 (B2, B3), bringing about an advantage of good workability that, for example, adjustment can be performed before the connection of the block B1 (B2, B3).

Figure 21:
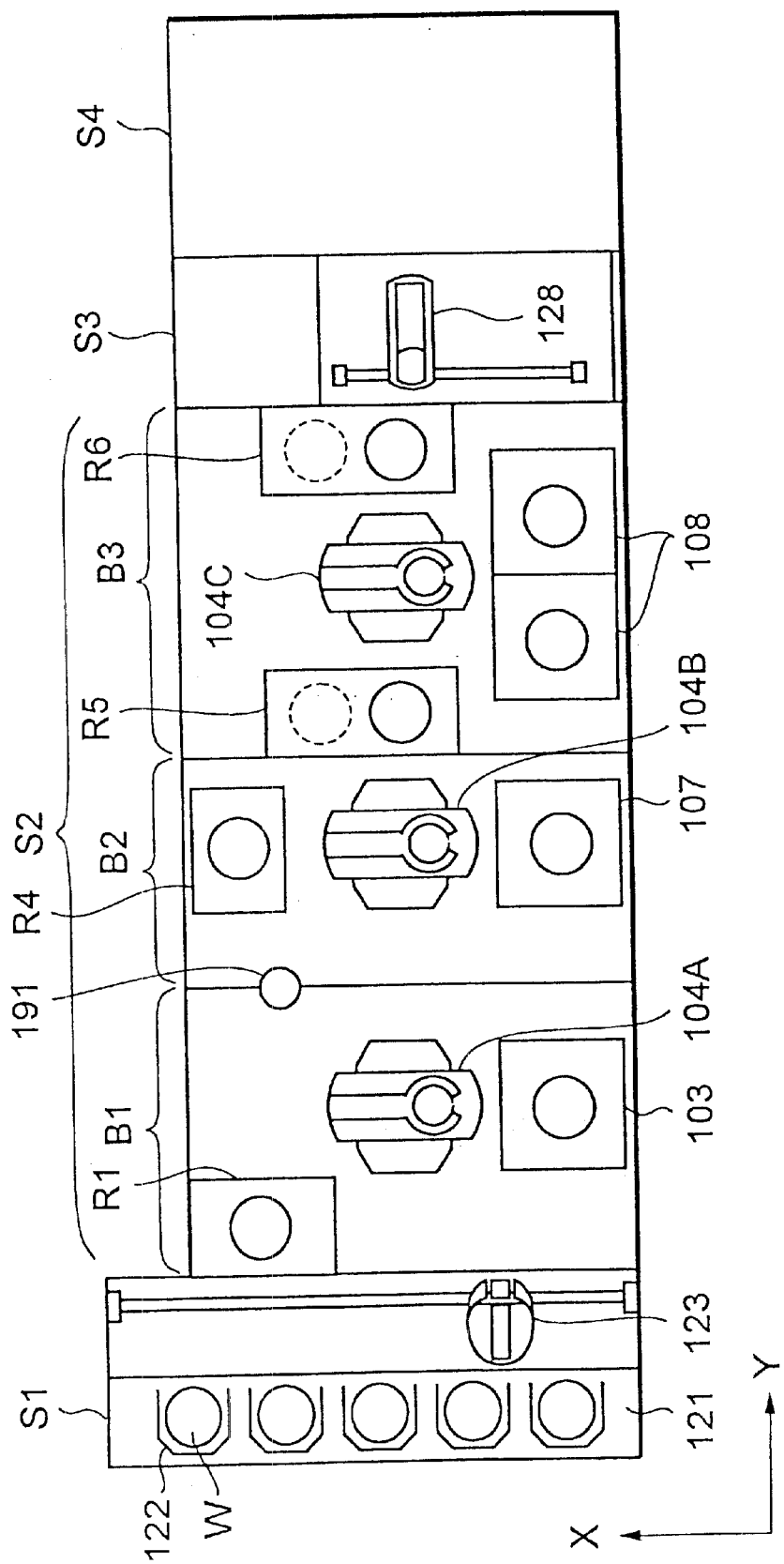
FIG. 21 is a schematic plan view showing a coating and developing apparatus that is another embodiment of the present invention.
Figure 22:
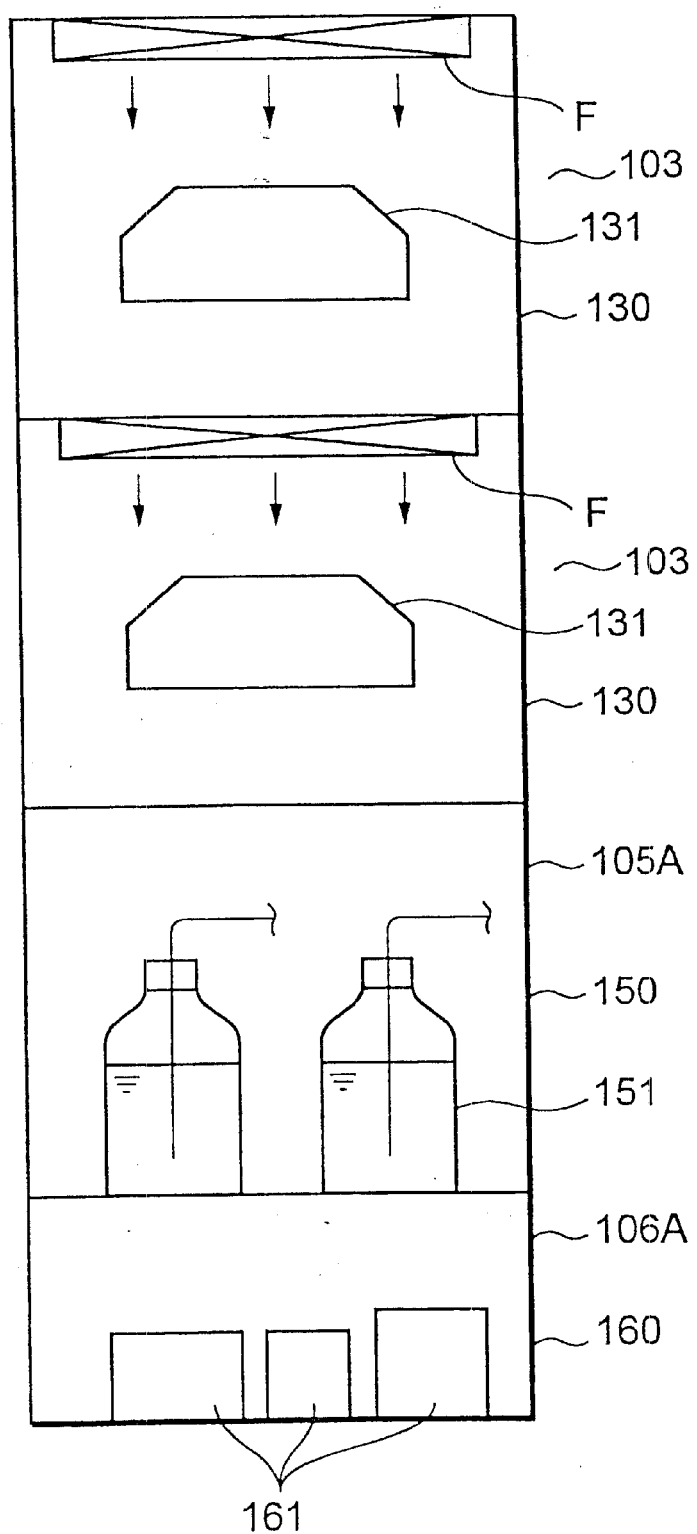
FIG. 22 is a side view schematically showing a solution processing unit and its related region of the coating and developing apparatus in FIG. 21.

FIG. 21 and FIG. 22 show another embodiment of the present invention, in which anti-reflection film forming units 103 and coating units 107 are two-tiered respectively, a chemical unit 105A (105B) is disposed below the anti-reflection film forming units 103 (the coating units 107), and a power system unit 106A (106B) is disposed below the chemical unit 105A (105B) in this embodiment. Incidentally, the arrangement of the anti-reflection film forming units 103 is representatively shown in FIG. 22. In the blocks B2 and B3, one shelf unit (R1, R4) is provided each, and the wafer W is delivered between the blocks B2 and B3 by means of an intermediate stage 191 provided at a position to which main arms 104A and 104B can get access.

Figure 23:
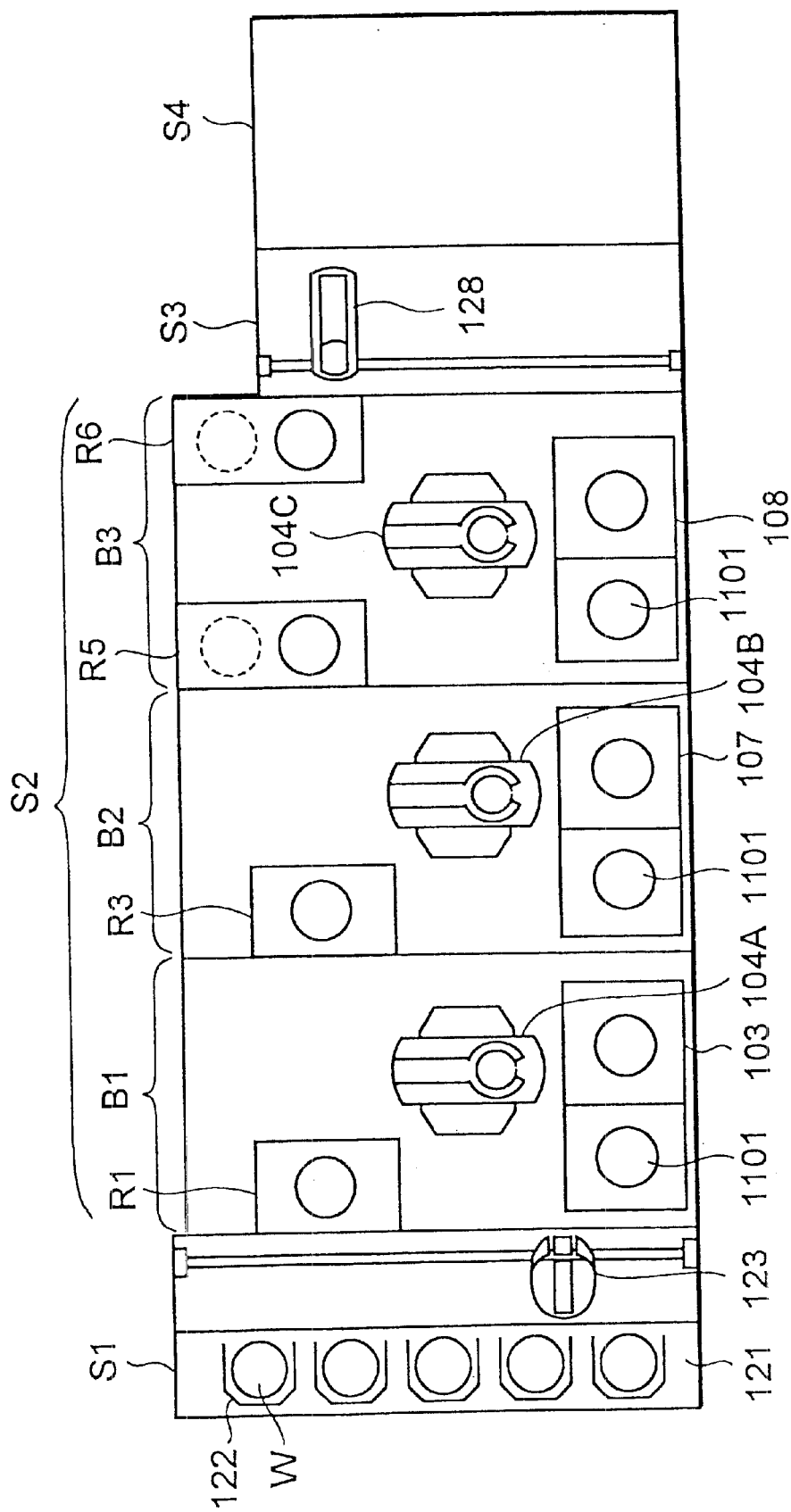
FIG. 23 is a schematic plan view showing a coating and developing apparatus that is still another embodiment of the present invention.
Figure 24:
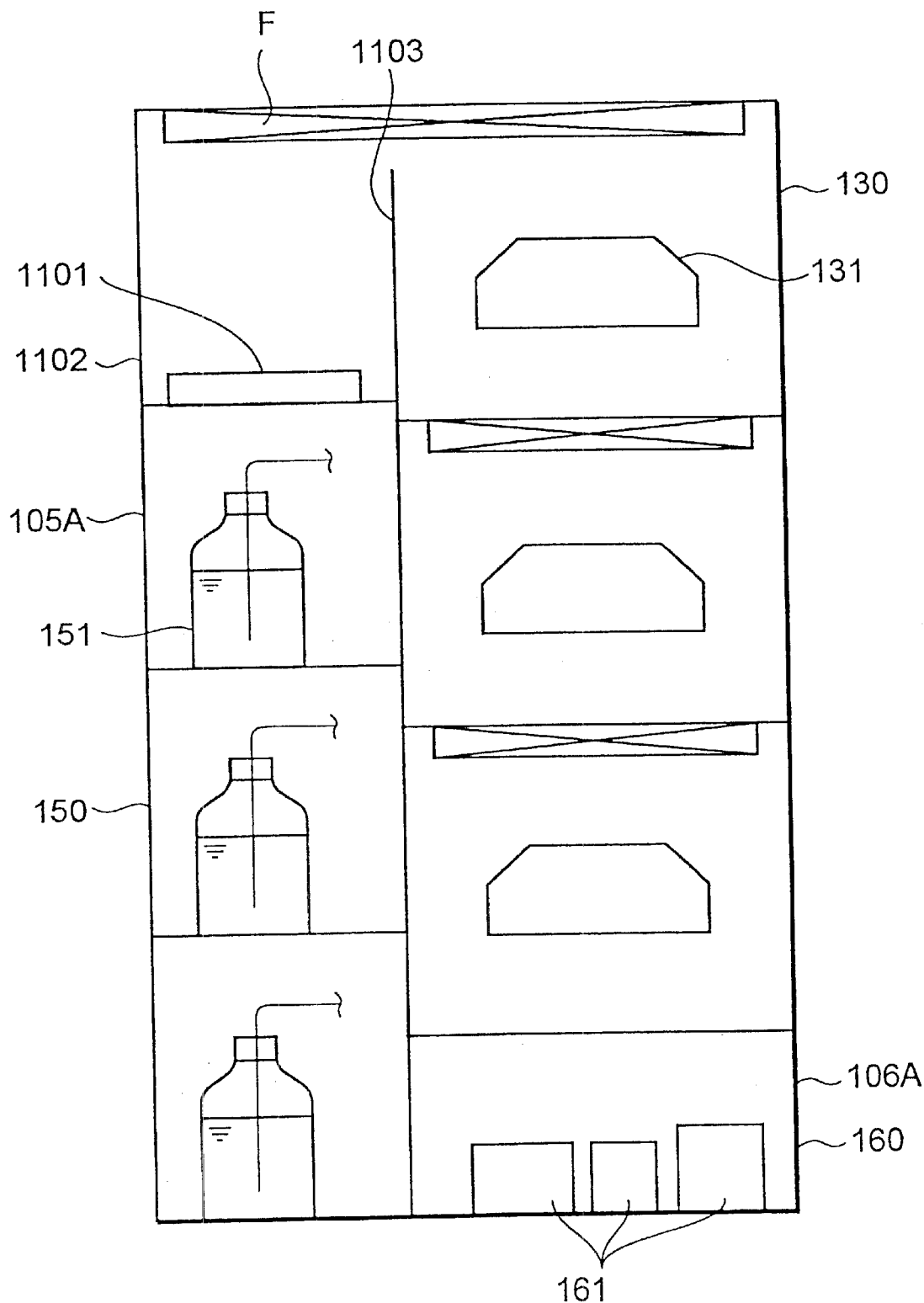
FIG. 24 is a side view schematically showing a solution processing unit and its related region of the coating and developing apparatus in FIG. 23.
Figure 25:
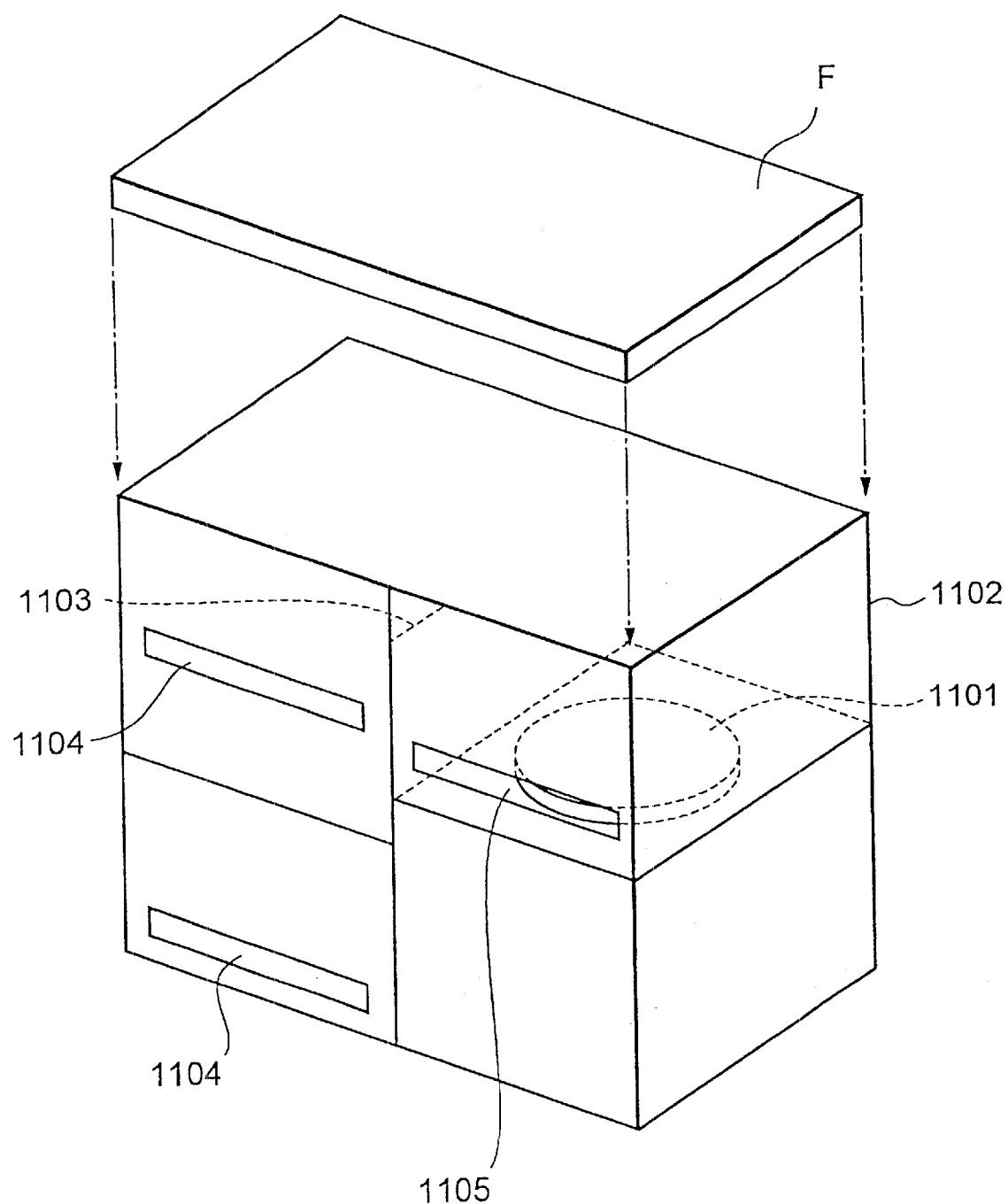
FIG. 25 is an external perspective view showing the structure in which a cooling section is disposed in an atmosphere in the solution processing unit in the embodiment in FIG. 23.

FIG. 23 to FIG. 25 show still another embodiment of the present invention. A layout of anti-reflection film forming units 103 (coating units 107), a chemical unit 105A (105B), and a power system unit 106A (106B) in this embodiment is the same as that of the embodiment shown in FIG. 16 and the like. However, a cooling section 1101 is provided on the chemical unit 105A (105B) divided from a transfer area (a transfer atmosphere) of a main arm 104A so as to be placed in the same atmosphere as cups 131 of the anti-reflection film forming units 103 (the coating units 107) are placed. For example, the atmosphere in which the cooling section 1101 is placed is enclosed in a casing 1102 and a partition plate 1103 which is part of a casing 130 is caused to stand between the atmosphere and an atmosphere in the anti-reflection film forming units 103, and common clean air for forming atmosphere, common clean air which is regulated in temperature and humidity, is caused to flow downward from a filter F at a ceiling of both atmospheres.

The reason of this configuration is as follows. The thickness of the anti-reflection film or the resist film is influenced by the temperature of the wafer W, and thus the wafer W is heated in a heating section 124 of a shelf unit R1 (R3) and thereafter subjected to so-called rough removal of heat in a cooling section 125 (adjusted to rough temperature to be cooled), and then cooled in the aforesaid cooling section 1101, whereby the temperature of the wafer W becomes the same as that of the anti-reflection film forming unit 103 (the coating unit 107) since the cooling section 1101 is in the same atmosphere as the anti-reflection film forming unit 103 (the coating unit 107), resulting in improved precision in film thickness. In this case, the transfer of the wafer W from the cooling section 1101 may use the main arm 104A (104B), but it is more preferable to provide exclusive transfer means for linking between the cooling section 1101 and the anti-reflection film forming unit 103 because the wafer W after cooling does not pass through the transfer area of the main arm 104A (104B).

The cooling section 1101 may be provided below the chemical unit 105A (105B). It should be noted that numerals 1104 and 1105 in FIG. 25 denote transfer ports formed at the anti-reflection film forming units 103 (the coating units 107) and the casing 1102 respectively. Also developing units 108 are three-tiered as in the anti-reflection film forming units 103, and a chemical unit 105C, a power system unit 106C, a cooling section 1101 (the same numeral is used for convenience) have the same configurations as those shown in FIG. 24 and FIG. 25.

Figure 26:
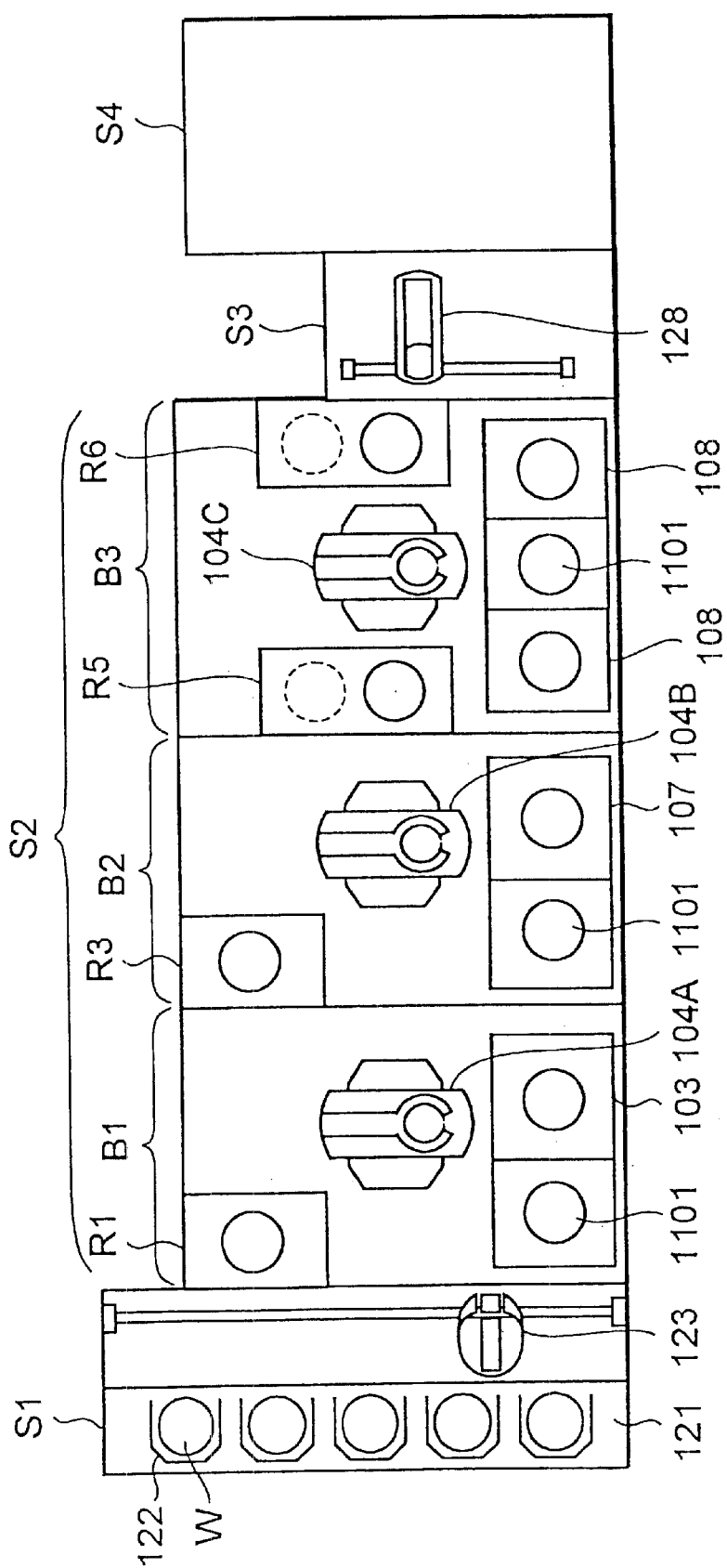
FIG. 26 is a schematic plan view showing a coating and developing apparatus that is yet another embodiment of the present invention.

FIG. 26 shows a modification of the embodiment shown in FIG. 23, which is different from the configuration shown in FIG. 23 in that two three-tiered developing units 108 are provided and the chemical unit and the cooling section 1101 are provided therebetween, and in the arrangement of the shelf units R5 and R6.

Figure 27:
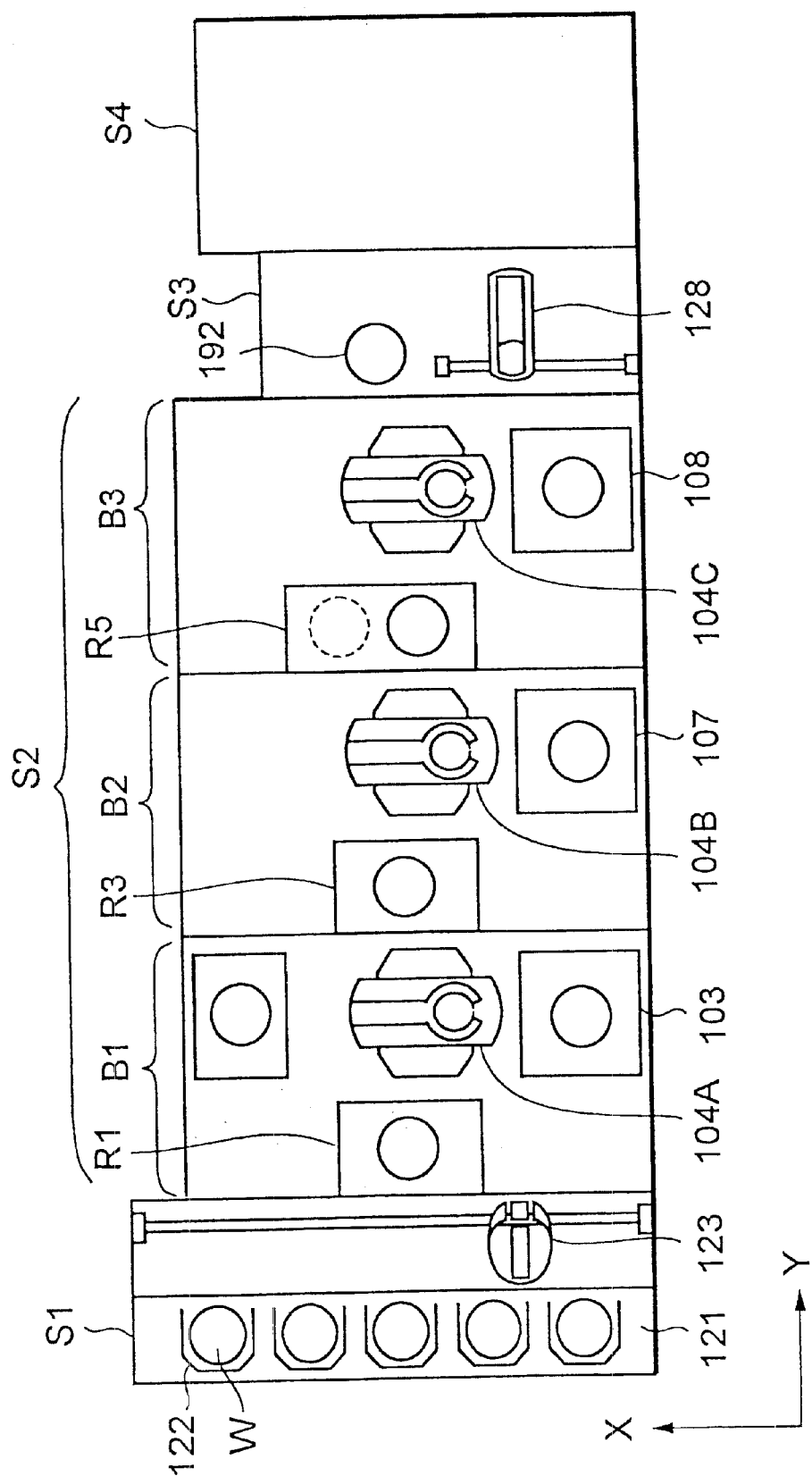
FIG. 27 is a schematic plan view showing a coating and developing apparatus that is another embodiment.

FIG. 27 is a view showing an embodiment of the present invention other than the aforesaid embodiments. In this embodiment, anti-reflection film forming units 103 and coating units 107 are two-tiered respectively as the embodiment shown in FIG. 22, and a chemical unit 105A (105B) is further provided thereunder, and a power system unit 106A (106B) is provided thereunder. Further developing units 108 have the same configuration. The wafer is delivered between a block B3 and an interface station S3 via a delivery stage 192 which is provided in the interface station S3.

Figure 28:
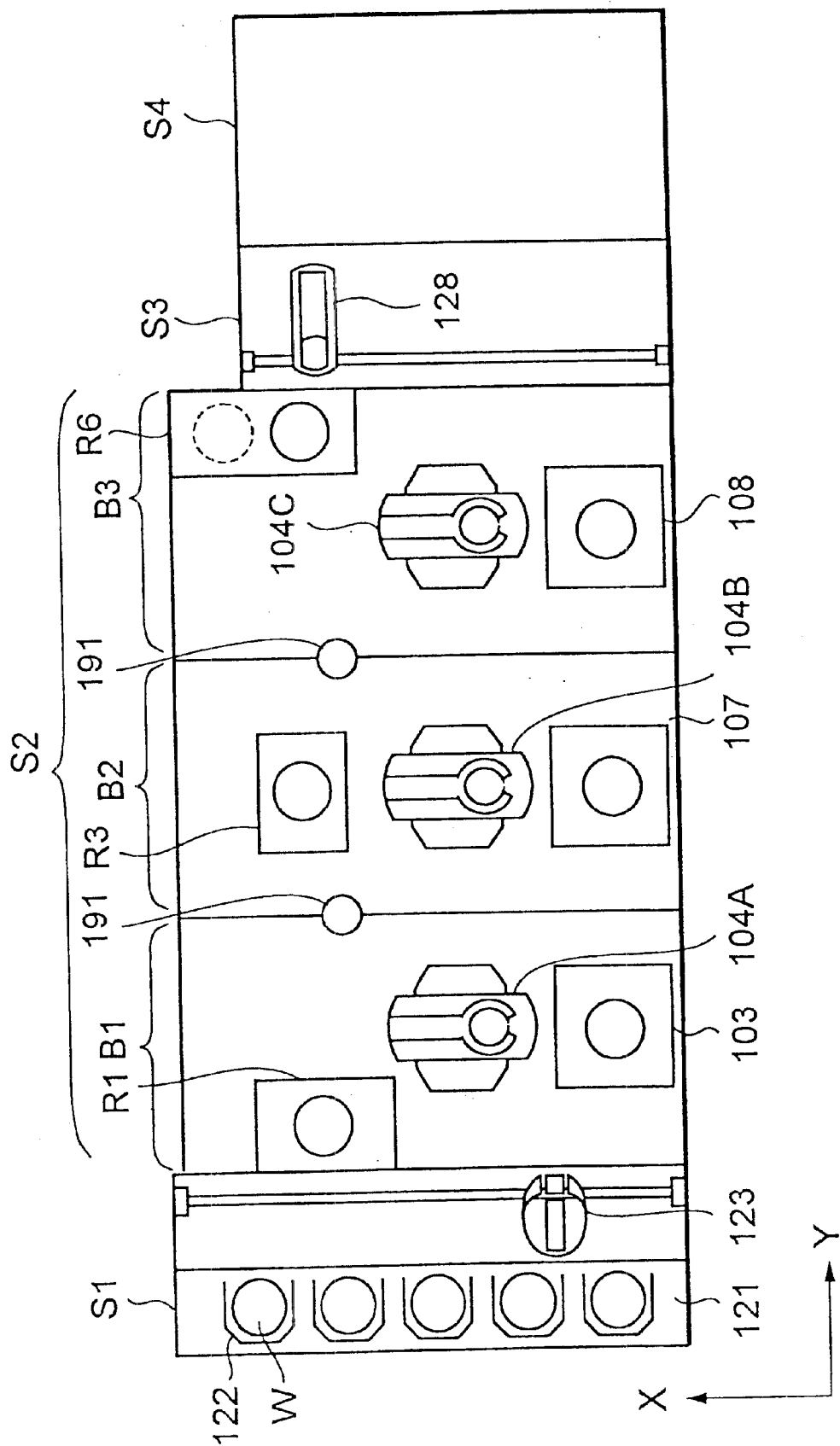
FIG. 28 is a schematic plan view showing a coating and developing apparatus that is still another embodiment.

FIG. 28 shows a modification of the embodiment shown in FIG. 27. In this embodiment, main arms 104A, 104B, and 104C face the anti-reflection film forming unit 103, the coating unit 107, and the developing unit 108 respectively in the X-direction with respect thereto, and the line of shelf units R1, R2, and R6 is arranged on the side opposite to the line of the solution processing units 103, 107, and 108 as viewed from the line of the transfer means 104A, 104B, and 104C. The shelf unit R1 in a block B1 close to a cassette station S1 is disposed diagonally with respect to an X-direction toward the cassette station S1 as viewed from the main arm 104A, and the shelf unit R2 in a block B2 next to the block B1 is disposed in the X-direction as viewed from the main arm 104B. The shelf unit R6 in the block B3 close to the interface station S3 is disposed diagonally with respect to the X-direction toward the interface station S3 as viewed from the main arm 104C. The wafer W is delivered between the main arms 104A and 104B, between the main arms 104B and 104C is conducted via an intermediate stage 191.

The layout as in FIG. 28 can downsize each block B1, B2, B3. In other words, the shelf unit R1 (R6) needs to be provided close to the cassette station S1 (the interface station S4), but the length in a Y-direction can be reduced in the arrangement in which it is disposed diagonally toward left (right) in FIG. 28 more than in the arrangement in which it is disposed just beside the main arm 104A (104C), and the length in the Y-direction can be reduced by disposing the shelf unit R3 at the center in the central block B2. The smaller the depth dimension of the semiconductor manufacturing equipment, the more advantageous in a factory for manufacturing semiconductors, and thus the layout in FIG. 28 is effective.

In the above description, the coating and developing apparatus sometimes does not include the block B1 including the anti-reflection film forming unit. In that case, hydrophobic processing is performed, for example, in the shelf unit R3 (R4) of the block B2 including the coating unit. Further, the present invention is not limited to the coating and developing apparatus but can also be applied to an apparatus for applying a processing solution including a precursor of a silicon oxide onto a substrate by spin coating or the like and thereafter heating and cooling it. The substrate is not limited to the wafer, but a glass substrate for a liquid crystal display is also applicable.

Figure 29:
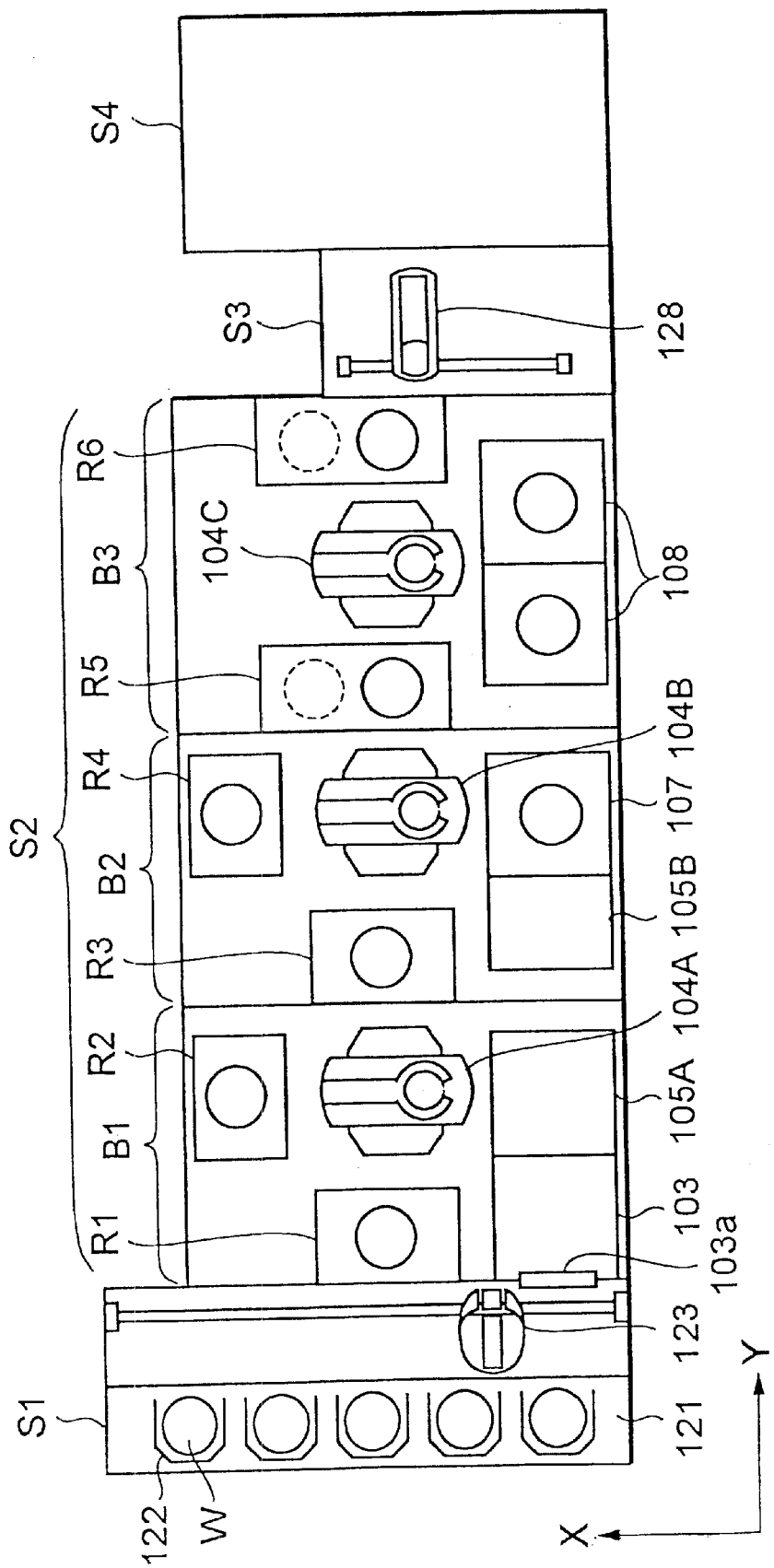
FIG. 29 is a schematic plan view showing a coating and developing apparatus that is yet another embodiment.

Moreover, the apparatus shown in FIG. 17 can be modified to that as shown in FIG. 29. In the apparatus shown in FIG. 29, the positions are changed between the anti-reflection film forming units 103 and the chemical unit 105A. In other words, the anti-reflection film forming units 103 are disposed to adjoin to the cassette station S1. On the anti-reflection film forming unit 103 side adjacent to the cassette station S1, an opening 103a is provided for delivering the wafer W between the delivery arm 123 and the anti-reflection film forming unit 103. The opening 103a may be provided with a shutter. This configuration makes it possible that the wafer W is delivered directly between the cassette station S1 and the anti-reflection film forming unit 103, thereby improving the period of processing time.

Next, further another embodiment will be explained.

Figure 30:
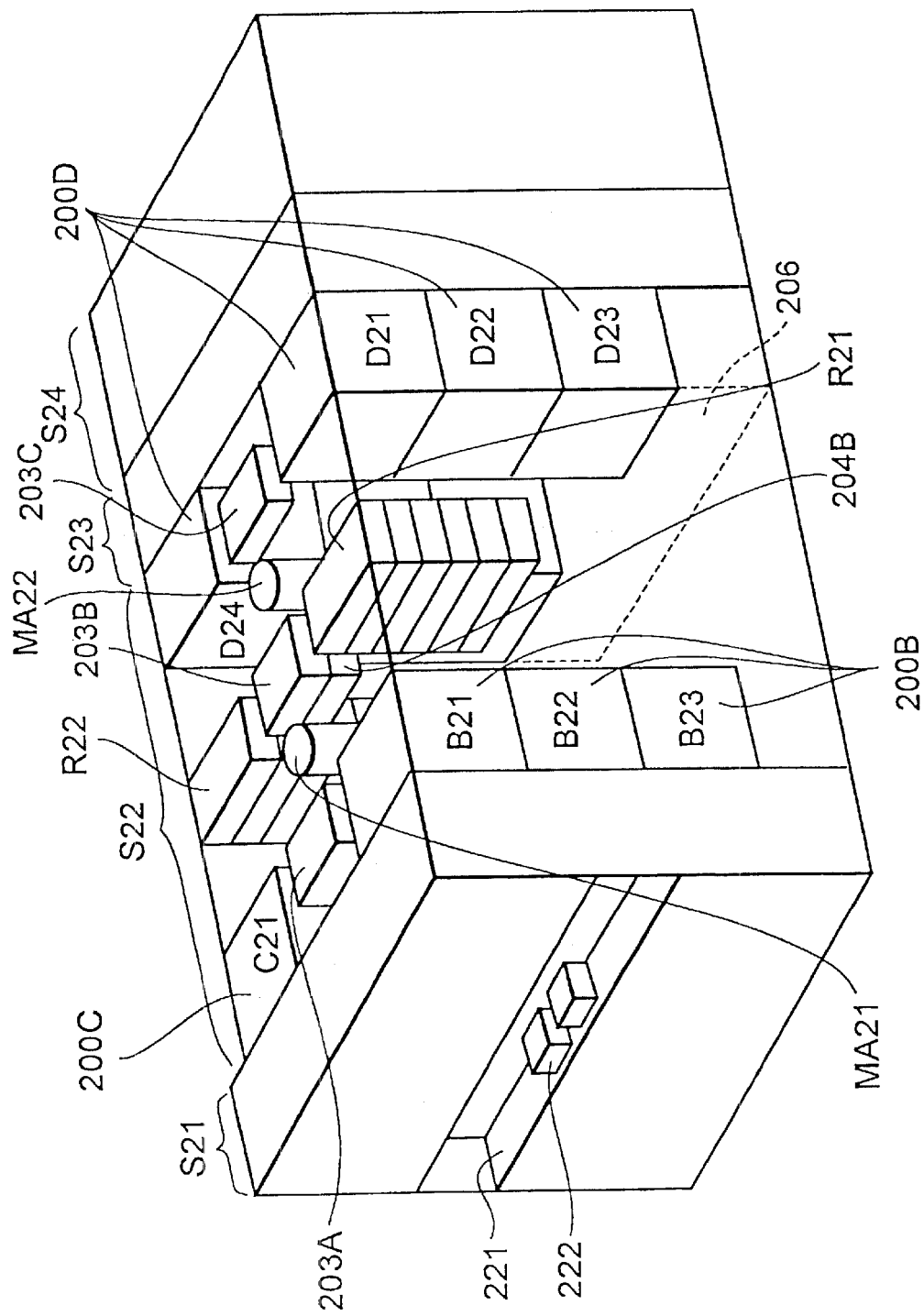
FIG. 30 is an external perspective view showing a coating and developing apparatus according to an embodiment of the present invention.
Figure 31:
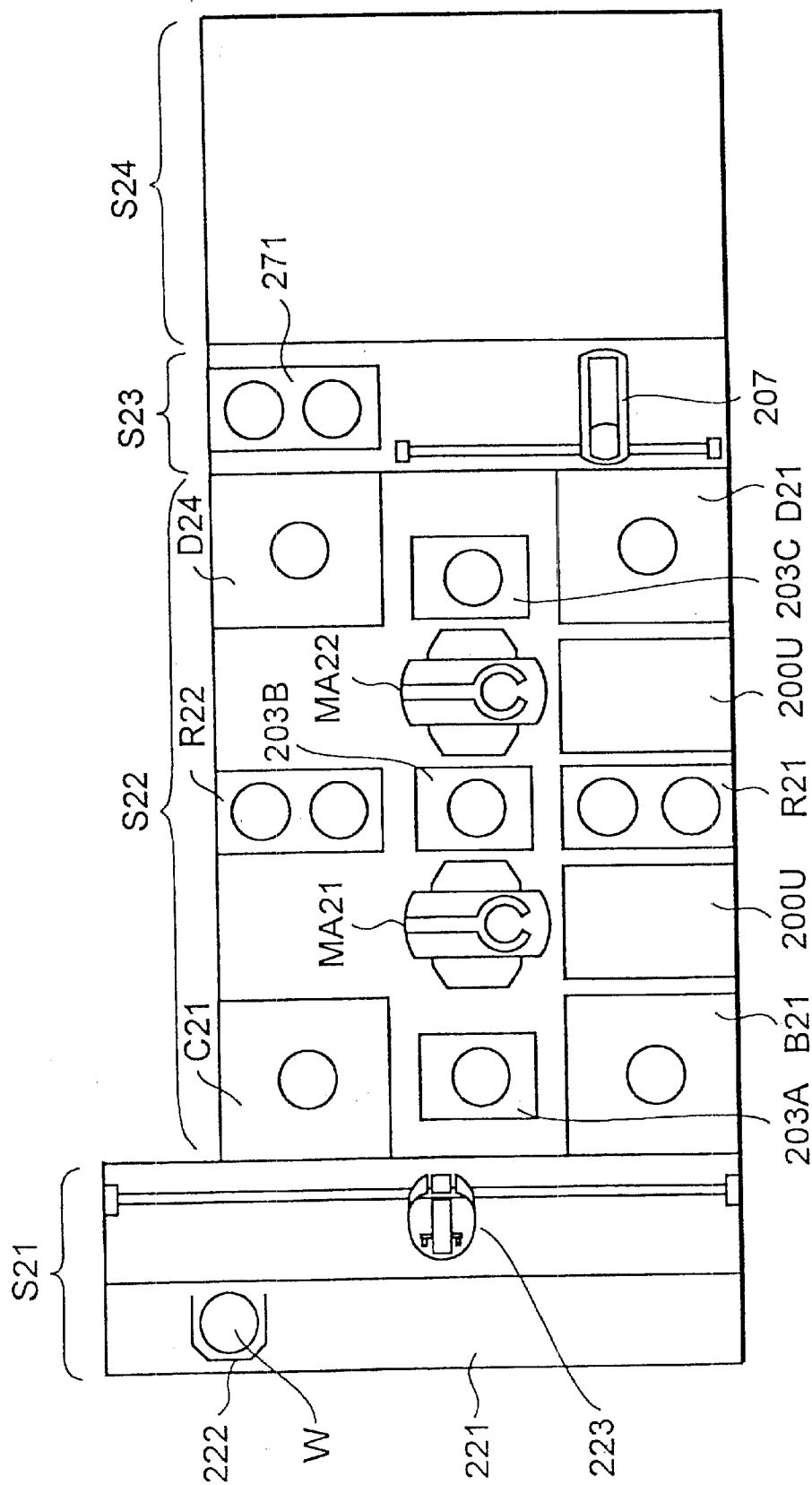
FIG. 31 is a schematic plan view showing the coating and developing apparatus.

FIG. 30 is an external view showing the inside of this embodiment by through-viewing it, and FIG. 31 is a schematic plan view thereof. In the drawings, numeral S21 denotes a cassette station, numeral S22 denotes a processing station for performing resist coating processing and developing processing for the wafer W, numeral S23 denotes an interface station, and numeral S24 denotes an aligner.

The cassette station S21 includes a cassette stage 221 forming a mounting section for mounting, for example, four wafer cassettes (hereinafter, referred to as "cassette") 222 forming substrate cassettes for housing a plurality of substrates, for example, 25 wafers W, and a delivery arm 223 forming delivery means for delivering the wafer W between the cassette 222 on the cassette stage 221 and the processing station S22.

The processing station S22 includes, for example, three anti-reflection film forming units 200B (B21, B22, B23), for example, three coating units 200C (C21, C22, C23), for example, six developing units 200D (D21, D22, D23, D24, D25, D26), a plurality of, for example, two shelf units 200R (R21, R22), a plurality of, for example, three cooling sections 203 (23A, 23B, 23C), a plurality of, for example, two wafer transfer means 200MA (MA21, MA22) as substrate transfer means and a plurality of, for example, two wafer W delivery sections 204 (204A, 204B), in which the wafer W is delivered between the cassette station S21 and the interface station S23, and processing for forming an anti-reflection film on the wafer W, processing for applying a resist onto the wafer W, developing processing for the wafer W, processing for heating the wafer W before and after these kinds of processing and cooling it are performed in the station S22.

Figure 32:
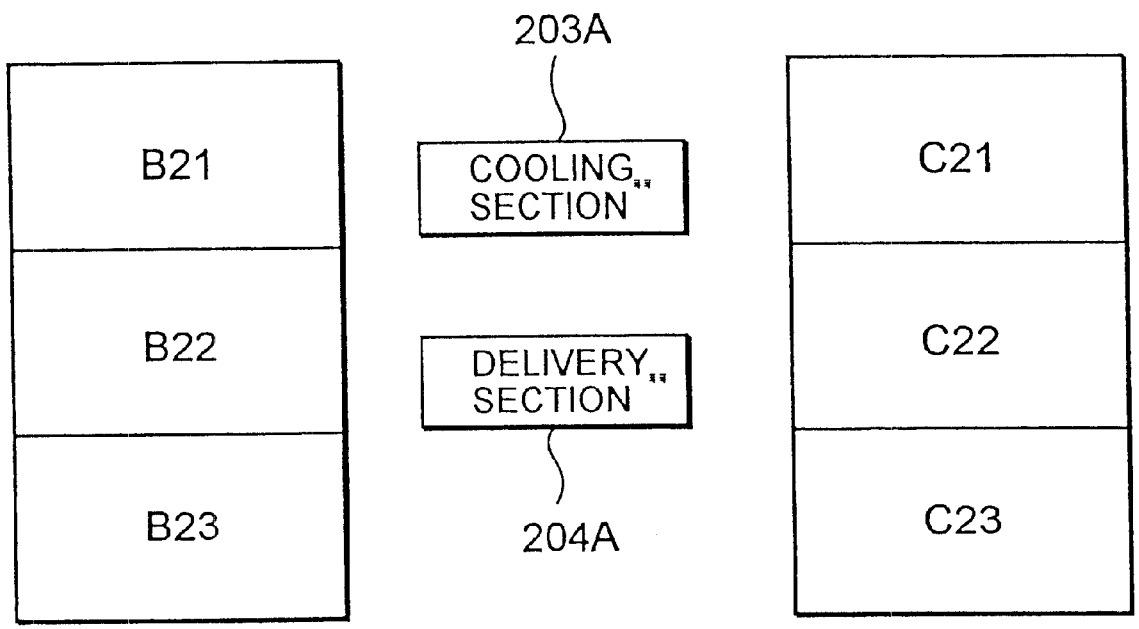
FIG. 32 is a side view showing an example of a first processing section group of the coating and developing apparatus.

Explaining an example of the layout in the station S22, a first processing section group is disposed in an area adjacent to the cassette station S21 in the station S22. The first processing section group includes, for example, three anti-reflection film forming units 200B as first coating processing sections, three coating units 200C, and one cooling section 203A, and one delivery section 204A, in which, for example, the three anti-reflection film forming units 200B are provided in three tiers on the right side as viewed from the cassette station S21 as shown in FIG. 32 (a sectional view of an area adjacent to the cassette station S21 of the processing station S22 as viewed from the aligner S24 side). On the left side thereof, the one cooling section 203A and the one wafer delivery section 204A are provided in two tiers with, for example, the cooling section 203A being at the upper, and further the three coating units 200C are provided in three tiers on the left side thereof.

The delivery arm 223 here includes two arms 223a each for holding the wafer W (see FIG. 5). Each arm 223a is ascendable and descendable, movable in X- and Y-directions, and rotatable around a vertical axis to get accessible, for example, to the cassette 222 on the cassette stage 221, the three anti-reflection film forming units 200B, the cooling section 203A, and the delivery section 204A which are the first processing section group to deliver the wafer W between them, and the layout of the first processing section group is decided.

Figure 33:
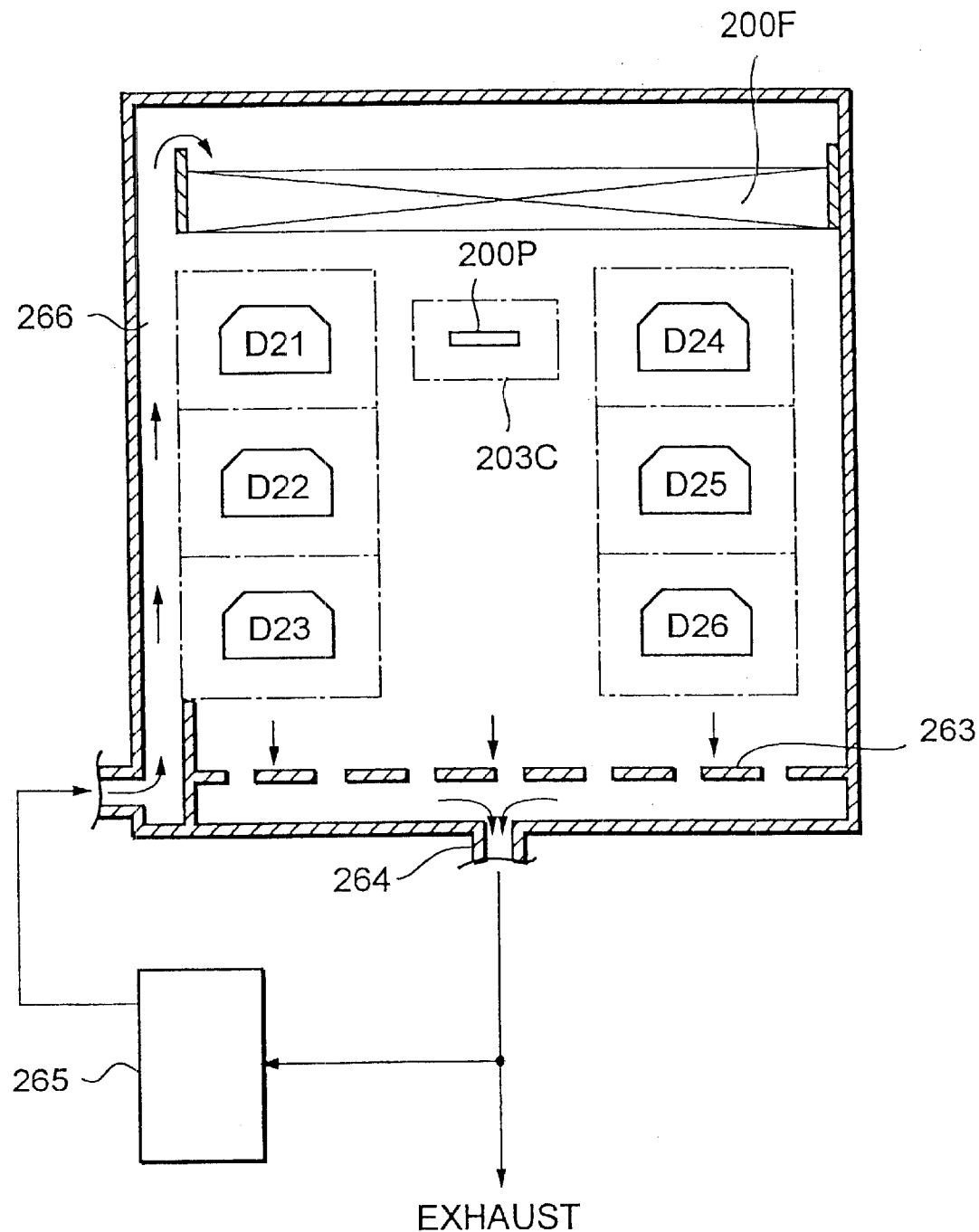
FIG. 33 is a side view showing an example of a second processing section group of the coating and developing apparatus.

A second processing section group is provided facing the first processing section group in an area adjacent to the interface station S23 at the deepest side as viewed from the cassette station S21 as shown in FIG. 33 (a sectional view of an area adjacent to the interface station S23 of the processing station S22 as viewed from the aligner S24). This second processing section group includes six developing units 200D and one cooling section 203C serving as a delivery section for the wafer W which are the second coating processing section, in which the three developing units 200D (D21, D22, D23) are provided in three tiers on the right side as viewed from the cassette station S21 and the cooling section 203C is provided on the left thereof, and the three developing units 200D (D24, D25, D26) are provided in three tiers on the left thereof.

Between the first processing section group and the second processing section group, provided is a third processing section group. The third processing section group includes two shelf units 200R, one cooling section 203B, and one delivery section 204B, in which the shelf unit R21 and the shelf R22 are provided on the back side of the anti-reflection film forming units 200B and the coating units 200C respectively as viewed from the cassette station S21 in this embodiment, and the one cooling section 203B and the one delivery section 204B in two tiers with the cooling section 203B at upper tier are provided between the shelf units R21 and R22.

The aforesaid two wafer transfer means 200MA are configured to be movable in laterally, vertically, and rotatable in the vertical axis as described later, and the layout is made such that the wafer is delivered by any of the wafer transfer means 200MA between the anti-reflection film forming units 200B, the coating units 200C, the developing units 200D, the cooling sections 203, the delivery sections 204, and all the tiers of the shelf units 200R.

For example, the wafer transfer means MA21 is disposed on the back side of the cooling section 203A as viewed from the cassette station S21 so as to get access to the first processing section group and the third processing section group, thereby delivering the wafer W between the anti-reflection film forming units 200B, the coating units 200C, the shelf units 200R, the cooling sections 203A and 203B, and the delivery sections 204A and 204B. Further, for example, the wafer transfer means MA22 is disposed on the back side of the cooling section 203B so as to get access to the second processing section group and the third processing section group, thereby delivering the wafer W between the developing units 200D, the shelf units 200R, the cooling sections 203B and 203C, and the delivery section 204B.

Furthermore, as viewed from the cassette station S21, areas on the right side of the respective wafer transfer means 200MA are allocated as chemical units 200U and areas on the left side thereof are secured as working spaces. The chemical unit 200U here houses a supply system for chemicals to the anti-reflection film forming unit 200B, the coating unit 200C, and the developing unit 200D, in which, for example, a storing tank for a solvent, a resist solution, a developing solution or the like, various kinds of valves such as an open/close valve for the storing tank, a filter, a drive portion for the valve, a drive system for a discharge nozzle, and the like are housed.

Figure 34:
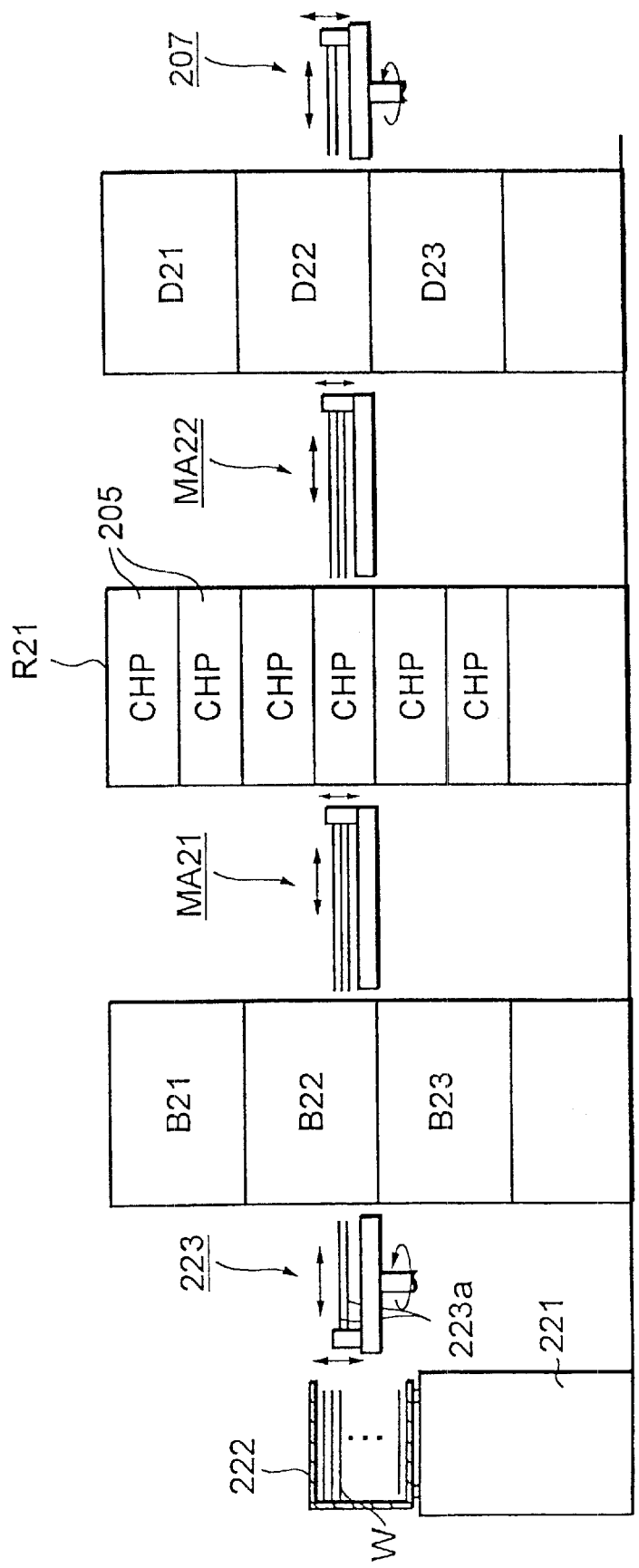
FIG. 34 is a side view showing an example of a shelf unit.
Figure 35A:
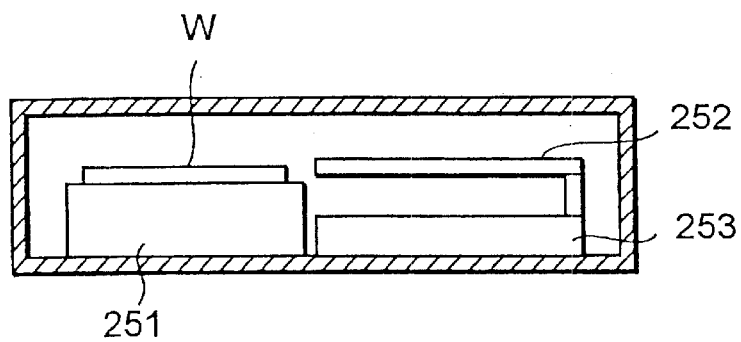
FIGS. 35(a–d) are a sectional view showing a CHP apparatus.
Figure 35B:
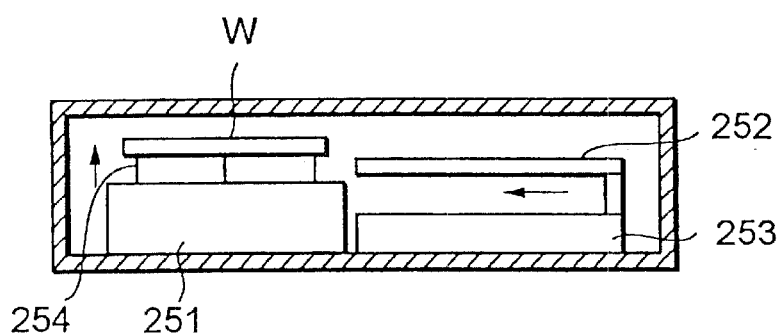
Figure 35C:
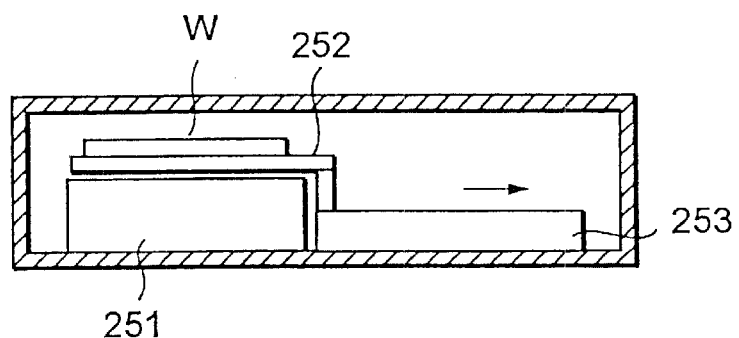
Figure 35D:
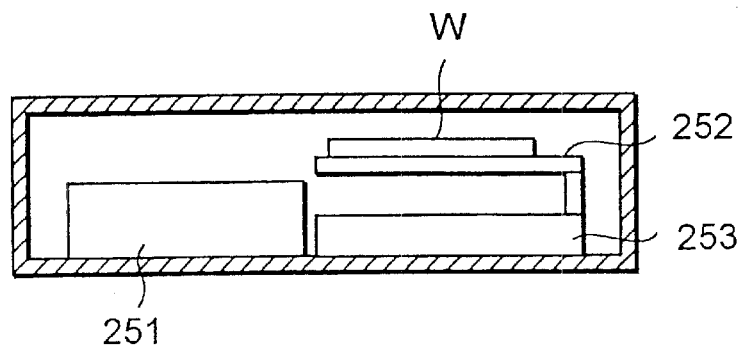
Figure 36:
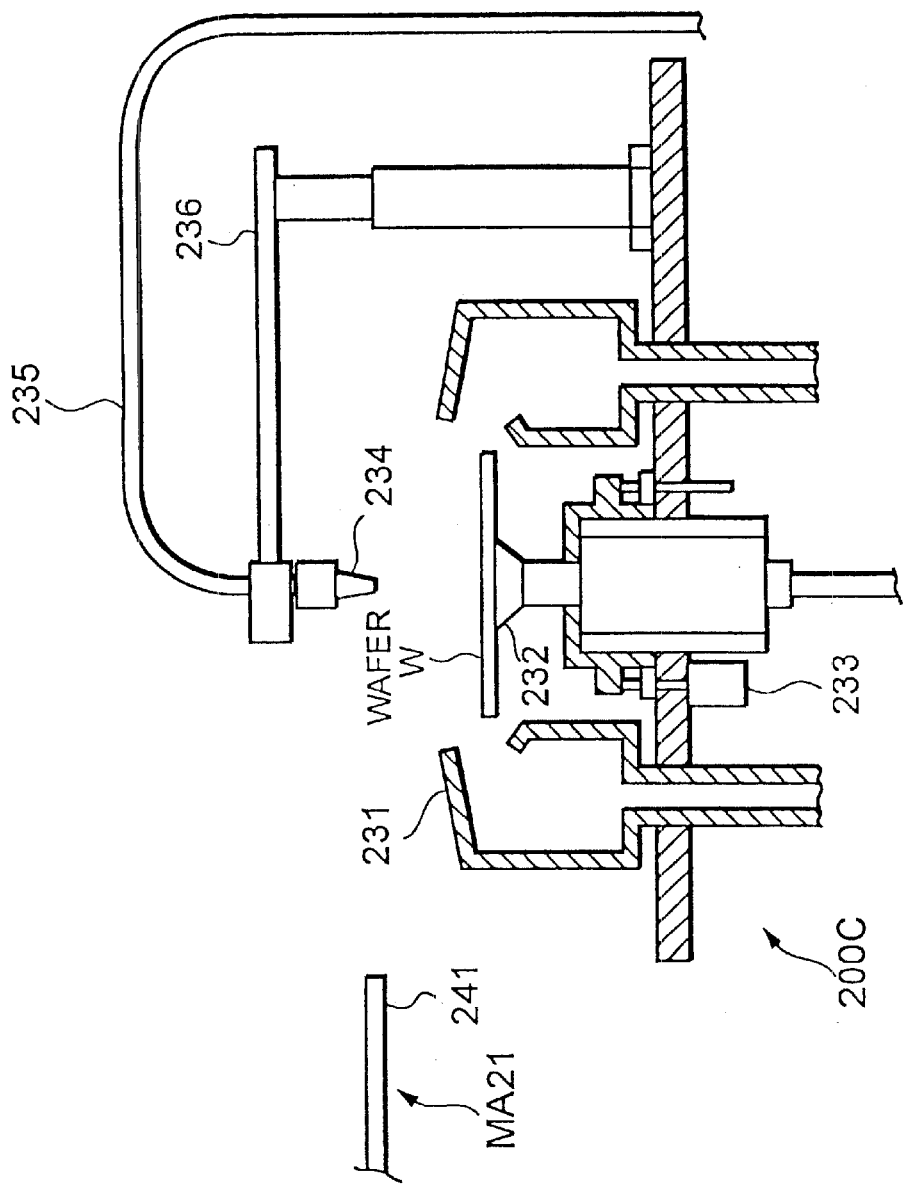
FIG. 36 is a sectional view showing a coating unit.

In the shelf unit 200R (R21, R22), a plurality of, for example, six CHP apparatuses 205 (Chilling Hot Plate Process Station) each for heating the wafer W and thereafter cooling it are vertically arranged as shown in FIG. 34 with the shelf unit R21 as a representative. The CHP apparatus 205 includes, for example, a hot plate 251 forming a heating section for heating the wafer W and a chill plate 252 for cooling the wafer W. First, the wafer W is mounted on the hot plate 251 to be heated to a predetermined temperature (see FIG. 35A) and then lifted up from the hot plate 251 by, for example, protruding pins 254, and the chill plate 252 is moved to a position under the wafer W by transfer means 253 to receive the wafer W (see FIGS. 35B and 35C), and thereafter the chill plate 252 with the wafer W being mounted thereon is moved to a position beside the hot plate 251 to cool the wafer W to a predetermined temperature (see FIG. 35D). In this apparatus, the period of heating time is controlled by the delivery of the wafer W between the hot plate 251 and the chill plate 252, thereby preventing overbake. Explaining the coating unit 200C with FIG. 36 by way of example, numeral 231 denotes a cup and a rotatable spin chuck 232 having a vacuum-suction function is provided in the cup 231. This spin chuck 232 is ascendable and descendable by a raising and lowering mechanism 233, and the wafer is delivered to/from an arm 241 described later of the wafer transfer means 200MA when the spin chuck 232 is positioned above the cup 231.

As for the delivery of the wafer W, the wafer W on the arm 241 is received at a position above the cup 231 by the spin chuck 232 ascending from below relative to the cup 231 and is delivered from the spin chuck 232 side to the arm 241 by the operation reverse thereto. Numeral 234 denotes a discharge nozzle, numeral 235 denotes a processing solution supply pipe, and numeral 236 denotes a support arm for horizontally moving the nozzle. In such a coating unit 200C, a resist solution is dripped onto the surface of wafer W on the spin chuck 232 from the discharge nozzle 234, and the spin chuck 232 is rotated to thereby extend the resist solution on the wafer W.

The anti-reflection film forming unit 200B and the developing unit 200D are nearly the same in structure as the coating unit 200C. The developing unit 200D is configured such that the discharge nozzle 234 includes many supply ports, for example, arranged in the diameter direction of the wafer W. A developing solution as a second processing solution is discharged onto the surface of the wafer W on the spin chuck 232 from the discharge nozzle 234, and the spin chuck 232 is rotated a half turn to perform solution heaping of the developing solution on the wafer W, thereby forming the solution film of the developing solution. In the anti-reflection film forming unit 200B, a chemical as a first processing solution is discharged from the discharge nozzle 234.

The wafer transfer means MA21 and MA22 are configured in the same manner, the same configuration as that shown in FIG. 5.

The wafer delivery section 204 includes a plurality of pins each with a height with which the arm 241 of the wafer transfer means 200MA does not interfere at a position corresponding to nearly the central portion of the wafer W on the top face of the plate, in which the wafer W is mounted on the pins and then the arm 241 is lowered, and subsequently the arm 241 is caused to move back to thereby deliver the wafer W to the delivery section 204.

In the cooling section 203, the wafer W is mounted on the surface of a fine adjustment chill plate P which has been cooled, for example, by a coolant passing therethrough, whereby the wafer W is cooled in a state in which temperature regulation is precisely conducted to a predetermined temperature. In this embodiment, the wafer W which has been heated to a predetermined temperature at the hot plate 251 of the CHP apparatus 205 is cooled to a first temperature by the chill plate 252, and thereafter cooled in the cooling section 203 in a state in which temperature is precisely controlled to be a second temperature lower than the first temperature, that is, temperature regulation is precisely conducted to a predetermined temperature (the second temperature) in two steps.

In this embodiment, an area in which the second processing section group is provided is spatially closed. More specifically, the area is separated from an area in which the wafer transfer means MA22 is provided by a partition wall 206 shown by the broken line in FIG. 30, so that clean air enters the processing section via a filter unit 200F provided at the ceiling portion as shown in FIG. 33. In the partition wall 206, formed are a wafer W delivery port (not shown) for delivering the wafer W between the developing units 200D and cooling section 203C and the wafer transfer means MA22 and a wafer W delivery port (not shown) for delivering the wafer W between the cooling section 203C and the delivery arm 207 of the interface station S23 described later.

The filter unit 200F is provided to cover, for example, the top side of the processing station S22, in which a lower side atmosphere in the station S22 collected via a ventilation plate 263 provided at the lower portion of the processing station S22 is exhausted from an exhaust port to a factory exhaust system, meanwhile part of it is introduced into a filtering apparatus 265, and the air cleaned by the filtering apparatus 265 is sent to a wall duct 266 formed between the processing station S22 and a side wall and blasted as downflows into the processing station S22 via the filter unit 200F provided at the ceiling portion.

The filter unit 200F includes a filter for cleaning air, a chemical filter to which acid components are added to remove alkali components in the air, for example, ammonia components or amine, a suction fan, a heating mechanism, a humidifying mechanism, and the like so as to send air which has been cleaned, from which alkali components have been removed, and which has been adjusted to a predetermined temperature and humidity into the processing space thereunder. For example, in the case where a chemically amplified resist is used as a resist solution, it is necessary to prevent the alkali components from entering the developing processing atmosphere, and therefore the processing section is brought into a closed space and the chemical filter is used to prevent the alkali components from entering from the outside.

The chemically amplified resist forms acid by exposure, and this acid diffuses by heat processing and acts as a catalyst to dissolve a base resin as a main component of a resist material or changes its molecular structure to become soluble to the developing solution. Accordingly, in the case in which this kind of resist is used, a very small quantity of ammonia included in air or an alkali component such as amine produced from a paint of the wall contacts acid on the surface portion of the resist, thereby retarding a catalyzed reaction to deteriorate the pattern form, and therefore the alkali component needs to be removed.

As described above, the wafer W is delivered between the anti-reflection units 200B, the cooling section 203A, and the delivery section 204A by the delivery arm 223 of the cassette station S21 in the processing station S22, the wafer W is delivered between the anti-reflection film forming units 200B, the coating units 200C, the cooling sections 203A and 203B, the delivery sections 204A and 204B, and the shelf units 200R by the wafer transfer means MA21, and the wafer W is delivered between the developing units 200D, the cooling sections 203B and 203C, the delivery section 204B, and the shelf units 200R by the wafer transfer means MA22.

To the processing station S22, the interface station S23 is connected, and the aligner S24 for performing exposure for the wafer W on which a resist film has been formed is connected to the back side of the interface station S23. The interface station S23 includes a CHP apparatus 271 for heating and cooling the wafer W and a delivery arm 207 for delivering the wafer W between the processing station S22 and the aligner S24 and between the processing station S22 and the CHP apparatus 271, in which the delivery arm 207 can get access to the cooling section 203C, the CHP apparatus 271, and the aligner S24.

Next, operations of the above-described embodiment will be explained. First, the cassette 222 housing, for example, 25 wafers is carried into the cassette stage 221 by an automatic transfer robot (or a worker), the wafer W is taken out of the cassette 222 by the delivery arm 223 and delivered to the cooling section 203A of the processing station S22 to be cooled to a predetermined temperature here. Thereafter, the wafer W is transferred to the anti-reflection film forming unit 200B by, for example, the delivery arm 223 and an anti-reflection film is formed here. Since the delivery arm 223 includes two arms 223a, after one arm 223a receives a wafer W after the cooling from the cooling section 203A, the other arm 223a can deliver its holding wafer W to the cooling section 203A. The reason of formation of the anti-reflection film is to prevent reflection which occurs under the resist during exposure in the case of the chemically amplified resist.

Subsequently, the wafer W in the anti-reflection film forming unit 200B is transferred through the following route, for example, from the delivery arm 223, the delivery section 204A, the wafer transfer means MA21, the CHP apparatus 205 of the shelf unit 200R, the wafer transfer means MA21, the cooling section 203, the wafer transfer means MA21, to the coating unit 200C. The wafer W is thus heated to a predetermined temperature by the hot plate 251 in the CHP apparatus 205, and thereafter cooled to a predetermined temperature in two steps by the chill plate 252 of the CHP apparatus 205 and the cooling section 203 to thereby be temperature regulated and then coated with a resist.

Next, the wafer W in the coating unit 200C is transferred through the route from the wafer means MA21, the CHP apparatus 205 of the shelf unit 200R, the wafer transfer means MA22, to the cooling section 203C, thereby heated to a predetermined temperature by passing from the CHP apparatus 205 through the cooling section 203C and then cooled to a predetermined temperature in two steps to thereby be temperature regulated. The wafer W in the cooling section 203C is transferred through the route from the delivery arm 207 of the interface station S23 to the aligner S24 and subjected to exposure.

The wafer W after the exposure is transferred through the reverse route, the route from the aligner S24, the delivery arm 207, the CHP apparatus 271, the delivery arm 207, the cooling section 203C, the wafer transfer means MA22, to the developing unit 200D. The wafer W is thus heated to a predetermined temperature by passing from the CHP apparatus 271 through the cooling section 203C and then cooled to a predetermined temperature in two steps to thereby be temperature regulated, and subsequently the wafer W is subjected to developing processing in the developing unit 200D.

Thereafter, the wafer W is transferred through the route from the wafer transfer means MA22, the CHP apparatus 205 of the shelf unit 200R, the wafer transfer means MA21, the delivery section 204A, to the delivery arm 223, and the wafer which has been once heated to a predetermined temperature and then cooled to a predetermined temperature is returned to the original cassette 222 via the delivery section 204A.

In the processing station S22 here, it is suitable that the wafers W are sent to the cooling section 203A one by one, and subsequently transferred through the route from an occupied anti-reflection film forming unit 200B, an occupied CHP apparatus 205 of the shelf unit R21, an occupied cooling section 203, an occupied coating unit 200C, an occupied CHP apparatus 205 of the shelf unit 200R, the cooling section 203C, to the interface station S22, and the wafer W after the exposure is transferred through the route from the CHP apparatus 271 of the interface station S22, the delivery arm 207, the cooling section 203C, an occupied developing unit 200D, an occupied CHP apparatus 205 of the shelf unit 200R, to the delivery section 204A.

At this time, the wafer W may be transferred between the cooling section 203A and the anti-reflection film forming unit 200B by the delivery arm 223 or by the wafer transfer means MA21. During the transfer of the wafer W, in the case in which the wafer W is delivered between the wafer transfer means 200 MA, the wafer W is delivered via the delivery section 204B.

Further, the delivery arm 223 is configured to be accessible to the coating unit 200C so that the wafer W is delivered by the delivery arm 223 between the cooling section 203A and the coating unit 200C in the above-described embodiment.

Since the wafer W is transferred between the anti-reflection film forming unit 200B of the processing station S22, the cooling section 203, and the delivery section 204A by the delivery arm 223 of the cassette station S21 in the above embodiment, the load on the wafer transfer means 200MA is reduced as compared with the conventional case in which all the transfer of the wafer W in the processing station S22 is conducted by the wafer transfer means 200MA. Consequently, the number of units to which the wafer transfer means 200MA gets access can be increased, resulting in improved throughput.

In other words, the above-described embodiment has a layout such that the first processing section group including the anti-reflection film forming units 200B, the coating units 200C, the cooling section 203A, and the delivery section 204A is disposed in the area adjacent to the cassette station S21 in the processing station S22 in parallel to the arrangement direction of the cassettes 222 of the cassette station S22, the second processing section group including the developing units 200D and the cooling section 203C is disposed in the area adjacent to the interface station S23 to face the first processing section group, the third processing section group including the shelf units 200R, the cooling section 203B, and the delivery section 204B is disposed between the first and second processing section groups, and further the wafer transfer means MA21 and the wafer transfer means MA 22 are arranged between the first and second processing section groups and between the second and third processing section groups respectively.

Accordingly, any of the delivery arm 223 and the wafer transfer means MA21 can deliver the wafer W to/from the first processing section group, and any of the wafer transfer means MA21 and MA22 can deliver the wafer W to/from the third processing section group. Since two transfer means can get access to many units as described above, the number of units to which the transfer means can get access can be increased without making waiting time of the wafer W, thereby improving throughput.

The above-described embodiment has a layout such that the units for performing so-called coating processing such as the anti-reflection film forming units 200B, the coating units 200C, the developing units 200D, and the like are formed into the first processing section group and the second processing section group, the CHP apparatuses 205 each including the hot plate 251 as a heat source are formed into the third processing section group, and the first processing group, the second processing group, the third processing section group are arranged in this order from the cassette station S21 side, and the wafer transfer means 200MA and the chemical units 200U are arranged between the first processing section group and the third processing section group and between the third processing section group and the second processing section group respectively, so that the units for performing coating processing are separated from the heat source. Therefore, the wafer W which has been precisely temperature regulated in two steps by passing through the route from the CHP apparatus 205 to the cooling section 203 is not susceptible to heat influence, and thus coating processing can be performed in each unit with keeping high temperature precision, thereby suppressing occurrence of processing ununiformity caused by temperature change, resulting in uniform processing.

Furthermore, working spaces can be secured between the first processing section group and the third processing section group and between the third processing section group and the second processing section group, on the left side of each wafer transfer means 200MA as viewed from the cassette station S21 as describe above in this embodiment, so that a worker can enter the spaces to do work such as maintenance for the shelf units 200R and a check of operations of the wafer transfer means 200MA, facilitating these works.

Figure 37:
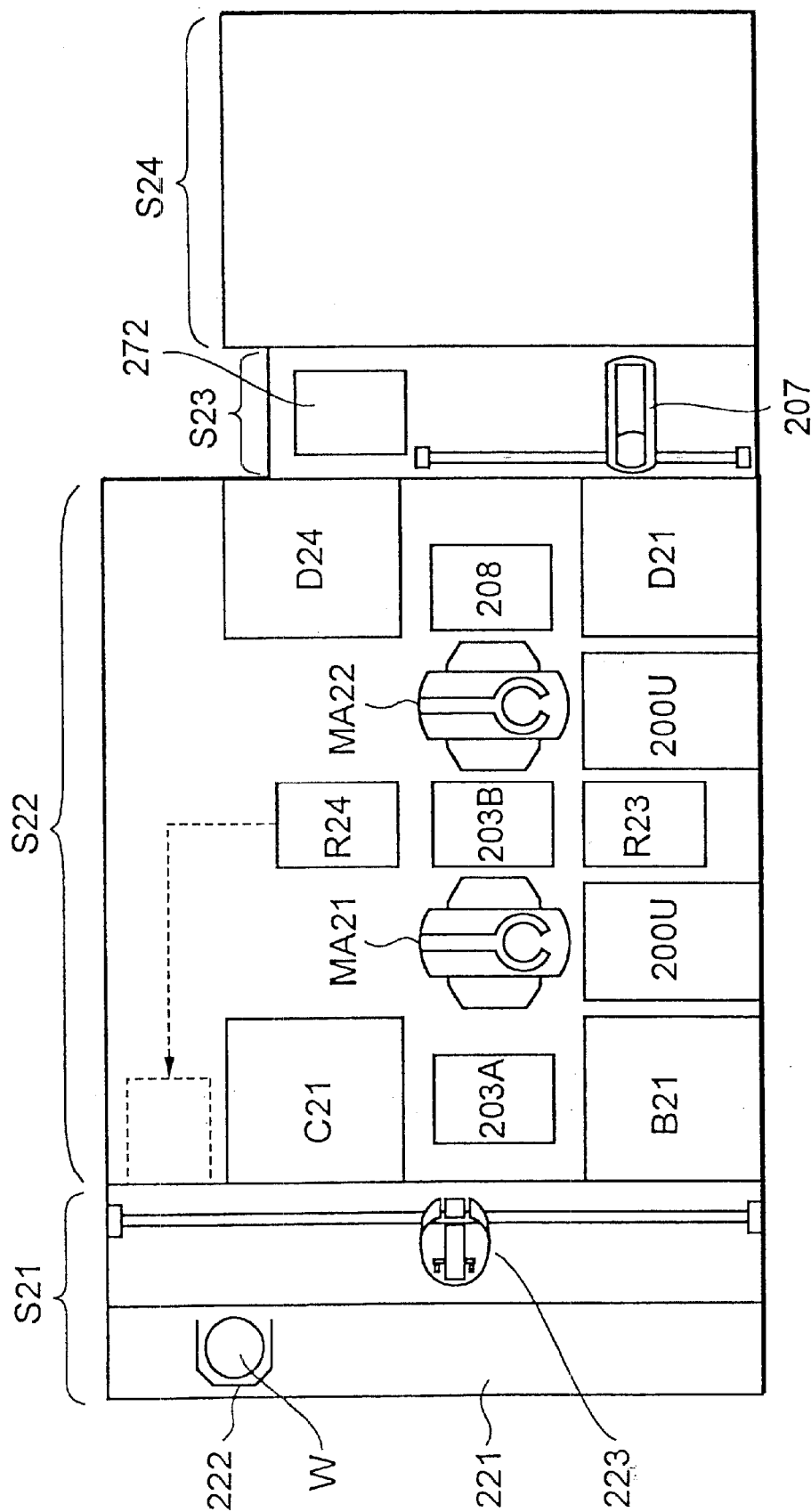
FIG. 37 is a schematic plan view showing another example of a coating and developing apparatus.

Next, another embodiment of the present invention will be explained with reference to FIG. 37. In FIG. 37, parts having the same numerals as those of the coating and developing apparatus shown in FIG. 31 show the same components. In this embodiment, a plurality of heating sections and cooling sections are vertically arranged in two shelf units R23 and R24 in place of the CHP apparatuses, and a third processing section group is made up with the shelf units R23 and R24, a cooling section 203B, and a delivery section 204B (not shown). Further, a second processing section group includes a developing unit 200D and a plurality of cooling sections 208, and the cooling section 208 is configured to be vertically arranged in the same manner as the aforesaid cooling section 203. Furthermore, in an interface station S23, a plurality of heating sections 272 are multi-tiered in place of the CHP apparatuses 271.

As for layout of a processing station S22, a first processing section group including anti-reflection film forming units 200B, coating units 200C, a cooling section 203A, a delivery section 204A is disposed adjacent to a cassette station S21 in parallel to the arrangement direction of cassettes 222 of the cassette station S21, the second processing section group is disposed in an area adjacent to the interface station S23 to face the first processing section group, a third processing section group is disposed between the first and second processing section groups to face them, and further wafer transfer means MA21 and MA22 are arranged between the first and second processing section groups and between the second and third processing section groups respectively as in the above-described embodiments.

As for the layout of the third processing section group, the cooling section 203B and the delivery section 204B are vertically provided with the cooling section 203B being at the upper at the back side of the wafer transfer means MA21 as viewed from the cassette station S21, and the shelf unit R23 and the shelf unit R24 are disposed on the right side and the left side thereof respectively.

In the heating sections of the shelf units R23 and R24 and the heating section 272 of the interface station S23, the wafer W is heated to a predetermined temperature by being mounted on the surface of a hot plate which is heated by, for example, a heater. The cooling sections of the shelf units R23 and R24, in each of which the wafer W is cooled to a predetermined temperature by being mounted on the surface of a rough adjustment chill plate which is cooled by a coolant passing therethrough, are cooling sections for rough adjustment for roughly removing heat of the wafer W, in comparison with the aforesaid cooling sections as fine adjustment cooling sections.

Moreover, in this embodiment, the shelf unit R24 is movable from a position adjacent to the cooling section 203B to a position on the cassette station S21 side adjacent to the coating units 200C within the stroke of the delivery arm 223 of the cassette station S21 along a not shown transfer rail as shown by the broken line in FIG. 37, so that the shelf unit R24 itself can transfer the wafer W in the shelf unit R24 to a desired position in the cassette station S21. At this time the delivery arm 223 of the cassette station S21 is configured to deliver the wafer W to/from the shelf unit R24, so that the delivery arm 223 can receive the wafer W transferred by the shelf unit R24 directly from the shelf unit R24. Other configuration is the same as that in the embodiment shown in FIG. 31.

Briefly explaining the flow of the wafer W in such a processing station S22, the wafer W is transferred through the route from the delivery arm 223, the cooling section 203A, the delivery arm 223, the anti-reflection film forming unit 200B, the wafer transfer means MA21, the heating section of the shelf unit R23 (R24), the cooling section, the wafer transfer means MA21, the cooling section 203, the wafer transfer means MA21, the coating unit 200C, the wafer transfer means MA21, the heating section of the shelf unit R23 (R24), the cooling section, the wafer transfer means MA22, the cooling section 203, the delivery arm 207 of the interface station S23, the aligner S24, the delivery arm 207, the heating section 272, the delivery arm 207, the cooling section 208, the wafer transfer means MA22, the developing unit 200D, the wafer transfer means MA22, the heating section of the shelf unit R24, the cooling section, the shelf unit R24 moving toward the cassette station S21 side, to the delivery arm 223.

As described above, the shelf unit R24 is configured to be movable so that after the exposed wafer W is subjected to heating and cooling in the shelf unit R24, the wafer W is delivered to the delivery arm 223 not by the wafer transfer means MA21 but the shelf unit R24 itself in this embodiment, thereby reducing the load on the wafer transfer means MA21, resulting in improved throughput.

In the above description, the numbers of the anti-reflection film forming units 200B, the coating units 200C, the developing units 200D, the cooling units 203, the CHP apparatuses of the shelf units 200R, the heating sections, and the cooling sections are not limited to the above-described embodiments but properly selected in the present invention, and in accordance with that, the numbers of tiers of the above-described units are properly selected. The arrangement of the anti-reflection film forming units 200B, the coating units 200C, and the cooling section 203A forming the first processing section group is not limited to the aforesaid examples, but the anti-reflection film forming units 200B and the coating units 200C may be multi-tiered, or the anti-reflection film forming units 200B and the coating units 200C, and the cooling section 203A may be multi-tiered.

This invention employs a method that after the heating, the wafer W is cooled in two steps during coating processing and developing processing of the resist, but the wafer W may be cooled in one step without using the fine adjustment cooling sections 203 and 208. The configuration in the above-described example, in which the cooling section 203A as a first processing section group is disposed in the area adjacent to the cassette station S21 so that the wafer W is delivered by the delivery arm 223, is desirable for the case of forming an anti-reflection film. That is because, when an anti-reflection film is formed, it is necessary to cool the wafer W to adjust it to a predetermined temperature prior to the formation, and thus if there is no cooling section 203A at the already described position, the wafer W needs to be once delivered to one of the first processing section group such as the delivery section 204A, the anti-reflection film forming unit 200B, or the like by the delivery arm 223 and then transferred to the CHP apparatus of the shelf unit 200R or the cooling section to be cooled, bringing about waste in transfer.

Moreover, the present invention may applied to the case in which hydrophobic processing is performed in place of the formation of the anti-reflection film, and in this case, for example, a hydrophobic section is provided in place of the anti-reflection film forming unit 200B, and hydrophobic processing is performed in the hydrophobic section and thereafter applying of the resist is performed in the coating unit 200C. Furthermore, in the present invention, the substrate is not limited to a wafer, but a glass substrate for a liquid crystal display maybe applicable.

The disclosure of Japanese Patent Application No.11- filed Month Day, 1999 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

The disclosure of Japanese Patent Application No.11- 298503, filed Oct. 20, 1999, No.11-296395, filed Oct. 19, 1999, and No.11-285325, filed Oct. 6, 1999 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing apparatus, comprising:
   a first processing unit group in which first processing units each for supplying a predetermined solution onto a substrate to thereby perform solution processing are multi-tiered;
   a second processing unit group in which second processing units each made by allowing a heating section for performing heat processing for the substrate and a cooling section for performing cooling processing for the substrate to adjoin to each other into one body are multi-tiered; and
   a transfer device for transferring the substrate between said first processing unit and said second processing unit,
   wherein said first processing unit group and said second processing unit group are arranged to adjoin to each other while said cooling section in said each second processing unit is positioned on said first processing unit group side.

2. The apparatus as set forth in claim 1,
   wherein a clean air supply section for supplying clean air to said first processing unit group is provided, the clean air supply section exhausting gas from the bottom of said first processing unit group, circulating the exhausted gas, and blasting temperature regulated gas from the top of said first processing unit group, and further a passage for circulating the gas exhausted from the bottom of said first processing unit group to the top thereof is provided to divide an area in which said first processing unit group is disposed from an area in which said second processing unit group is disposed.

3. The apparatus as set forth in claim 1, further comprising:
   a heat insulation wall provided to divide an area in which said first processing unit group is disposed from an area in which said second processing unit group is disposed.

4. A substrate processing apparatus, comprising:
   a first processing unit group in which first processing units each for supplying a predetermined solution onto a substrate to thereby perform solution processing are multi-tiered;
   a processing solution supply section, disposed adjacent to said first processing unit group, for supplying the predetermined solution to said each first processing unit;
   a second processing unit group in which second processing units each made by allowing a heating section for performing heat processing for the substrate and a cooling section for performing cooling processing for the substrate to adjoin to each other into one body are multi-tiered; and
   a transfer device for transferring the substrate between said first processing unit and said second processing unit,
   wherein said processing solution supply section and said second processing unit group are arranged adjacent to each other while said cooling section out of said heating section and said cooling section in said each second unit is positioned on said processing solution supply section side.

5. The apparatus as set forth in claim 4,
   wherein a clean air supply section for supplying clean air to said first processing unit group is provided, the clean air supply section exhausting gas from the bottom of said first processing unit group, circulating the exhausted gas, and blasting temperature regulated gas from the top of said first processing unit group, and further a passage for circulating the gas exhausted from the bottom of said first processing unit group to the top thereof is provided to divide an area in which said processing solution supply section is disposed from an area in which said second processing unit group is disposed.

6. The apparatus as set forth in claim 4, further comprising:
   a heat insulation wall provided to divide an area in which said processing solution supply section is disposed from an area in which said second processing unit group is disposed.

7. A substrate processing apparatus, comprising:
   a first processing unit group in which first processing units each for supplying a predetermined solution onto a substrate to thereby perform solution processing are multi-tiered;

a second processing unit group in which second processing units each made by allowing a heating section for performing heat processing for the substrate and a cooling section for performing cooling processing for the substrate to adjoin to each other into one body are multi-tiered; and an aligner unit for performing exposure processing for the substrate to which the solution processing has been performed, wherein the substrate is caused to wait in said cooling section of said second processing unit before the substrate is carried into said aligner unit.

8. A substrate processing apparatus, comprising:

a cassette station including a mounting section for mounting a substrate cassette housing a substrate, and delivery means for delivering the substrate to/from the substrate cassette mounted on the mounting section; and a processing station connected to said cassette station for processing the substrate transferred by said delivery means, said processing station including solution processing units, stacked in a plurality of tiers, each for performing processing by a processing solution for the substrate, transfer means for carrying the substrate into/out of these solution processing units, and a container housing section, in which containers each for storing the processing solution are housed, provided adjacent to the solution processing units or below the lowermost solution processing unit.

9. The apparatus as set forth in claim 8, wherein said container housing section houses a processing solution supply control device provided on a pipe for supplying the processing solution from the container to said solution processing unit.

10. The apparatus as set forth in claim 8, wherein a plurality of said multi-tiered solution processing units are arranged in a line in a lateral direction, and said container housing section is provided next to or below said solution processing units for every said multi-tiered solution processing units.

11. The apparatus as set forth in claim 8, further comprising:

a power device provided below the lowermost tier of said multi-tiered solution processing units and used for said each solution processing unit.

12. The apparatus as set forth in claim 8, wherein said processing station includes a shelf unit in which units for performing heating processing and/or cooling processing are multi-tiered to perform pre-processing and/or post-processing for the processing in said solution processing units.

13. The apparatus as set forth in claim 12, wherein said container housing section is provided next to said solution processing units, and wherein a fine adjustment cooling section for precisely cooling the substrate to a predetermined temperature after the substrate is cooled in said shelf unit is divided from a transfer area of said transfer means and disposed above or below said container housing section in an environment in which an atmospheric gas used in said solution processing unit flows.

14. The apparatus as set forth in claim 12, wherein a plurality of said substrate cassettes are arranged in an X-direction, wherein said processing station is configured such that blocks each including said transfer means, said multi-tiered solution processing units, and said shelf unit are connected in a Y-direction, wherein on the whole, a plurality of said multi-tiered solution processing units are arranged in a line in the Y-direction, a plurality of said shelf units are lined in the Y-direction, and said transfer means are disposed between the line of said shelf units and the line of said solution processing units, wherein in a block close to said cassette station, at least one tier in said shelf unit is configured as a delivery section for delivering the substrate between said delivery means and said transfer means, and said shelf unit is disposed diagonally with respect to the X-direction toward said cassette station as viewed from said transfer means, and wherein in a block connected to the block close to said cassette station, said shelf unit is disposed in the X-direction as viewed from said transfer means.

15. A substrate processing apparatus, comprising:

a cassette station including a mounting section for mounting a substrate cassette housing a substrate, and delivery means for delivering the substrate to/from the substrate cassette mounted on the mounting section; and a processing station connected to said cassette station for processing the substrate transferred by said delivery means, said processing station including:

a coating processing section for applying a processing solution to the substrate; and transfer means for delivering the substrate to/from the coating processing section, wherein said delivery means of said cassette station delivers the substrate to/from the coating processing section of said processing station.

16. The apparatus as set forth in claim 15, wherein said processing station includes a cooling section for cooling the substrate, and said delivery means of said cassette station delivers the substrate to/from the cooling section of said processing station.

17. A substrate processing apparatus, comprising:

a cassette station including a mounting section for mounting a substrate cassette housing a substrate, and delivery means for delivering the substrate to/from the substrate cassette mounted on the mounting section; and a processing station connected to said cassette station for processing the substrate transferred by said delivery means, said processing station including:

a first coating processing section, provided on said cassette station side, for applying a first processing solution to the substrate;

a second coating processing section, provided on the opposite side to said cassette station, for applying a second processing solution to the substrate;

a heating section, provided between the first and second coating sections, for heating the substrate;

first substrate transfer means, provided between the first coating processing section and the heating section, for transferring the substrate thereto; and second substrate transfer means, provided between the second coating processing section and the heating section, for transferring the substrate thereto.

18. The apparatus as set forth in claim 17,
wherein said delivery means of said cassette station delivers the substrate to/from said first coating processing section of said processing station.

19. The apparatus as set forth in claim 17, further comprising:
an interface station, connected to the opposite side of said processing station to said cassette station, for delivering the substrate between said processing station and an aligner provided on the opposite side of said processing station to said cassette station,
wherein said first coating processing section includes a processing section for forming an anti-reflection film for the substrate, and said second coating processing section includes a processing section for performing developing processing for the substrate which has been exposed in said aligner.

* * * * *